United States Patent
Ebisui et al.

(10) Patent No.: US 10,394,339 B2
(45) Date of Patent: Aug. 27, 2019

(54) SENSOR, INPUT DEVICE, KEYBOARD, AND ELECTRONIC DEVICE

(71) Applicant: SONY CORPORATION, Tokyo (JP)

(72) Inventors: Akira Ebisui, Kanagawa (JP); Hiroto Kawaguchi, Kanagawa (JP); Tomoko Katsuhara, Kanagawa (JP); Hiroshi Mizuno, Kanagawa (JP); Taizo Nishimura, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 36 days.

(21) Appl. No.: 15/545,310

(22) PCT Filed: Dec. 21, 2015

(86) PCT No.: PCT/JP2015/006362
§ 371 (c)(1),
(2) Date: Jul. 20, 2017

(87) PCT Pub. No.: WO2016/129024
PCT Pub. Date: Aug. 18, 2016

(65) Prior Publication Data
US 2018/0004306 A1 Jan. 4, 2018

(30) Foreign Application Priority Data

Feb. 9, 2015 (JP) ................. 2015-023709

(51) Int. Cl.
*G06F 3/041* (2006.01)
*G06F 3/02* (2006.01)
(Continued)

(52) U.S. Cl.
CPC ............ *G06F 3/0202* (2013.01); *G06F 3/044* (2013.01); *G06F 3/0414* (2013.01);
(Continued)

(58) Field of Classification Search
CPC ........ G06F 3/044; G06F 3/016; G06F 3/0416; H03K 2217/9651; H01H 13/702
(Continued)

(56) References Cited

U.S. PATENT DOCUMENTS

2009/0309616 A1* 12/2009 Klinghult ................ G06F 3/044
324/686
2010/0302201 A1* 12/2010 Ritter ...................... G06F 3/044
345/174
(Continued)

FOREIGN PATENT DOCUMENTS

JP 2015-8012 A 1/2015
WO 2013/132736 A1 9/2013

OTHER PUBLICATIONS

International Search Report and Written Opinion of PCT Application No. PCT/JP2015/006362, dated Mar. 22, 2016, 02 pages of English Translation and 05 pages of ISRWO.

*Primary Examiner* — Roy P Rabindranath
(74) *Attorney, Agent, or Firm* — Chip Law Group

(57) ABSTRACT

A sensor is provided with a conductor layer, a sensor layer including a plurality of sensor units, and a separating layer which separates the conductor layer from the sensor layer, the sensor unit is formed of alternately arranged first and second electrode elements, and sensitivity on an outer periphery of the sensor unit is higher than the sensitivity in a central portion of the sensor unit.

19 Claims, 36 Drawing Sheets

(51) Int. Cl.
*G06F 3/044* (2006.01)
*H01H 13/702* (2006.01)
*H03K 17/975* (2006.01)
*H03K 17/96* (2006.01)

(52) U.S. Cl.
CPC ....... *H01H 13/702* (2013.01); *H03K 17/9618* (2013.01); *H03K 17/975* (2013.01); *H03K 2217/9651* (2013.01); *H03K 2217/960775* (2013.01)

(58) Field of Classification Search
USPC .................................. 345/173–178
See application file for complete search history.

(56) References Cited

U.S. PATENT DOCUMENTS

| | | | |
|---|---|---|---|
| 2011/0095919 A1* | 4/2011 | Ostermoller | G06F 3/044 341/33 |
| 2011/0279408 A1* | 11/2011 | Urano | G06F 3/044 345/174 |
| 2012/0032927 A1* | 2/2012 | Kim | G06F 3/044 345/176 |
| 2012/0075239 A1* | 3/2012 | Azumi | G06F 3/044 345/174 |
| 2013/0181942 A1* | 7/2013 | Bulea | G06F 3/044 345/174 |
| 2014/0160368 A1 | 6/2014 | Huang | |
| 2015/0022731 A1* | 1/2015 | Kang | G06F 3/044 349/12 |
| 2015/0227212 A1* | 8/2015 | Whitt, III | G06F 3/0202 341/22 |

\* cited by examiner

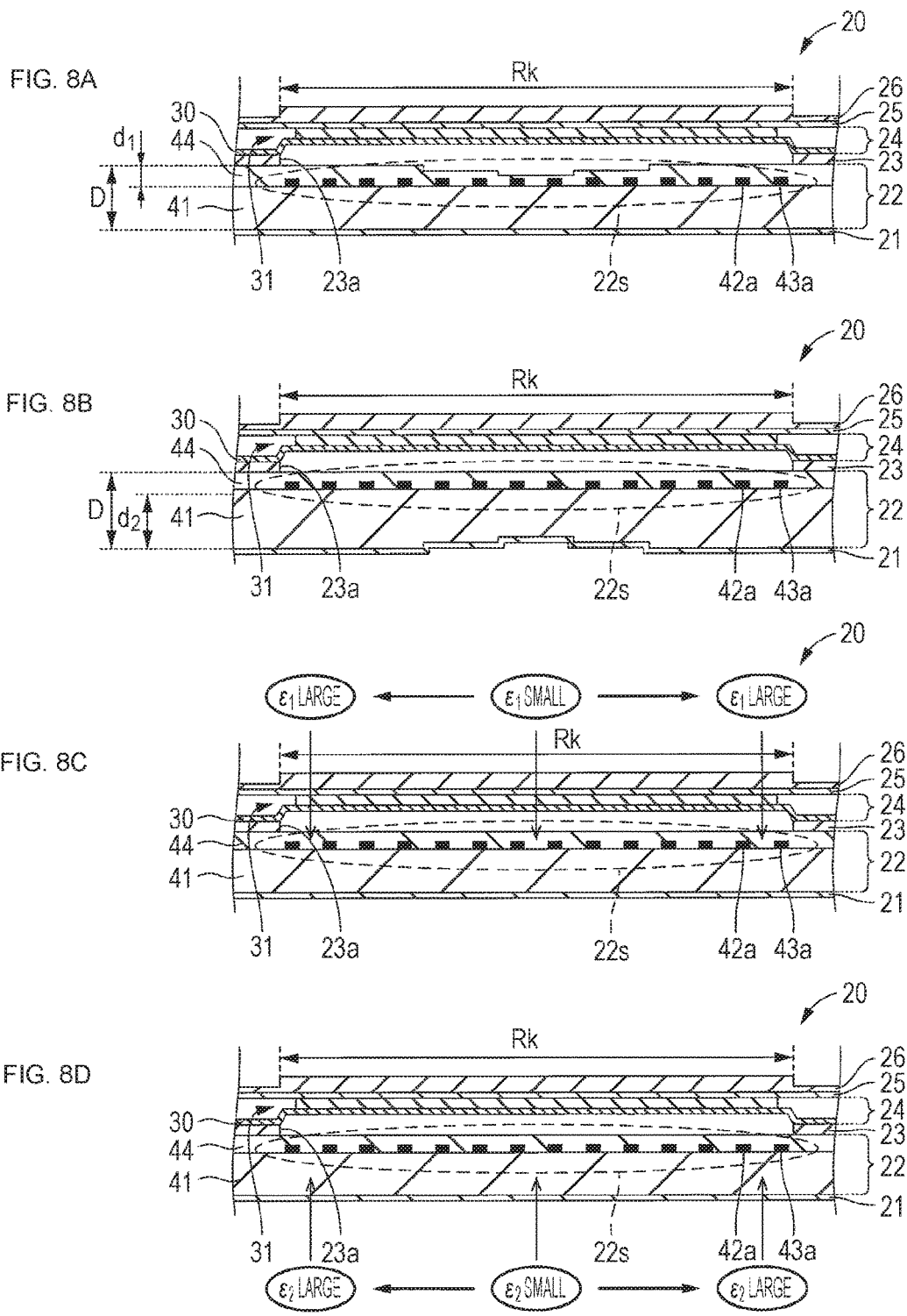

FIG. 36
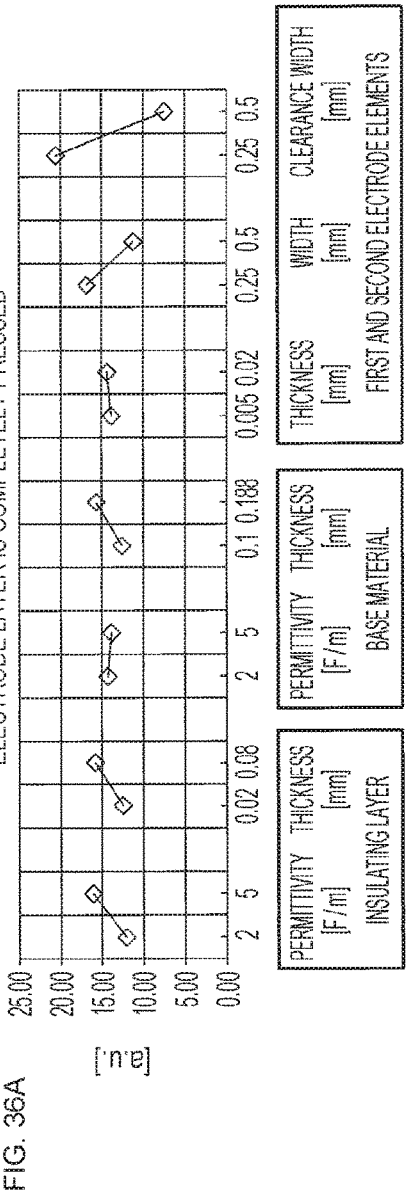
FIG. 36A
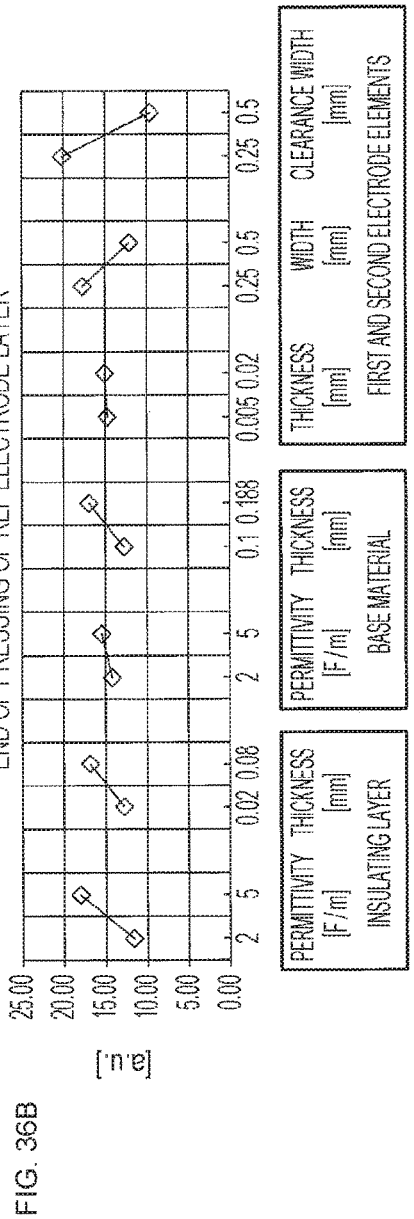
FIG. 36B

SENSOR, INPUT DEVICE, KEYBOARD, AND ELECTRONIC DEVICE

CROSS REFERENCE TO RELATED APPLICATIONS

This application is a U.S. National Phase of International Patent Application No. PCT/JP2015/006362 filed on Dec. 21, 2015, which claims priority benefit of Japanese Patent Application No. JP 2015-023709 filed in the Japan Patent Office on Feb. 9, 2015. Each of the above-referenced applications is hereby incorporated herein by reference in its entirety.

TECHNICAL FIELD

The present technology relates to a pressure-sensitive sensor, an input device, a keyboard, and an electronic device.

BACKGROUND ART

Recently, a pressure-sensitive sensor capable of statistically detecting input operation is widely used in various electronic devices such as a mobile personal computer (PC) and a tablet PC. The pressure-sensitive sensor in which an electrode substrate is provided between first and second conductor layers, the first conductor layer is separated from the electrode substrate by a plurality of first structure bodies, and the electrode substrate is separated from the second conductor layer by a plurality of second structure bodies is suggested (for example, refer to Patent Document 1).

CITATION LIST

Patent Document

Patent Document 1: WO 2014/141584

SUMMARY OF THE INVENTION

Problems to be Solved by the Invention

An operating load might vary in the pressure-sensitive sensor. Therefore, it is desired to decrease the variation in operating load.

An object of the present technology is to provide a sensor capable of decreasing the variation in the operating load, an input device, a keyboard, and an electronic device.

Solutions to Problems

In order to solve the above-described problem, first technology is a sensor provided with a conductor layer, a sensor layer including a sensor unit, and a separating layer which separates the conductor layer from the sensor layer, in which the sensor unit is formed of alternately arranged first and second electrode elements, and sensitivity on an end of the sensor unit is higher than the sensitivity in a central portion of the sensor unit.

Second technology is an input device provided with a conductor layer, a sensor layer including a sensor unit, and a separating layer which separates the conductor layer from the sensor layer, in which the sensor unit is formed of alternately arranged first and second electrode elements, and sensitivity on an end of the sensor unit is higher than the sensitivity in a central portion of the sensor unit.

Third technology is a keyboard provided with a conductor layer, a sensor layer including a sensor unit, a separating layer which separates the conductor layer from the sensor layer, and a key provided so as to correspond to the sensor unit, in which the sensor unit is formed of alternately arranged first and second electrode elements, and sensitivity on an end of the sensor unit is higher than the sensitivity in a central portion of the sensor unit.

Fourth technology is an electronic device provided with a sensor, and an electronic device main body, in which the sensor is provided with a conductor layer, a sensor layer including a sensor unit, and a separating layer which separates the conductor layer from the sensor layer, the sensor unit is formed of alternately arranged first and second electrode elements, and sensitivity on an end of the sensor unit is higher than the sensitivity in a central portion of the sensor unit.

Effects of the Invention

As described above, the present technology may decrease the variation in the operating load.

BRIEF DESCRIPTION OF DRAWINGS

FIG. 8A is a cross-sectional view illustrating a configuration example 2 of the sensor layer. FIG. 8B is a cross-sectional view illustrating the configuration example 2 of the sensor layer. FIG. 8C is a cross-sectional view illustrating a configuration example 3 of the sensor layer. FIG. 8D is a cross-sectional view illustrating the configuration example 3 of the sensor layer.

FIG. 36A is a graph illustrating change in capacitance when a REF electrode layer is completely pressed. FIG. 36B is a graph illustrating a ratio of the change in the capacitance when finishing pressing the REF electrode layer to the change in the capacitance when starting pressing the REF electrode layer is obtained.

MODE FOR CARRYING OUT THE INVENTION

Figure 1A:
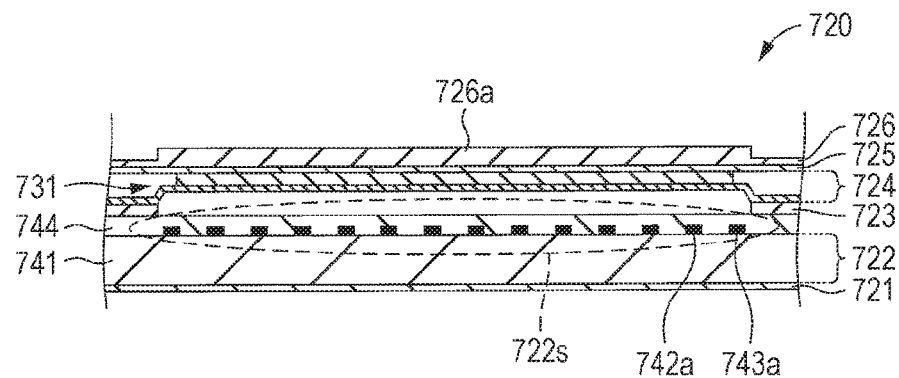
FIG. 1A is a cross-sectional view illustrating an example of a configuration of a sensor.

In the present technology, an arrangement pattern of first and second electrode elements is not especially limited as long as they are alternately arranged in a thickness direction of a sensor layer. That is to say, the first and second electrode elements may be arranged in the same plane or arranged in different planes. In the present technology, an end of a sensor unit is intended to mean a peripheral end or both ends of the sensor unit, for example.

In the present technology, sensitivity distribution of the sensor unit is preferably one-dimensional sensitivity distribution in which sensitivity increases from a central portion of the sensor unit toward both the ends thereof or two-dimensional sensitivity distribution in which the sensitivity increases from the central portion of the sensor unit toward the peripheral end thereof.

In the present technology, the first and second electrode elements are preferably arranged to form a comb-like shape, a concentric shape, or a spiral shape, for example. The concentric shape includes a concentric polygonal shape, a concentric circular shape, and a concentric elliptical shape, for example, but the shape is not limited thereto. The spiral shape includes a spiral polygonal shape, a spiral circular shape, and a spiral elliptical shape, for example, but the shape is not limited thereto.

In the present technology, a separating layer is preferably a structure layer including a structure body provided so as to correspond to the sensor unit. It is preferable that the structure layer is provided with a concavo-convex layer including a convex portion and the structure body is formed of the convex portion. It is preferable that the structure layer is provided with the concave-convex layer including the convex portion and a pressing body provided on an apex of the convex portion and that the structure body is formed of the convex portion and the pressing body from a viewpoint of improving click feeling.

In the present technology, although an electronic device includes a personal computer, a mobile phone such as a smartphone, a tablet computer, a television, a camera, a portable game device, a car navigation system, a wearable device and the like, for example, the device is not limited thereto.

The embodiments of the present technology are described in the following order. Meanwhile, the same or corresponding portions are assigned with the same reference signal throughout all the drawings of the following embodiments.

Overview
1 First Embodiment (Example in Which Sensitivity of Capacitor of Sensor Unit Is Adjusted)
  1.1 Configuration of Electronic Device
  1.2 Configuration of Sensor
  1.3 Operation of Sensor
  1.4 Change in Capacitance by Key Input Operation
  1.5 Operation of Controller IC
  1.6 Effect
  1.7 Variation
2 Second Embodiment (Example in Which Sensitivity of Capacitor of Sensor Unit Is Adjusted)
  2.1 Configuration of Sensor
  2.2 Effect
  2.3 Variation
3 Third Embodiment (Example in Which Arrangement of Capacitor of Sensor Unit Is Adjusted)
  3.1 Configuration of Sensor
  3.2 Effect
4 Fourth Embodiment (Example in Which Arrangement of Capacitor of Sensor Unit Is Adjusted)
  4.1 Configuration of Sensor
  4.2 Effect
5 Fifth Embodiment (Example in Which Arrangement and Sensitivity of Capacitor of Sensor Unit Are Adjusted)
  5.1 Configuration of Sensor
  5.2 Effect
  5.3 Variation
6 Sixth Embodiment (Example in Which Arrangement and Sensitivity of Capacitor of Sensor Unit Are Adjusted)
  6.1 Configuration of Sensor
  6.2 Effect
7 Seventh Embodiment (Example of Sensor Having Another Configuration)
  7.1 Configuration of Sensor
  7.2 Operation of Sensor
  7.3 Effect
  7.4 Variation <Overview>

The inventors of the present invention study a sensor having a configuration illustrated in FIG. 1A as a thin pressure-sensitive sensor capable of generating the click feeling on which two types of input operation, specifically, key input operation and gesture input operation on the same operation surface may be performed. A sensor 720 is provided with a reference electrode layer (hereinafter, referred to as a "REF electrode layer") 721, a sensor layer 722, an intermediate layer 723, a structure layer 724 including a plurality of structure bodies 731, a REF electrode layer 725, and a key top layer 726 including a plurality of keys 726a. The sensor layer 722 includes a sensor unit 722s immediately below the key 726a. The sensor unit 722s is formed of a plurality of first electrode elements 742a and a plurality of second electrode elements 743a alternately arranged in an in-plane direction of the sensor layer 722. When voltage is applied between adjacent first and second electrode elements 742a and 743a, the first and second electrode elements 742a and 743a form capacitive coupling.

The key input operation is detected in the following manner in the pressure-sensitive sensor 720 having the above-described configuration. When the key 726a is pressed, the REF electrode layer 725 is deformed so as to come close to the sensor layer 722 (that is to say, the sensor unit 722s). Due to this deformation, capacitance between the adjacent first and second electrode elements 742a and 743a changes. A controller integrated circuit (IC) detects change in the capacitance of all of a plurality of first electrode elements 742a and a plurality of second electrode elements 743a included immediately below the key 726a and compares a detection result with a threshold for determining the key input operation, thereby detecting presence of the key input operation.

Figure 1B:
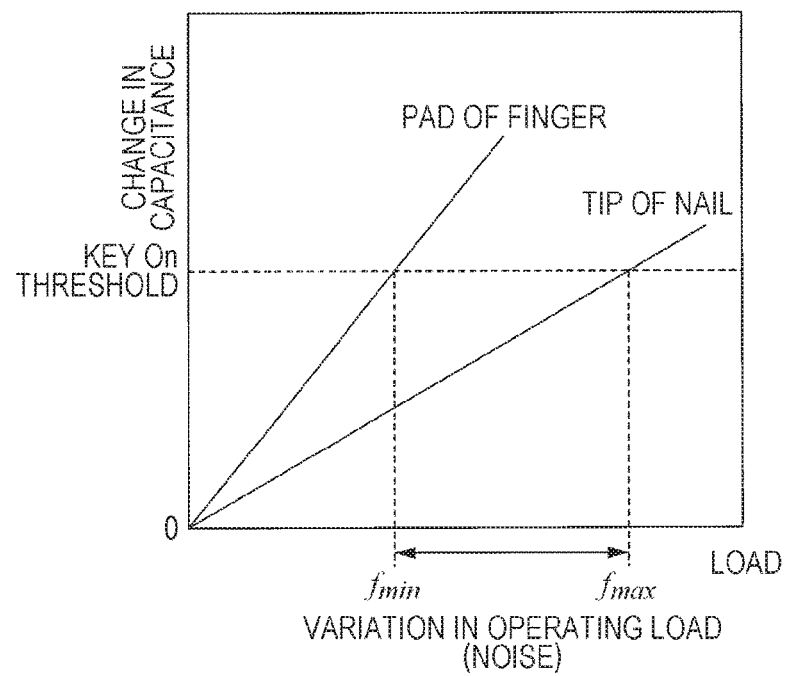
FIG. 1B is a graph illustrating an example of change in capacitance with respect to an operation load.

However, in the sensor 720, an operating load might vary due to difference in position to press the key 726a and an object which presses the same as illustrated in FIG. 1B. For example, the deformation of the REF electrode layer 725 in a case where a central portion of the key 726a is pressed differs from that in a case where an end of the key 726a is pressed, so that the operating load might vary. Also, the deformation of the REF electrode layer 725 in a case where the key 726a is pressed with a pad of a finger (an inner portion of a tip of a finger) is different from that in a case where the key 726a is pressed with a tip of a nail, so that the operating load might vary. Meanwhile, FIG. 1B illustrates the variation in the operating load between a case where the end of the key 726a is pressed with the pad of a finger and a case where the end of the key 726a is pressed with the tip of a nail.

Therefore, the inventors of the present invention exhaustively study in order to decrease the above-described variation in the operating load. As a result, it is found that the variation in the operating load due to the difference in the position to press the key 726a and the object which presses the same may be decreased by making the sensitivity on both the ends or the peripheral end of the sensor unit higher than that in the central portion of the sensor unit. A sensor having such sensitivity distribution, a keyboard providing the same, and an electronic device are hereinafter described.

Figure 2:
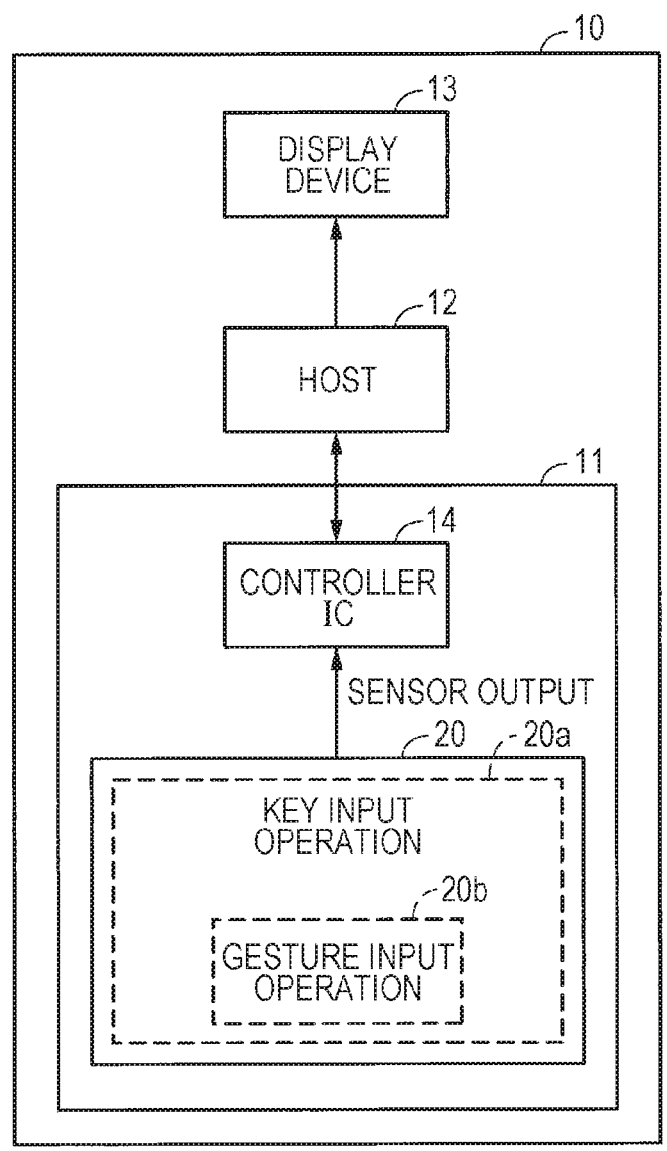
FIG. 2 is a block diagram illustrating an example of a configuration of an electronic device according to a first embodiment of the present technology.

<1 First Embodiment>
[1.1 Configuration of Electronic Device]
As illustrated in FIG. 2, an electronic device 10 is provided with a keyboard 11, a host 12 being a main body of the electronic device 10, and a display device 13. Meanwhile, although a configuration in which the keyboard 11 is provided in the electronic device 10 and both are integrated is illustrated in FIG. 2, a configuration in which the keyboard 11 is provided outside the electronic device 10 as a peripheral device may also be adopted. Also, although a configuration in which the display device 13 is provided in the electronic device 10 and both are integrated is illustrated, a configuration in which the display device 13 is provided outside the electronic device 10 as a peripheral device may also be adopted. Although there is a personal computer, for example, as the electronic device 10, the device is not limited thereto.

(Keyboard)

The keyboard 11 being an example of an input device is provided with a sensor 20 and a controller integrated circuit (IC) 14. Both key input operation 20a and gesture input operation 20b may be performed on the sensor 20. The sensor 20 detects change in capacitance according to the input operation and outputs an electric signal corresponding to this to the controller IC 14. The controller IC 14 outputs information corresponding to the operation performed on the sensor 20 to the host 12 on the basis of the electric signal supplied from the sensor 20. For example, information regarding a pressed key (for example, a scanning code), coordinate information and the like are output.

(Host)

The host 12 executes various processes on the basis of the information supplied from the keyboard 11. For example, this executes the process such as display of character information on the display device 13 and movement of a cursor displayed on the display device 13.

(Display Device)

The display device 13 displays video (screen) on the basis of a video signal, a control signal and the like supplied from the host 12. Although the display device 13 includes a liquid crystal display, an electro luminescence (EL) display, a cathode ray tube (CRT) display, a plasma display panel (PDP) and the like, for example, the display device is not limited thereto.

[1.2 Configuration of Sensor]

Hereinafter, an example of a configuration of the sensor 20 is described with reference to FIGS. 3A and 3B. The sensor 20 is provided with a REF electrode layer 21 as a first conductor layer, a sensor layer 22, an intermediate layer (spacer layer) 23, a structure layer 24 including a plurality of structure bodies 31, a REF electrode layer 25 as a second conductor layer, and a key top layer 26. The sensor 20 includes a flexible operation surface. Hereinafter, out of both principal surfaces of the sensor 20 and a component (forming member) thereof, the principal surface serving as the operation surface is sometimes referred to as a surface (first surface) and the principal surface opposite to the same is sometimes referred to as a rear surface (second surface).

The sensor 20 statistically detects change in distance between the REF electrode layer 25 and the sensor layer 22 due to input operation on the key top layer 26, thereby detecting the input operation. The input operation is the key input operation on the key top layer 26 or the gesture operation on the key top layer 26.

The REF electrode layer 25 is provided on a surface side of the sensor layer 22 with a predetermined interval from the surface. On the other hand, the REF electrode layer 21 is provided on a rear surface side of the sensor layer 22 so as to be adjacent to the rear surface. By providing the REF electrode layers 21 and 25 on both surface sides of the sensor layer 22 in this manner, it is possible to prevent external noise (external electric field) from entering the sensor 20.

The intermediate layer 23 and the structure layer 24 are provided in this order between the sensor layer 22 and the REF electrode layer 25 in a direction from the sensor layer 22 to the REF electrode layer 25. The intermediate layer 23 is separated from the REF electrode layer 25 and a predetermined space is provided therebetween by a plurality of structure bodies 31 included in the structure layer 24.

(REF Electrode Layer)

The REF electrode layer 21 forming the rear surface of the sensor 20 is arranged so as to be opposed to the REF electrode layer 25 in a thickness direction of the sensor 20. The REF electrode layer 21 having bending stiffness higher than that of the sensor layer 22, the REF electrode layer 25 and the like, for example, serves as a supporting plate of the sensor 20.

A conductive layer or a conductive base material may be used as the REF electrode layer 21. The conductive base material is provided with a base material and a conductive layer provided on a surface thereof, for example. The base material has a film shape or a plate shape, for example. Herein, the film also includes a sheet. It is sufficient that the conductive layer has electric conductivity, and an inorganic conductive layer including an inorganic conductive material, an organic conductive layer including an organic conductive material, an organic-inorganic conductive layer including both the inorganic conductive material and the organic conductive material and the like may be used, for example.

The inorganic conductive material includes metal, a metal oxide and the like, for example. Herein, it is defined that the metal includes semi metal. The metal includes metal such as aluminum, copper, silver, gold, platinum, palladium, nickel, tin, cobalt, rhodium, iridium, steel, ruthenium, osmium, manganese, molybdenum, tungsten, niobium, tantalum, titanium, bismuth, antimony, and lead, an alloy thereof and the like, for example; however, the metal is not limited thereto. The metal oxide includes an indium tin oxide (ITO), a zinc oxide, an indium oxide, an antimony-added tin oxide, a fluorine-added tin oxide, an aluminum-added zinc oxide, a gallium-added zinc oxide, a silicon-added zinc oxide, a zinc oxide-tin oxide system, an indium oxide-tin oxide system, a zinc oxide-indium oxide-magnesium oxide system and the like, for example; however, the metal oxide is not limited thereto.

The organic conductive material includes a carbon material, a conductive polymer and the like, for example. The carbon material includes carbon black, a carbon fiber, fullerene, graphene, a carbon nanotube, a carbon micro coil, nanohorn and the like, for example; however, the material is not limited thereto. Substituted or non-substituted polyaniline, polypyrrole, polythiophene, a (co)polymer formed of one or two of them and the like may be used, for example, as the conductive polymer; however, there is no limitation.

A metal plate including a metal material such as an Al alloy or a Mg alloy, a conductor plate such as carbon fiber reinforced plastic, and a layered product obtained by forming a conductive layer such as a plating film, a deposition film, a sputtering film, or a metal film on an insulation layer including a plastic material and the like, for example, may be specifically used as the REF electrode layer 21. The REF electrode layer 21 is connected to ground potential, for example.

Although there is a flat plate shape, for example, as a shape of the REF electrode layer 21, the shape is not limited thereto. For example, the REF electrode layer 21 may have a step. Also, one or a plurality of openings may be provided on the REF electrode layer 21. Furthermore, the REF electrode layer 21 may have a mesh-like configuration.

The REF electrode layer 25 has flexibility. Therefore, the REF electrode layer 25 may be deformed as the operation surface is pressed. The REF electrode layer 25 is a conductive layer or a conductive film having flexibility, for example. The conductive film is provided with a film as a base material and a conductive layer provided on a surface thereof, for example. A material similar to that of the conductive layer of the above-described REF electrode layer 21 may be illustrated as the material of the conductive layer.

A stainless used steel (SUS) film, a carbon printed film, an indium tin oxide (ITO) film, a metal deposition film obtained by depositing metal such as Cu and the like may be specifically used, for example, as the conductive film. The REF electrode layer 25 is connected to ground potential, for example.

(Sensor Layer)

The sensor layer 22 provided between the REF electrode layer 21 and the REF electrode layer 25 may statistically detect change in the distance from the REF electrode layer 25 on the operation surface side. Specifically, the sensor layer 22 includes a plurality of sensor units 22s and a plurality of sensor units 22s detects the capacitance changing according to the distance from the REF electrode layer 25. Sensitivity on both ends of the sensor unit 22s is higher than the sensitivity in a central portion of the sensor unit 22s. The sensitivity of the sensor unit 22s preferably gradually increases from the central portion of the sensor unit 22s toward both the ends thereof. A plurality of sensor units 22s is arranged in an in-plane direction of the sensor layer 22 in a two-dimensional manner so as to correspond to key arrangement of the sensor 20. The sensor unit 22s is formed of a plurality of first electrode elements 42a and a plurality of second electrode elements 43a which are alternately arranged.

The sensor layer 22 being a capacitance sensor layer is provided with a base material 41, a plurality of first electrodes, a plurality of second electrodes, and an insulating layer 44. A plurality of first electrodes and a plurality of second electrodes are arranged on a surface of the base material 41. The first and second electrodes include a plurality of first electrode elements 42a and a plurality of second electrode elements 43a described above, respectively. Meanwhile, configurations of the first and second electrodes are to be described later in detail.

Figure 3A:
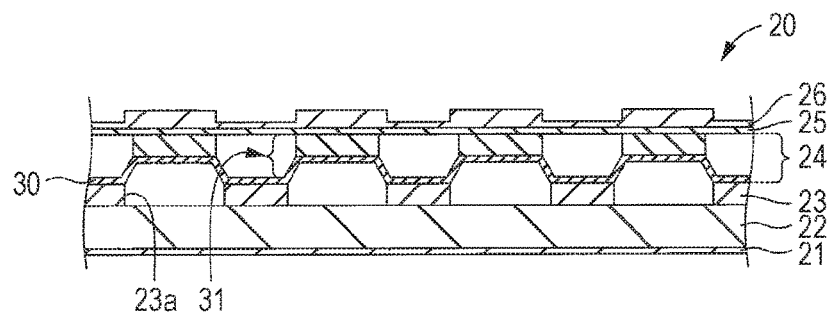
FIG. 3A is a cross-sectional view illustrating an example of a configuration of a sensor according to the first embodiment of the present technology.
Figure 3B:
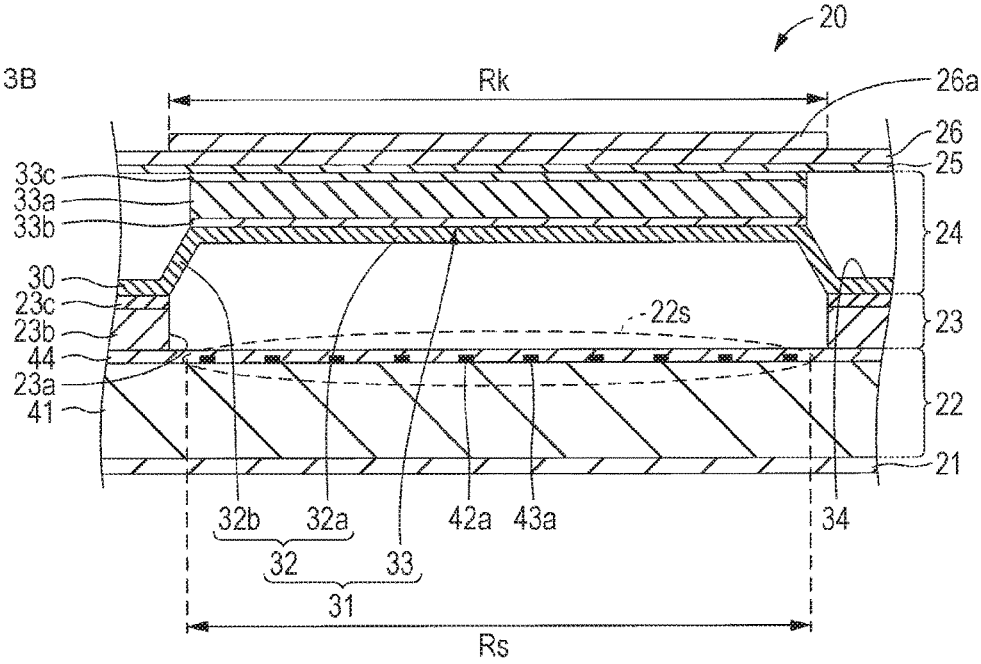
FIG. 3B is an enlarged cross-sectional view of a part of the sensor illustrated in FIG. 3A.

In FIGS. 3A and 3B, an example in which a thickness of the sensor layer 22 is identical regardless of positions and thicknesses, arrangement intervals, and widths of a plurality of first and second electrode elements 42a and 43a are identical is illustrated for simplifying the illustration. As described later, a configuration of the sensor layer 22 is not limited to this example and a configuration in which they change may also be adopted.

The sensor unit 22s has a size substantially the same as or larger than that of a key region Rk, for example. From a viewpoint of improving sensitivity on both ends of the key 26a, it is preferable that the sensor unit 22s is larger than the key 26a, and a peripheral edge of the sensor unit 22s is arranged on an outer side of a peripheral edge of the key region Rk as seen in a direction perpendicular to the surface of the sensor 20. Herein, the key region Rk is intended to mean a range in which the key 26a is formed of the key top layer 26.

A polymer resin film or a glass substrate may be used, for example, as the base material 41. Polyethylene terephthalate (PET), polyethylene naphthalate (PEN), polycarbonate (PC), acrylic resin (PMMA) polyimide (PI), triacetyl cellulose (TAC), polyester, polyamide (PA), aramid, polyethylene (PE), polyacrylate, polyether sulfone, polysulfone, polypropylene (PP), cellulose diacetate, polyvinyl chloride, epoxy resin, urea resin, urethane resin, melamine resin, cyclic olefin polymer (COP), thermoplastic norbornene resin and the like may be used, for example, as a material of the polymer resin film.

A thickness of the base material 41 is preferably not less than 100 μm and not more than 250 μm. It is possible to obtain initial capacitance sufficient for the controller IC 14 to drive by making the thickness of the base material 41 fall within this range. Relative permittivity of the base material 41 is preferably not less than 2 and not more than 5. It is possible to use a general resin material as the material of the base material 41 by making the relative permittivity of the base material 41 fall within this range.

The insulating layer 44 is provided on the surface of the base material 41 so as to cover a plurality of first and second electrodes. An ultraviolet curing resin, a thermal curing resin, an insulating resist, a metal compound and the like may be used, for example, as a material of the insulating layer 44. Specifically, resin materials such as polyacrylate, polyvinyl alcohol (PVA), polystyrene (PS), polyimide, polyester, epoxy, polyvinyl phenol, and polyvinyl alcohol, and a metal compound such as $SiO_2$, $SiNx$, $SiON$, $Al_2O_3$, $Ta_2O_5$, $Y_2O3$, $HfO_2$, $HfAlO$, $ZrO_2$, and $TiO_2$ may be used, for example.

A thickness of the insulating layer 44 is preferably not less than 20 μm and not more than 80 μm. By making the thickness of the insulating layer 44 fall within this range, the insulating layer 44 may be manufactured by a screen printing method, so that the insulating layer 44 may be manufactured at a low cost. Also, insulating properties of the first and second electrodes may be sufficiently secured. Relative permittivity of the insulating layer 44 is preferably not less than 2 and not more than 5. It is possible to use a general resin material as the material of the insulating layer 44 by making the relative permittivity of the insulating layer 44 fall within this range.

(First and Second Electrodes)

Figure 4A:
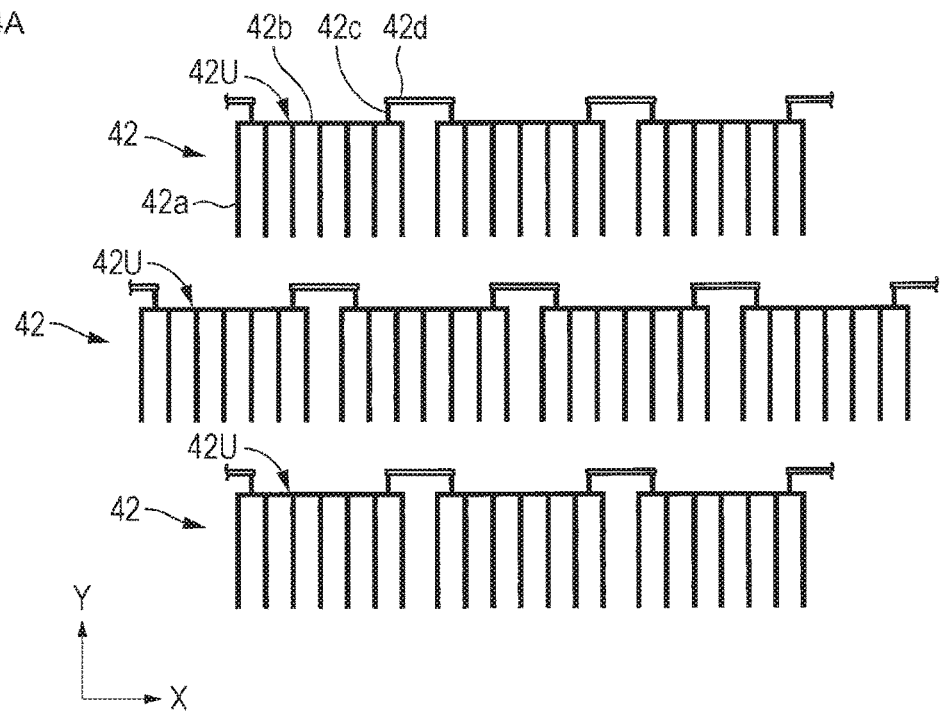
FIG. 4A is a planar view illustrating an example of a configuration of a first electrode.

As illustrated in FIG. 4A, a first electrode 42 is provided with a plurality of first unit electrode bodies 42U and a plurality of first connections 42c. Meanwhile, in the present specification, one of axes orthogonal to each other in a surface of the base material 51 is referred to as an X-axis and the other axis is referred to as a Y-axis. Also, an axis perpendicular to both the X-axis and the Y-axis is referred to as a Z-axis. A plurality of first unit electrode bodies 42U is arranged in an X-axis direction at regular intervals and the first unit electrode bodies 42U adjacent to each other in the X-axis direction are electrically connected to each other by the first connection 42c.

The first unit electrode body 42U has a comb-like shape as a whole. Specifically, the first unit electrode body 42U is provided with a plurality of first electrode elements 42a and a joint part 42b. A plurality of first electrode elements 42a is extended in a Y-axis direction. The first electrode elements 42a adjacent to each other are separated with a constant interval therebetween. One ends of a plurality of first electrode elements 42a are joined to the joint part 42b extended in the X-axis direction.

Figure 4B:
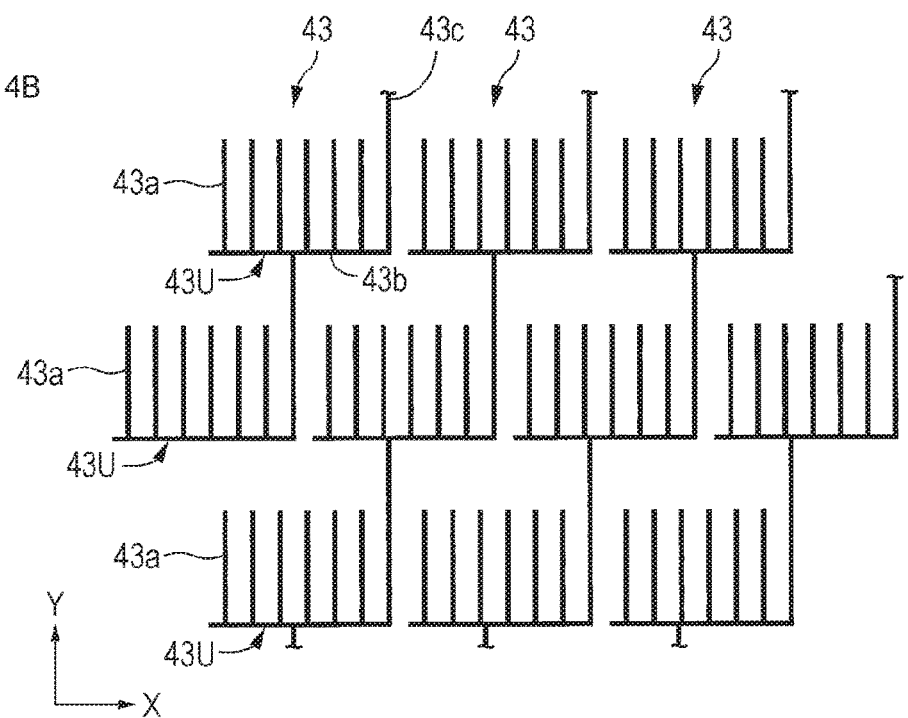
FIG. 4B is a planar view illustrating an example of a configuration of a second electrode.

As illustrated in FIG. 4B, a second electrode 43 is provided with a plurality of second unit electrode bodies 43U and a plurality of second connections 43c. A plurality of second unit electrode bodies 43U is arranged at regular intervals in the Y-axis direction such that the second unit electrode bodies 43U adjacent to each other in the Y-axis direction are shifted in the X-axis direction at regular intervals. Also, the second unit electrode bodies 43U adjacent to each other in the Y-axis direction are electrically connected to each other by the second connection 43c.

The second unit electrode body 43U has a comb-like shape as a whole. Specifically, the second unit electrode body 43U is provided with a plurality of second electrode elements 43a and a joint part 43b. A plurality of second electrode elements 43a is extended in the Y-axis direction. The adjacent second electrode elements 43a are separated with a constant interval therebetween. One ends of a plurality of second electrode elements 43a are joined to the joint part 43b extended in the X-axis direction.

Materials similar to those of the conductive layers of the REF electrode layers 21 and 25 may be illustrated as materials of the first and second electrodes 42 and 43. The screen printing method and a photo lithography method may be used, for example, as a method of manufacturing the first and second electrodes 42 and 43. A vapor deposition method and a physical vapor deposition (PVD) method such as sputtering may be used, for example, as a method of depositing a thin film to be patterned by the photo lithography method.

Figure 5:
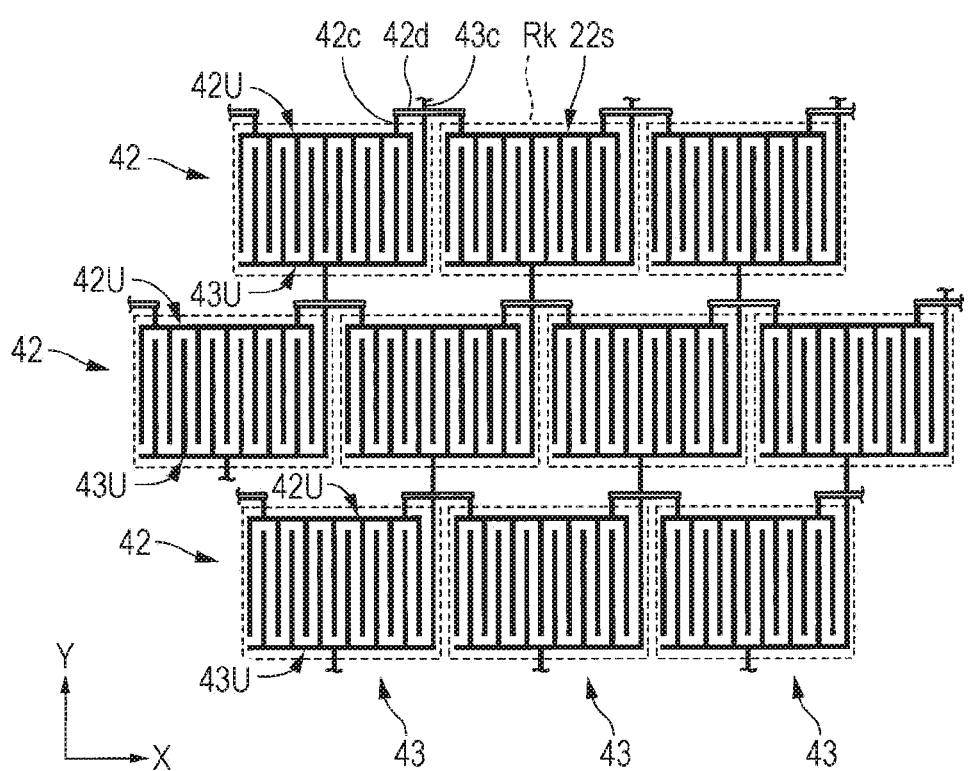
FIG. 5 is a planar view illustrating an example of a configuration and arrangement of a sensor unit.

As illustrated in FIG. 5, a plurality of sensor units 22s is arranged on the base material 41 in a two-dimensional manner. Each sensor unit 22s is formed of a pair of first and second unit electrode bodies 42U and 43U. A plurality of first electrode elements 42a included in the first unit electrode body 42U and a plurality of second electrode elements 43a included in the second unit electrode body 43U are alternately arranged in the X-axis direction. The first and second electrode elements 42a and 43a are separated from each other with a predetermined interval therebetween.

The first connection 42c is provided so as to stride over the second connection 43c. Specifically, the first connection 42c includes a jumper wiring unit 42d and the jumper wiring unit 42d is arranged so as to stride over the second connection 43c. An insulating layer is provided between the jumper wiring unit 42d and the second connection 43c.

(Sensitivity Distribution)

Figure 6A:
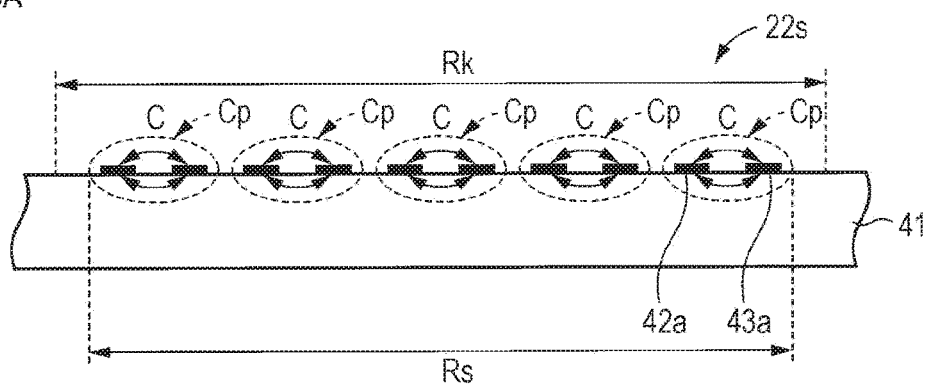
FIG. 6A is a schematic diagram illustrating an example of a configuration of a sensor layer.
Figure 6B:
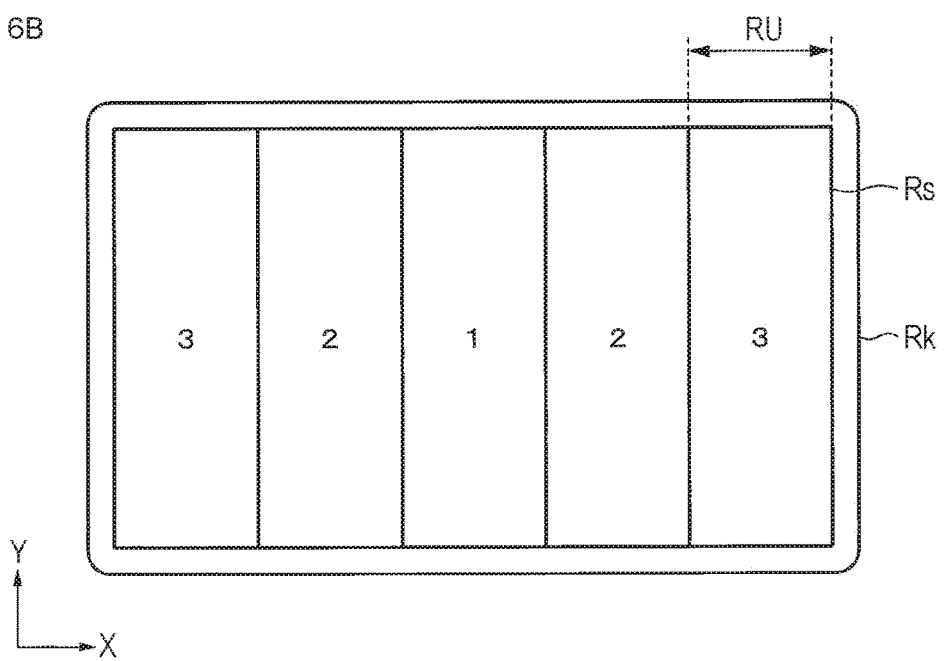
FIG. 6B is a schematic diagram illustrating an example of sensitivity distribution of a sensor region.

When voltage is applied between the first and second electrodes 42 and 43, the first and second electrode elements 42a and 43a adjacent in an in-plane direction of the base material 41 are capacitively coupled as illustrated in FIG. 6A. The capacitively coupled first and second electrode elements 42a and 43a may be considered to form a capacitor Cp having capacitance C. In FIG. 6A, an example in which five capacitors Cp are arranged in one sensor region Rs is illustrated. Meanwhile, although capacitive coupling is generated and the capacitor Cp is formed between all the first and second electrode elements 42a and 43a actually, an example in which it is considered that the capacitive coupling is generated and the capacitor Cp is formed only between a pair of two adjacent first and second electrode elements 42a and 43a is illustrated in FIGS. 6A and 6B for simplifying illustration and description. Meanwhile, there also is a case where illustration of the capacitor Cp and the like is simplified in the following description.

When the key 26a on the key top layer 26 is pressed, the REF electrode layer 25 is deformed and a distance between the REF electrode layer 25 and the first and second electrode elements 42a and 43a, that is to say, the distance between the REF electrode layer 25 and the capacitor Cp changes. The capacitance of the capacitively coupled first and second electrode elements 42a and 43a, that is to say, the capacitance C of the capacitor Cp changes according to this change.

The sensor 20 has one-dimensional sensitivity distribution in which the sensitivity changes from the central portion of the sensor unit 22s toward both the ends thereof. Specifically, this has the following sensitivity distribution. That is to say, sensitivity of the capacitors Cp arranged on both the ends of the sensor unit 22s is higher than the sensitivity of the capacitor Cp arranged in the central portion of the sensor unit 22s. In this case, the sensitivity of the capacitor Cp preferably gradually increases from the central portion of the sensor unit 22s toward both the ends thereof. Due to such a configuration, the sensitivity on both the ends of the sensor unit 22s is higher than the sensitivity in the central portion of the sensor unit 22s as described above. Herein, the sensitivity of the capacitor Cp is intended to mean the sensitivity of the capacitor Cp with respect to the operation load. That is to say, the capacitor Cp with large change in the capacitance even with a small operation load may be referred to as a high-sensitive capacitor Cp, and the capacitor Cp with small change in the capacitance even with a large operation load may be referred to as a low-sensitive capacitor Cp.

As illustrated in FIG. 6B, a rectangular sensor region Rs is evenly divided in a stripe pattern by a plurality of rectangular unit regions RU and it may be considered that the capacitor Cp having the capacitance C is arranged in each divided unit region RU. Meanwhile, FIG. 4B illustrates an example in which the rectangular sensor region Rs is evenly divided in a stripe pattern by five rectangular unit regions RU and the capacitor Cp is arranged in each unit region. Numerical values 1 to 3 assigned to the unit regions RU indicate the sensitivities of the capacitors Cp arranged in the unit regions RU; the larger the numerical value, the higher the sensitivity.

(Configuration Example of Sensor Layer Having Sensitivity Distribution)

Configuration examples 1 to 4 of the sensor layer 22 for obtaining the above-described sensitivity distribution are hereinafter sequentially described. Meanwhile, it is also possible to adopt combination of two or more configuration examples of the configuration examples 1 to 4 to be described hereinafter.

(Configuration Example 1)

Figure 7A:
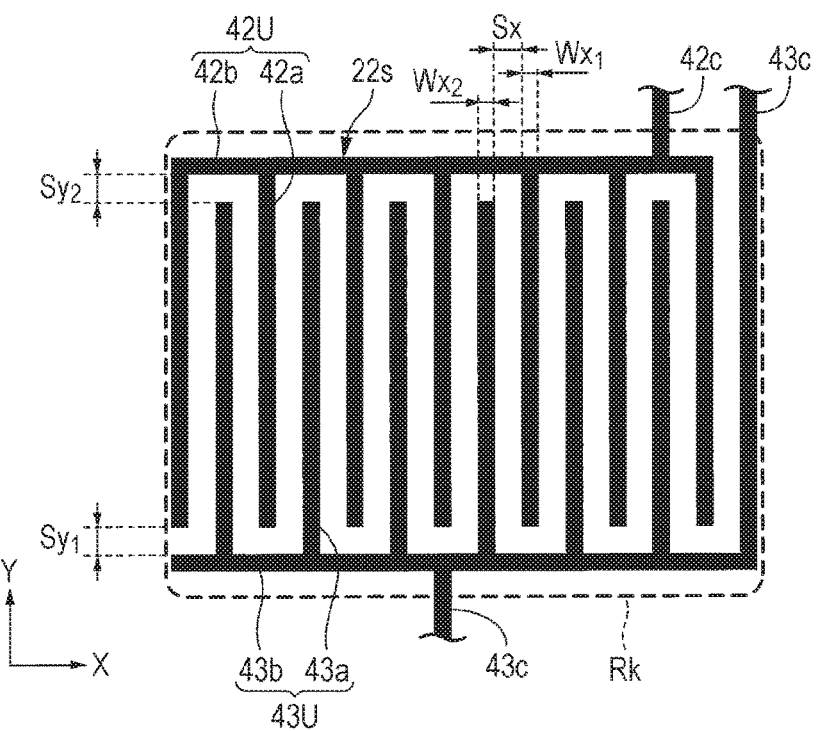
FIG. 7A is a planar view illustrating a configuration example 1 of the sensor unit.

As illustrated in FIG. 7A, a plurality of first electrode elements 42a included in the first unit electrode body 42U and a plurality of second electrode elements 43a included in the second unit electrode body 43U are alternately arranged so as to be parallel to one another. Widths $Wx_1$ and $Wx_2$ of the first and second electrode elements 42a and 43a are identical to each other, and the first and second electrode elements 42a and 43a are separated from each other with a certain clearance width Sx therebetween. Also, a clearance width $Sy_1$ between the first electrode element and the joint part and a clearance width $Sy_2$ between the second electrode element and the joint part are constant from the central portion of the sensor unit 22s to both the ends thereof. Herein, the clearance width $Sy_1$ between the first electrode element and the joint part is intended to mean the clearance width between a tip end of the first electrode element 42a and the joint part 43b. Also, the clearance width $Sy_2$ between the second electrode element and the joint part is intended to mean the clearance width between a tip end of the second electrode element 43a and the joint part 42b.

Figure 7B:
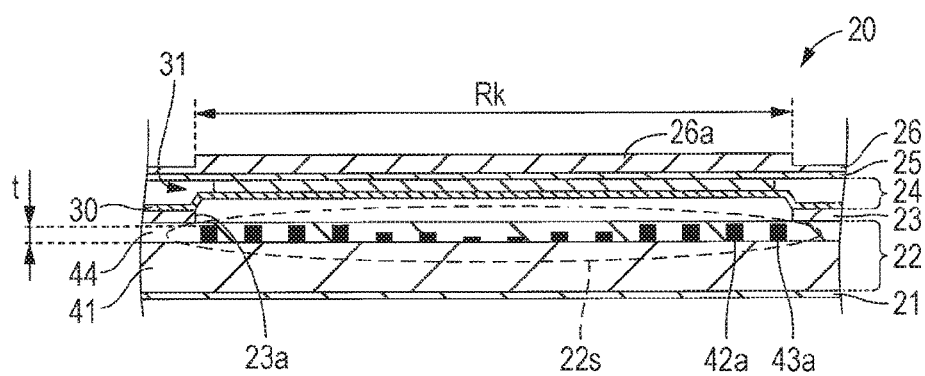
FIG. 7B is a cross-sectional view illustrating the configuration example 1 of the sensor layer.

As illustrated in FIG. 7B, thicknesses t of the first and second electrode elements 42a and 43a on both the ends (both the ends in the X-axis direction) of the sensor unit 22s are thicker than the thicknesses t of the first and second electrode elements 42a and 43a in the central portion (the central portion in the X-axis direction) of the sensor unit 22s. In this case, the thicknesses t of the first and second electrode elements 42a and 43a preferably gradually increase from the central portion of the sensor unit 22s toward both the ends thereof (both the ends in the X-axis direction).

The thicknesses t of the first and second electrode elements 42a and 43a are preferably not less than 5 μm and not more than 20 μm. When making the thicknesses t of the first and second electrode elements 42a and 43a fall within this range, the first and second electrode elements 42a and 43a may be manufactured by the screen printing method, so that the first and second electrode elements 42a and 43a may be manufactured at a low cost. Meanwhile, thicknesses of an entire first electrode 42 and an entire second electrode 43 are generally equal to the thicknesses t of the first and second electrode elements 42a and 43a described above, respectively.

The widths $Wx_1$ and $Wx_2$ of the first and second electrode elements 42a and 43a and the clearance width Sx therebetween preferably fall within a range not smaller than 100 μm and not larger than 1000 μm. When the widths $Wx_1$ and $Wx_2$ and the clearance width Sx are made not smaller than 100 μm, the first and second electrode elements 42a and 43a may be manufactured by the screen printing method, so that the first and second electrode elements 42a and 43a may be manufactured at a low cost. Furthermore, when this falls within a range not smaller than 250 μm and not larger than 1000 μm, a cheap silver paste material may be used in the screen printing, so that this may be manufactured at a lower cost. On the other hand, when the widths $Wx_1$ and $Wx_2$ and the clearance width Sx are made not larger than 1000 μm, the initial capacitance sufficient for the controller IC 14 to drive may be obtained.

(Configuration Example 2)

As illustrated in FIGS. 8A and 8B, a thickness D of the sensor layer 22 on both the ends (both the ends in the X-axis direction) of the sensor unit 22s is thicker than the thickness of the sensor layer 22 in the central portion (the central portion in the X-axis direction) of the sensor unit 22s. In this case, the thickness D of the sensor layer 22 preferably gradually increases from the central portion of the sensor unit 22s toward both the ends (both the ends in the X-axis direction) thereof. At least one of the surface and the rear surface of the sensor layer 22 has an inclined surface or a step which becomes higher from the central portion of the sensor unit 22s toward both the ends thereof, for example.

FIG. 8A illustrates a configuration in which the thickness D of the sensor layer 22 is changed as described above by change in thickness $d_1$ of the insulating layer 44. FIG. 8B illustrates a configuration in which the thickness D of the sensor layer 22 is changed as described above by change in thickness $d_2$ of the base material 41.

(Configuration Example 3)

As illustrated in FIGS. 8C and 8D, the permittivity of the sensor layer 22 on both the ends (both the ends in the X-axis direction) of the sensor unit 22s is larger than the permittivity of the sensor layer 22 in the central portion (the central portion in the X-axis direction) of the sensor unit 22s. In this case, the permittivity of the sensor layer 22 preferably gradually increases from the central portion of the sensor unit 22s toward both the ends thereof. For example, the permittivity of the sensor layer 22 changes so as to increase continuously or discontinuously from the center thereof toward both the ends (both the ends in the X-axis direction). In a case where the sensor layer 22 has a laminated structure as illustrated in FIGS. 8C and 8D, the permittivity of the sensor layer 22 is intended to mean the permittivity of all the layers forming the sensor layer 22 or the permittivity of at least one of all the layers forming the sensor layer 22.

FIG. 8C illustrates a configuration in which the permittivity of the sensor layer 22 is changed as described above by change in permittivity $\varepsilon_1$ of the insulating layer 44. FIG. 8D illustrates a configuration in which the permittivity of the sensor layer 22 is changed as described above by change in permittivity $\varepsilon_2$ of the base material 41.

At least one of following manufacturing methods (A) to (D) may be used, for example, as the method of manufacturing the sensor layer 22 having the distribution of the permittivity as described above.

Manufacturing method (A): A method in which at least one of the insulating layer 44 and the base material 41 is allowed to contain bubble and concentration distribution of the bubble in which a content of the bubble in the sensor layer 22 on both the ends of the sensor unit 22s is smaller than the content of the bubble in the sensor layer 22 in the central portion of the sensor unit 22s is given to the sensor layer 22.

Manufacturing method (B): A method in which at least one of the insulating layer 44 and the base material 41 is allowed to contain antifoam and concentration distribution of the antifoam in which a content of the antifoam in the sensor layer 22 on both the ends of the sensor unit 22s is larger than the content of the bubble in the sensor layer 22 in the central portion of the sensor unit 22s is given to the sensor layer 22.

Manufacturing method (C): A method in which the base material 41 is allowed to contain a particle having permittivity smaller or larger than that of a parent material of the base material 41, and distribution of the permittivity in which the permittivity of the base material 41 on both the ends of the sensor unit 22s is larger than the permittivity of the base material 41 in the central portion of the sensor unit 22s is given to the base material 41.

Manufacturing method (D): A method in which the insulating layer 44 is allowed to contain a particle having permittivity smaller or larger than that of a parent material of the insulating layer 44 and distribution of the permittivity in which the permittivity of the insulating layer 44 on both the ends of the sensor unit 22s is larger than the permittivity of the insulating layer 44 in the central portion of the sensor unit 22s is given to the insulating layer 44.

It is also possible to use at least one of following manufacturing methods (E) to (H) in a case where the ultraviolet curing resin is used as the material of at least one of the insulating layer 44 and the base material 41.

Manufacturing method (E): A method in which irradiation strength of ultraviolet ray in a portion corresponding to both the ends of the sensor unit 22s is made stronger than that in a portion corresponding to the central portion of the sensor unit 22s when manufacturing at least one of the insulating layer 44 and the base material 41 by curing the ultraviolet curing resin by applying the ultraviolet ray.

Manufacturing method (F): A method in which irradiation time of the ultraviolet ray in the portion corresponding to both the ends of the sensor unit 22s is made longer than that in the portion corresponding to the central portion of the sensor unit 22s when manufacturing at least one of the insulating layer 44 and the base material 41 by curing the ultraviolet curing resin by applying the ultraviolet ray.

Manufacturing method (G): Method in which a process of applying post-baking to at least one of the insulating layer 44 and the base material 41 after the insulating layer 44 and the base material 41 are manufactured is further provided and the portion corresponding to both the ends of the sensor unit 22s is post-baked in this process.

Manufacturing method (H): A method in which at least one of the insulating layer 44 and the base material 41 is manufactured of the ultraviolet curing resin containing an initiator and concentration distribution of the initiator in which a content of the initiator in the sensor layer 22 on both the ends of the sensor unit 22s is larger than the content of the initiator in the sensor layer 22 in the central portion of the sensor unit 22s is given to the sensor layer 22.

It is also possible to use at least one of following manufacturing methods (I) and (J) in a case where the thermal curing resin is used as the material of at least one of the insulating layer 44 and the base material 41.

Manufacturing method (I): A method in which heating temperature in the portion corresponding to both the ends of the sensor unit 22s is made higher than the heating temperature in the portion corresponding to the central portion of the sensor unit 22s when manufacturing at least one of the insulating layer 44 and the base material 41 by curing the thermal curing resin by heating.

Manufacturing method (J): A method in which heating time in the portion corresponding to both the ends of the sensor unit 22s is made longer than the heating time in the portion corresponding to the central portion of the sensor unit 22s when manufacturing at least one of the insulating layer 44 and the base material 41 by curing the thermal curing resin by heating.

(Configuration Example 4)

Figure 9A:
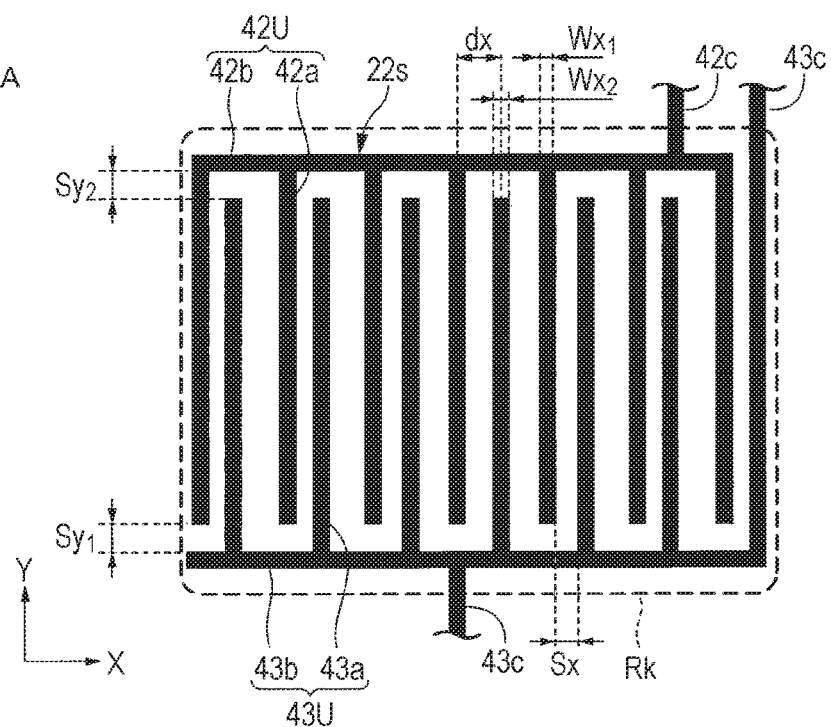
FIG. 9A is a planar view illustrating a configuration example 4 of the sensor unit.
Figure 9B:
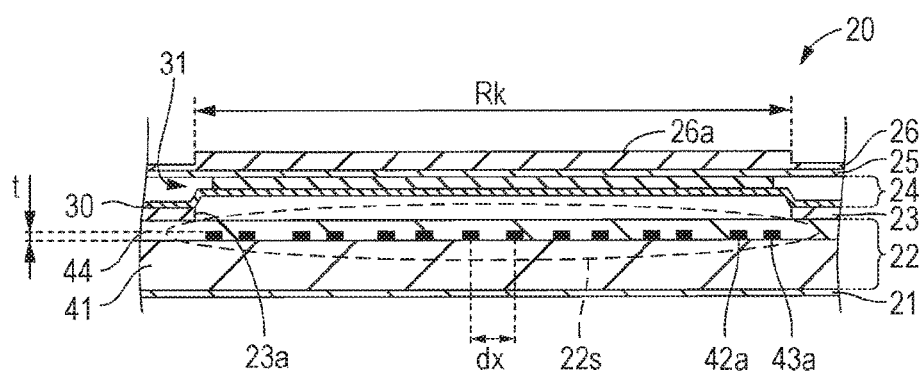
FIG. 9B is a cross-sectional view illustrating the configuration example 4 of the sensor layer.

As illustrated in FIGS. 9A and 9B, an arrangement interval dx between the capacitively coupled first and second electrode elements 42a and 43a on both the ends (both the ends in the X-axis direction) of the sensor unit 22s is smaller than the arrangement interval dx between the capacitively coupled first and second electrode elements 42a and 43a in the central portion (the central portion in the X-axis direction) of the sensor unit 22s. In this case, the arrangement interval dx between the first and second electrode elements 42a and 43a preferably gradually decreases from the central portion of the sensor unit 22s toward both the ends thereof (both the ends in the X-axis direction).

(Structure Layer)

The structure layer 24 being an example of the separating layer which separates the sensor layer 22 from the REF electrode layer 25 is provided between the REF electrode layer 25 and the intermediate layer 23. The REF electrode layer 25 is separated from the intermediate layer 23 and a predetermined space is provided therebetween by a plurality of structure bodies 31 included in the structure layer 24. The structure layer 24 is formed of an embossed layer (concavo-convex layer) 30 having a concavo-convex shape and a plurality of pressing bodies 33 provided on apexes 32a of a plurality of convex portions 32 included in the embossed layer 30 as illustrated in FIG. 3B.

The structure body 31 is provided so as to correspond to the sensor unit 22s. That is to say, the structure body 31 is provided on the sensor unit 22s. The structure body 31 is formed of the convex portion 32 and the pressing body 33 provided on the apex 32a of the convex portion 32. A rear surface side of the convex portion 32 is concave and an inner portion of the convex portion 32 is hollowed. A planar portion 34 is provided between the convex portions 32 and the planar portion 34 is provided on the intermediate layer 23. The planar portion 34 is adhered to the intermediate layer 23 through an adhesive layer 23c to be described later, so that the structure layer 24 is fixed on the intermediate layer 23.

The convex portion 32 is a reactive force structure body in which reactive force non-linearly changes with respect to a pressing amount (the operation load). The convex portion 32 has the apex 32a and a buckling portion 32b. The convex portion 32 preferably has a truncated cone shape or a truncated square pyramid shape. With such shapes, a height of the convex portion 32 may be decreased as compared to a case where the shape of the convex portion 32 is a dome shape. Meanwhile, the shape of the convex portion 32 is not limited thereto and another shape may also be used.

Figure 3C:
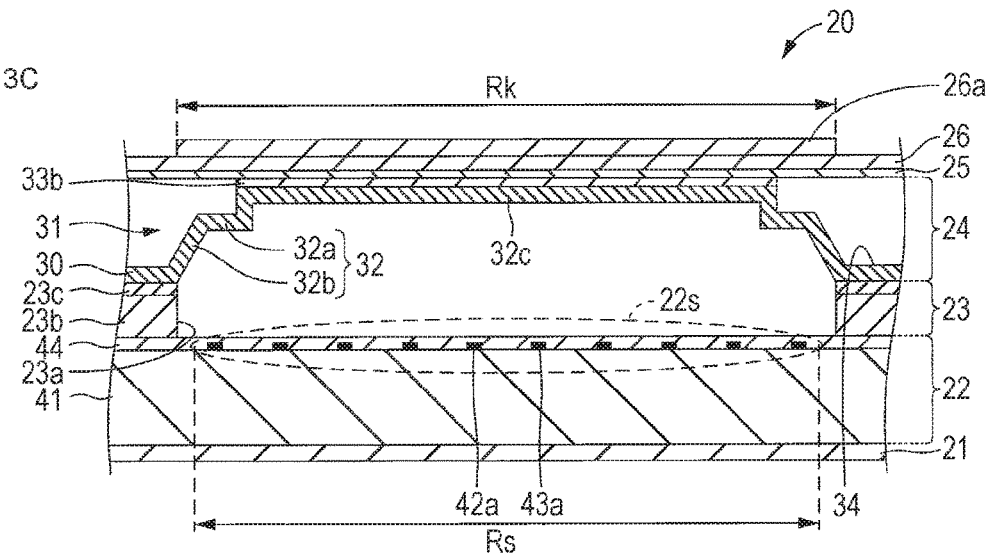
FIG. 3C is a cross-sectional view illustrating a variation of a pressing body.

The pressing body 33 being a both-side adhesive film, for example, is provided with a resin layer 33a and adhesive layers 33b and 33c provided on both surfaces of the resin layer as illustrated in FIG. 3B. The pressing body 33 is adhered to a surface of the apex 32a of the convex portion 32 through the adhesive layer 33b and adhered to the rear surface of the REF electrode layer 25 through the adhesive layer 33c. It is also possible that the apex 32a of the embossed layer 30 is deformed into a convex shape to provide a shaped portion 32c as illustrated in FIG. 3C. In this case, the resin layer 33a and the adhesive layer 33c are not required and the pressing body 33 may be formed only of the shaped portion 32c and the adhesive layer 33b.

The embossed layer 30 may have a vent hole as needed. An embossed film is preferably used as the embossed layer 30. A polymer resin material may be used, for example, for example, as a material of the film. Polyethylene terephthalate (PET), polyethylene naphthalate (PEN), polycarbonate (PC), acrylic resin (PMMA) polyimide (PI), triacetyl cellulose (TAC), polyester, polyamide (PA), aramid, polyethylene (PE), polyacrylate, polyether sulfone, polysulfone, polypropylene (PP), cellulose diacetate, polyvinyl chloride, epoxy resin, urea resin, urethane resin, melamine resin, cyclic olefin polymer (COP), thermoplastic norbornene resin and the like, for example, may be used as the polymer resin material.

(Intermediate Layer)

The intermediate layer 23 is provided with a main body layer 23b of the intermediate layer 23 and an adhesive layer 23c provided on a surface of the main body layer 23b as illustrated in FIG. 3B. The intermediate layer 23 also includes a plurality of holes 23a. The hole 23a is a through-hole penetrating from a surface of the intermediate layer 23 to a rear surface thereof, for example. The hole 23a is provided in a position corresponding to the sensor unit 22s. Also, the hole 23a is located immediately below the structure body 31. With this arrangement, in a case where the key input operation is performed, the apex 31a of the structure body 31 may flip upside-down to enter the hole 23a. The intermediate layer 23 is formed by the screen printing, a shaped film and the like, for example. The intermediate layer 23 and the embossed layer 30 are adhered to each other through the adhesive layer 23c.

(Key Top Layer)

The key top layer 26 has flexibility. Therefore, the key top layer 26 may be deformed together with the REF electrode layer 25 as the operation surface is pressed. A resin film, a flexible metal plate and the like may be used, for example, as the key top layer 26. A plurality of keys 26a is arranged on a surface of the key top layer 26. The key 26a being an example of a pressing unit is provided so as to correspond to the sensor unit 22s. A character, a sign, a function and the like are printed on the key 26a. The information such as the scan code is output from the controller IC 14 to the host 12 when the key 26a is pressed or released.

The structure body 31, the hole 23a, and the sensor unit 22s are provided below the key 26a. That is to say, the key 26a, the structure body 31, the hole 23a, and the sensor unit 22s are overlapped with one another when the sensor 20 is seen in a direction perpendicular to the surface thereof.

(Controller IC)

The controller IC 14 determines which of the gesture and key input operation is performed on the operation surface of the sensor 20 on the basis of the electric signal according to the change in the capacitance supplied from the sensor 20 and outputs the information according to a determination result to the host 12. Specifically, the controller IC 14 having two thresholds A and B performs the above-described determination on the basis of the thresholds A and B. For example, in a case where it is determined that the gesture input operation is performed, this outputs the coordinate information to the host 12. On the other hand, in a case where it is determined that the key input operation is performed, this outputs the information regarding the key such as the scan code to the host 12.

[1.3 Operation of Sensor]

Hereinafter, an example of operation of the sensor 20 at the time of gesture and key input operation is described with reference to FIGS. 11A and 11B.

(Gesture Input Operation)

Figure 11A:
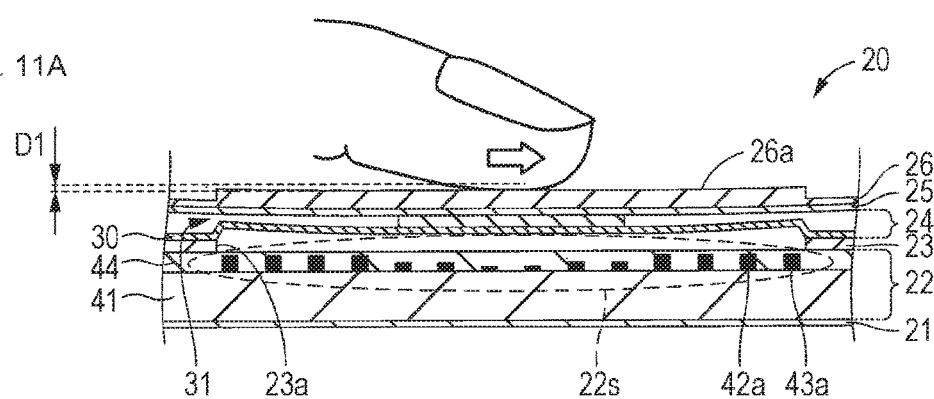
FIG. 11A is a cross-sectional view for illustrating an example of operation of the sensor at the time of gesture input operation.

As illustrated in FIG. 11A, when the gesture input operation is performed on the surface (operation surface) of the sensor 20, the shape of the structure body 31 is slightly deformed to be displaced downward from an initial position by a distance D1. With this arrangement, the distance between the sensor layer 22 and the REF electrode layer 25 slightly changes by D1 and the capacitance slightly changes. The change in the capacitance is detected by the sensor unit 22s in the sensor layer 22 to be output to the controller IC 14 as the electric signal. Herein, the change in the capacitance means the change in the capacitance of an entire sensor unit 22s.

(Key Input Operation)

Figure 11B:
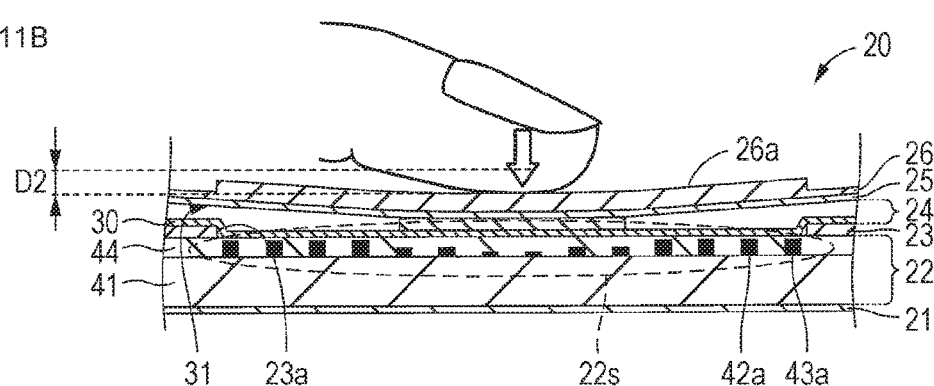
FIG. 11B is a cross-sectional view for illustrating an example of the operation of the sensor at the time of key input operation.

As illustrated in FIG. 11B, when the key 26a of the sensor 20 is pressed to perform the key input operation, the structure body 31 flips upside-down to be displaced from the initial position by a distance D2. With this arrangement, the distance between the sensor layer 22 and the REF electrode layer 25 is significantly change by D2 and the capacitance significantly changes. The change in the capacitance is detected by the sensor unit 22s in the sensor layer 22 to be output to the controller IC 14 as the electric signal.

[1.4 Change in Capacitance by Key Input Operation]

Hereinafter, an example of the change in the capacitance of the sensor 120 at the time of the key input operation is described with reference to FIG. 11C.

In the sensor 20 having the above-described configuration, in a case where a central portion of the key 26a is pressed, the change in the capacitance with respect to the operation load is as indicated by curve (a). That is to say, the change in the capacitance gradually increases as the operation load increases by the pressing, then precipitously increases, and is substantially constant thereafter.

On the other hand, in a case where both the ends (both the ends in the X-axis direction) of the key 26a are pressed, the change in the capacitance with respect to the operation load is as indicated by curve (b). That is to say, the change in the capacitance gradually increases as the operation load increases by the pressing and is substantially constant thereafter.

The controller IC 14 stores two thresholds which are the threshold A and the threshold B larger than the same. The threshold A is set within a capacitance changing range $R_A$ in which the curve (a) initially gradually increases with respect to the increase in the operation load, for example. On the other hand, the threshold B is set within a capacitance changing range $R_B$ in which curve (a) precipitously increases with respect to the increase in the operation load and curve (b) gradually increases with respect to the increase in the operation load, for example. The controller IC 14 may determine whether the gesture operation is performed on the operation surface by determining whether the change in the capacitance is larger than the threshold A on the basis of the electric signal according to the change in the capacitance supplied from the sensor 20. Also, the controller IC 14 may determine whether the key input operation is performed on the operation surface by determining whether the capacitance is larger than the threshold B on the basis of the electric signal according to the change in the capacitance supplied from the sensor 20.

[1.5 Operation of Controller IC]

Figure 12:
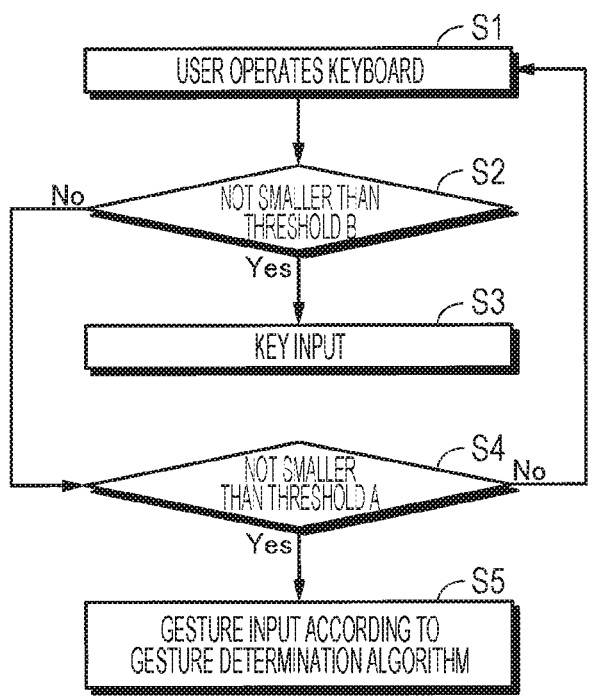
FIG. 12 is a flowchart for illustrating an example of operation of a controller IC.

Hereinafter, an example of operation of the controller IC 14 is described with reference to FIG. 12.

First, when the input operation is performed on the operation surface of the keyboard 11 by a user at step S1, the controller IC 14 determines whether the change in the capacitance of an entire sensor unit 22s is not smaller than the threshold B on the basis of the electric signal according to the change in the capacitance supplied from the sensor 20 at step S2. In a case where it is determined that the change in the capacitance is not smaller than the threshold B at step S2, the controller IC 14 outputs the information regarding the key such as the scan code to the host 12 at step S3. With this arrangement, the key input is performed. On the other hand, in a case where it is determined that the change in the capacitance is not larger than the threshold B at step S2, the procedure shifts to step S4.

Next, the controller IC 14 determines whether the change in the capacitance of an entire sensor unit 22s is not smaller than the threshold A on the basis of the electric signal according to the change in the capacitance supplied from the sensor 20 at step S4. In a case where it is determined that the change in the capacitance is not smaller than the threshold A at step S4, the controller IC 14 operates according to gesture determination algorithm at step S5. With this arrangement, the gesture input is performed. On the other hand, in a case where it is determined that the change in the capacitance is not larger than the threshold A at step S4, the procedure shifts to step S1.

[1.6 Effect]

In the sensor 20 according to the first embodiment, the sensitivity of the capacitor Cp on both the ends of the sensor unit 22s is higher than the sensitivity of the capacitor Cp in the central portion of the sensor unit 22s. Therefore, the sensitivity on both the ends of the sensor unit 22s is higher than the sensitivity of the central portion of the sensor unit 22s. Therefore, it is possible to decrease variation in operating load when the central portion and both the ends of the key 26a are pressed. Also, it is possible to decrease variation in operating load due to difference in object which presses the key 26a.

Figure 11C:
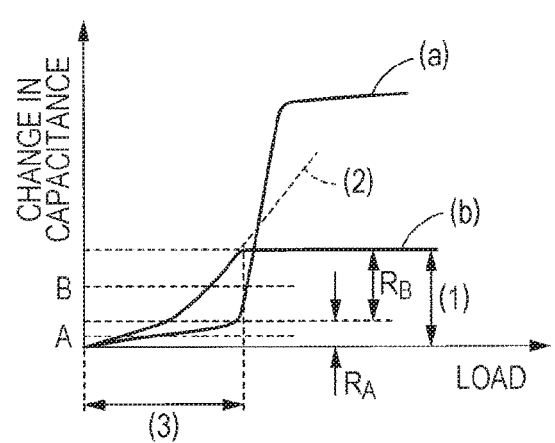
FIG. 11C is a graph illustrating an example of change in capacitance with respect to an operation load.

Since the sensitivity of the capacitor Cp is changed as described above in the sensor 20 according to the first embodiment, it is possible to make the change in the capacitance (inclination) with respect to the load when the load is applied to the end of the key 26a with a nail and the like large (refer to inclination (2) in FIG. 11C). It is also possible to make the load with which the change in the capacitance is saturated when the load is applied to the end of the key 26a with the nail and the like large (refer to range (3) in FIG. 11C). Also, the change in the capacitance which is saturated may be similarly made larger (refer to range (1) in FIG. 11C).

[1.7 Variation]

(Variation 1)

Figure 13:
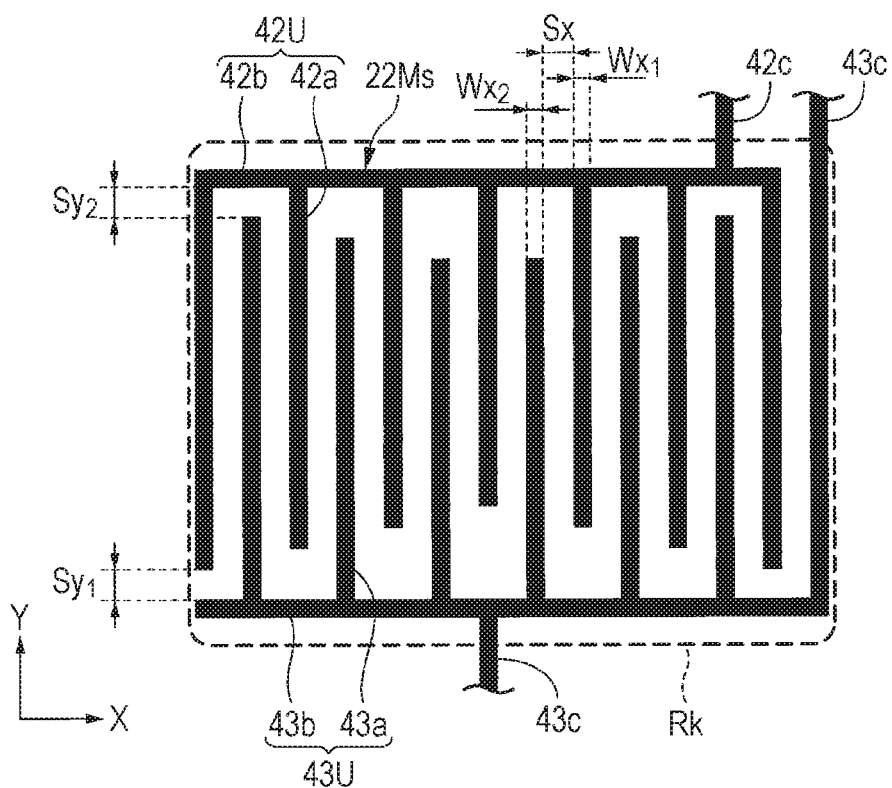
FIG. 13 is a planar view illustrating an example of a configuration of a sensor unit included in a sensor according to a variation 1 of the first embodiment of the present technology.

As illustrated in FIG. 13, it is possible to make clearance widths $Sy_1$ and $Sy_2$ between first and second electrode elements and a joint part on both ends (both ends in an X-axis direction) of a sensor unit 22Ms smaller than the clearance width $Sy_1$ and $Sy_2$ between the first and second electrode elements and the joint part in a central portion (central portion in the X-axis direction) of the sensor unit 22Ms. In this case, the clearance widths $Sy_1$ and $Sy_2$ between the first and second electrode elements and the joint part preferably gradually decrease from the central portion of the sensor unit 22Ms toward both the ends thereof. That is to say, it is possible that lengths of first and second electrode elements 42a and 43a on both the ends (both the ends in the X-axis direction) of the sensor unit 22Ms are longer than the lengths of the first and second electrode elements 42a and 43a in the central portion (central portion in the X-axis direction) of the sensor unit 22Ms. In this case, the lengths of the first and second electrode elements 42a and 43a preferably gradually increase from the central portion of the sensor unit 22Ms toward both the ends thereof.

It is possible to give the sensor unit 22Ms change in sensitivity distribution in two directions which are the X-axis direction and a Y-axis direction by adopting such a configuration. Meanwhile, a configuration in a variation 1 may also be combined at least one of the configuration examples 1 to 4 in the above-described first embodiment.

(Variation 2)

Figure 14:
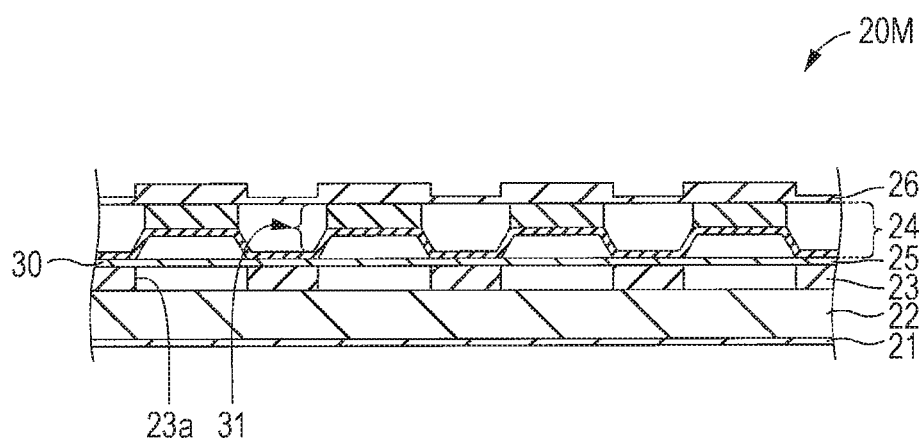
FIG. 14 is a cross-sectional view illustrating an example of a configuration of a sensor according to a variation 2 of the first embodiment of the present technology.

As illustrated in FIG. 14, a sensor 20M according to a variation 2 of the first embodiment is different from the sensor 20 according to the first embodiment in including a REF electrode layer 25 not between a structure layer 24 and a key top layer 26 but between an intermediate layer 23 and the structure layer 24.

The sensor 20 according to the first embodiment is required to regulate a gap between the sensor layer 22 and the REF electrode layer 25 in terms of process in order to make a distance between the sensor layer 22 and the REF electrode layer 25 constant. On the other hand, in the sensor 20M according to the variation 2 of the first embodiment, it is only required to adhere the REF electrode layer 25 to the intermediate layer 23, so that the above-described gap regulation is not required and a process of manufacturing the sensor 20M is easy.

<2 Second Embodiment>

A case where the sensor has the one-dimensional sensitivity distribution from the central portion of the sensor unit toward both the ends thereof is described in the first embodiment. On the other hand, a case where a sensor has two-dimensional sensitivity distribution from a central portion of a sensor unit toward a peripheral end thereof is described in a second embodiment.

[2.1 Configuration of Sensor]

(First and Second Electrodes)

Figure 15A:
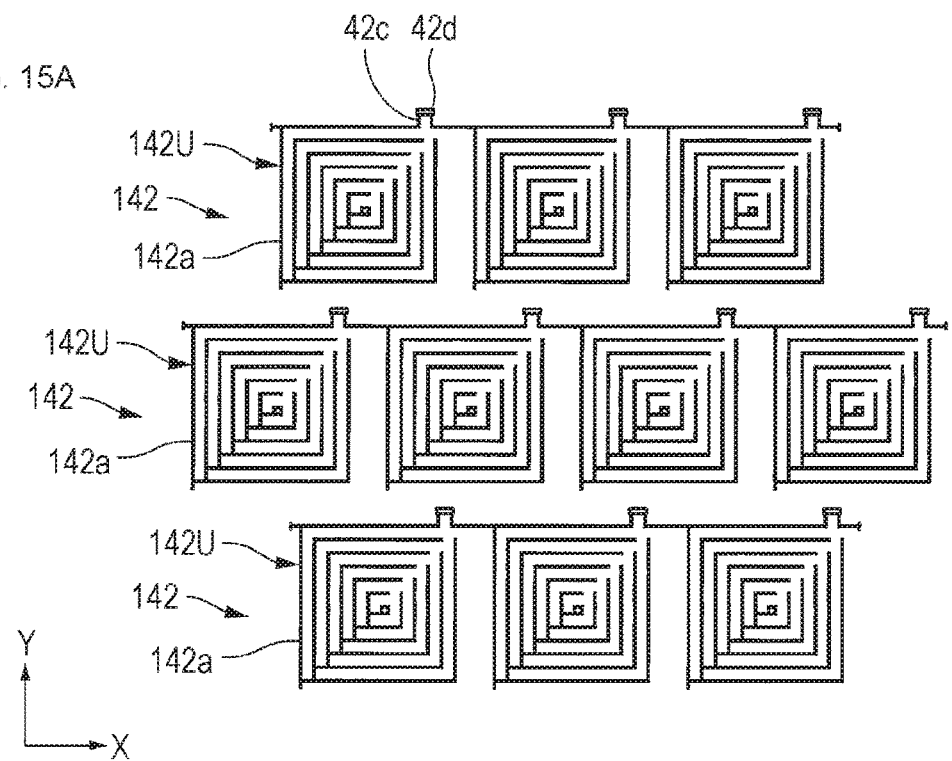
FIG. 15A is a planar view illustrating an example of a configuration of a first electrode.
Figure 15B:
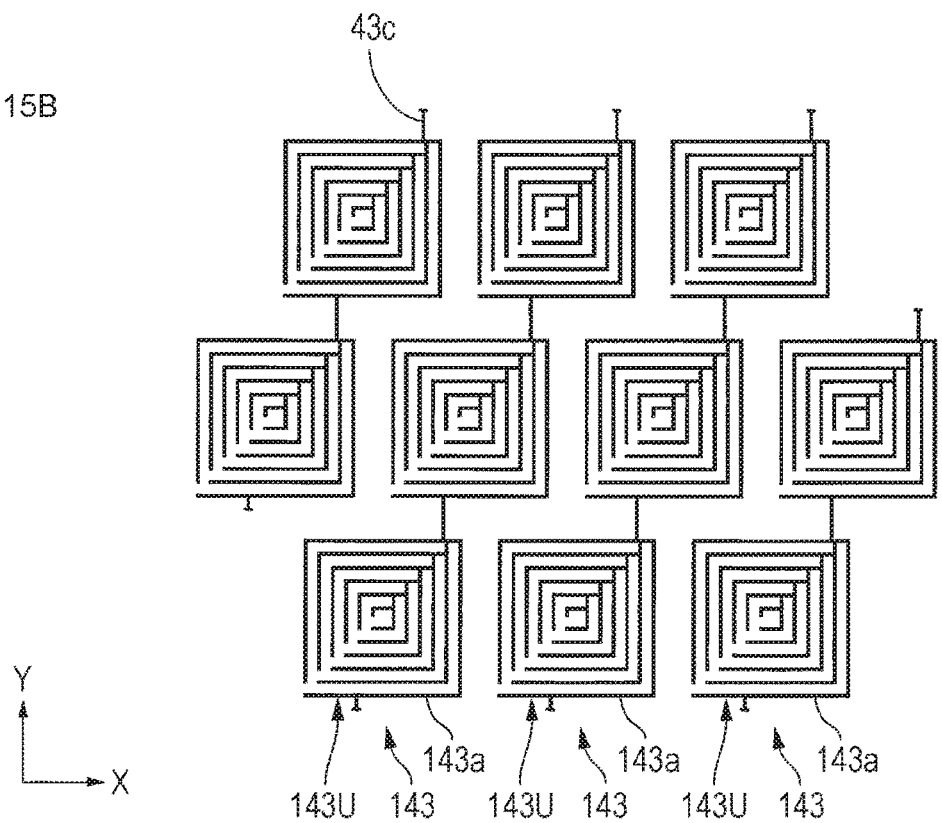
FIG. 15B is a planar view illustrating an example of a configuration of a second electrode.

A first electrode 142 is provided with a first unit electrode body 142U formed of first electrode elements 142a having concentric rectangular shapes as illustrated in FIG. 15A. A second electrode 143 is provided with a second unit electrode body 143U formed of second electrode elements 143a having concentric rectangular shapes as illustrated in FIG. 15B. Meanwhile, in the second embodiment, a portion identical to that in the first embodiment is assigned with the same reference sign and the description thereof is omitted.

Figure 16:
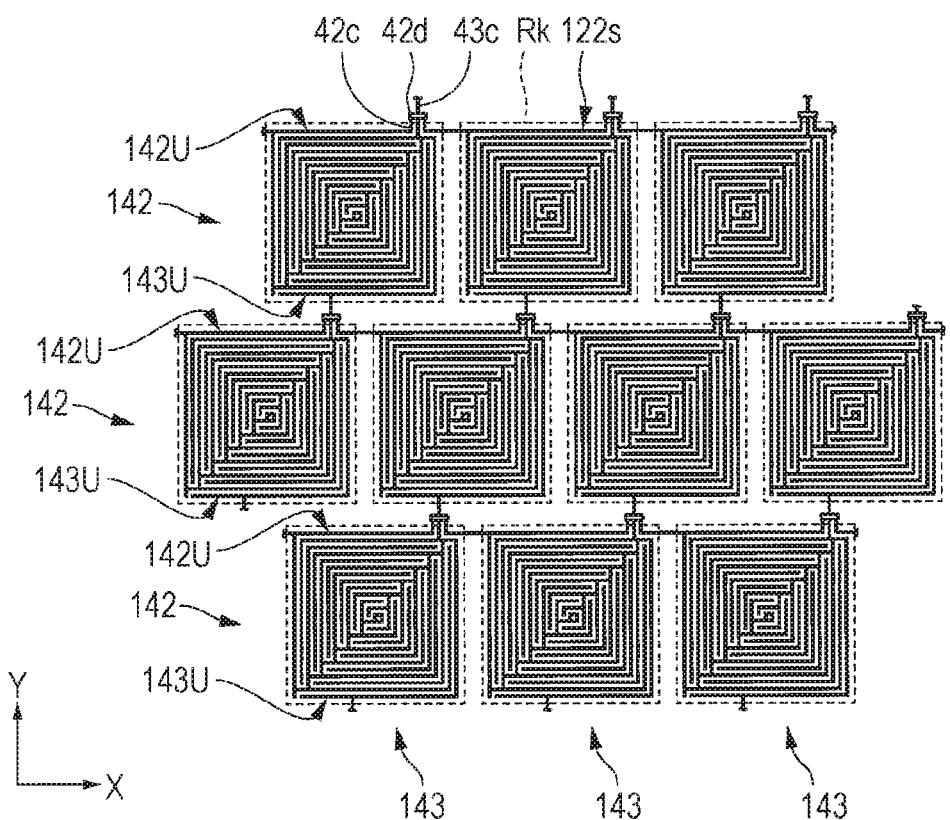
FIG. 16 is a planar view illustrating an example of a configuration and arrangement of a sensor unit.
Figure 17A:
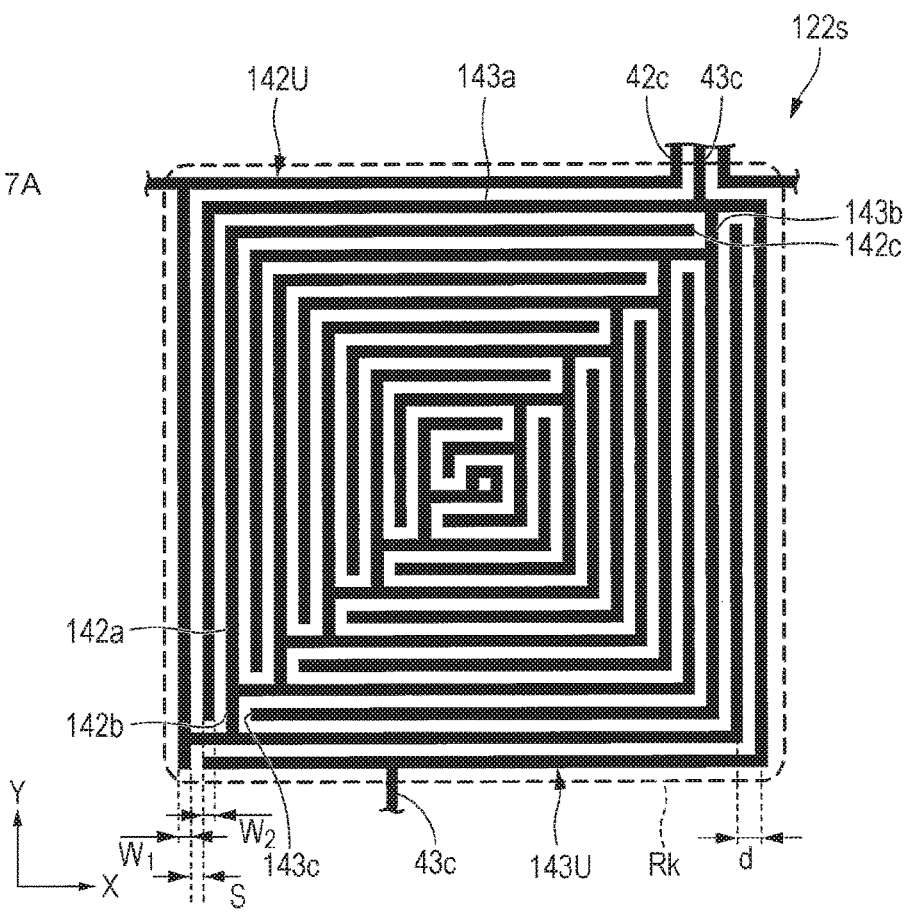
FIG. 17A is a planar view illustrating an example of the configuration of the sensor unit.
Figure 17B:
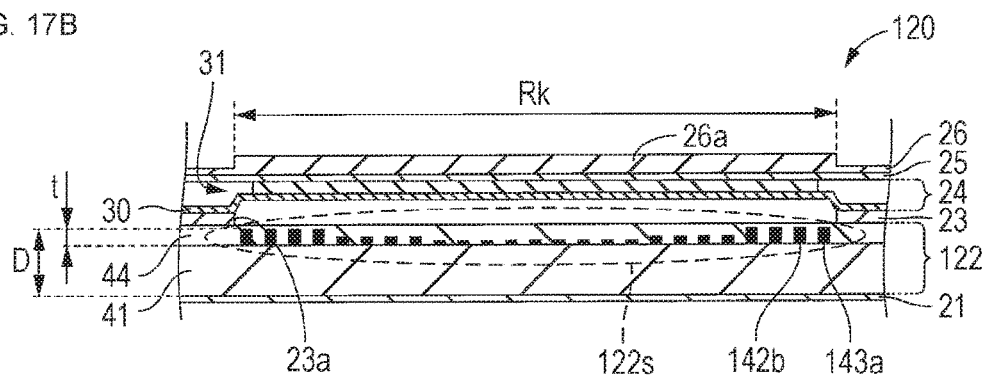
FIG. 17B is a cross-sectional view illustrating an example of a configuration of a sensor layer.

As illustrated in FIG. 16, sensor units 122s are arranged on a base material 41 in a two-dimensional manner. Each sensor unit 122s is formed of a pair of first and second unit electrode bodies 142U and 143U. As illustrated in FIGS. 17A and 17B, a plurality of first electrode elements 142a included in the first unit electrode 142U and a plurality of second electrode elements 143a included in the second unit electrode body 143U are alternately arranged from a center of the sensor unit 122s toward an outer periphery thereof.

A part of the rectangular first electrode element 142a lacks to form a lacking part 142c. The adjacent second electrode elements 143a are connected to each other by a second connection 143b through the lacking part 142c. Similarly, a part of the rectangular second electrode element 143a lacks to forma lacking part 143c. The adjacent first electrode elements 142a are connected to each other by a first connection 142b through the lacking part 143c.

(Sensitivity Distribution)

Figure 18A:
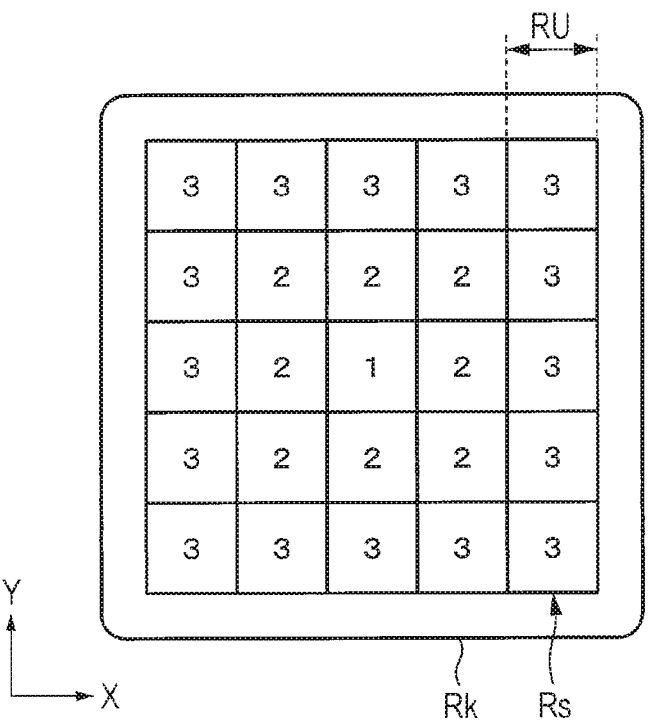
FIG. 18A is a schematic diagram illustrating an example of sensitivity distribution of a sensor region.
Figure 18B:
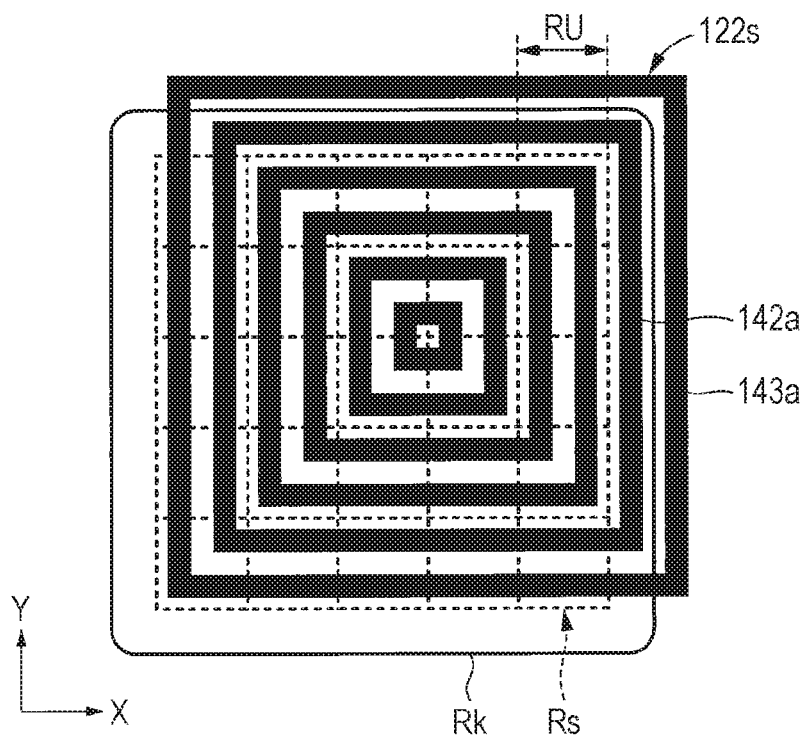
FIG. 18B is a schematic diagram illustrating an example of arrangement of first and second electrode elements in the sensor region illustrated in FIG. 18A.

A rectangular sensor region Rs is evenly divided in a lattice pattern by a plurality of rectangular unit regions RU as illustrated in FIG. 18A and it may be considered that a part of a pair of capacitively coupled first and second electrode elements 142a and 143a is arranged as illustrated in FIG. 18B in each divided unit region RU. By considering in this manner, it is possible to consider that a capacitor Cp having capacitance C is arranged in each unit region RU. That is to say, it may be considered that a plurality of capacitors Cp is arranged in a two-dimensional manner in a matrix pattern in the rectangular sensor region Rs. It is divided by not less than nine unit regions RU and not more than 210 unit regions RU, for example. Meanwhile, although the capacitive coupling is generated and the capacitor Cp is formed between all the first and second electrode elements 142a and 143a actually, an example in which the capacitive coupling is generated and the capacitor Cp is formed only between a pair of two adjacent first and second electrode elements 142a and 143a is illustrated in FIGS. 18A and 18B for simplifying illustration and description.

Meanwhile, FIG. 18A illustrates an example in which the rectangular sensor region Rs is evenly divided in a lattice pattern by 25 rectangular unit regions RU and the capacitor Cp is arranged in each unit region. Numerical values 1 to 3 assigned to the unit regions RU indicate the sensitivities of the capacitors Cp arranged in the unit regions RU; the larger the numerical value, the higher the sensitivity. As illustrated in FIG. 18B, centers of the sensor unit 122s and a key region Rk may be displaced in a direction perpendicular to a surface of a sensor 120.

The sensor region Rs has the two-dimensional sensitivity distribution in which the sensitivity changes from the central portion of the sensor unit 122s toward both the ends thereof. Specifically, this has the following sensitivity distribution. That is to say, the sensitivity of the capacitor Cp on the peripheral end of the sensor unit 122s is higher than the sensitivity of the capacitor Cp in the central portion of the sensor unit 122s. In this case, the sensitivity of the capacitor Cp preferably gradually increases from the central portion of the sensor unit 122s toward the peripheral end thereof. Due to such a configuration, the sensitivity on the peripheral end of the sensor unit 122s is higher than the sensitivity in the central portion of the sensor unit 122s. The sensitivity of the sensor unit 122s preferably gradually increases from the central portion of the sensor unit 122s toward the peripheral end thereof.

(Configuration Example of Sensor Layer Having Sensitivity Distribution)

Configuration examples 1 to 4 of the sensor layer 122 for obtaining the above-described sensitivity distribution are hereinafter sequentially described. Meanwhile, it is also possible to adopt combination of two or more configuration examples of the configuration examples 1 to 4 to be described hereinafter.

(Configuration Example 1)

Thicknesses t of the first and second electrode elements 142a and 143a on the peripheral end of the sensor unit 122s are larger than the thicknesses t of the first and second electrode elements 142a and 143a in the central portion of the sensor unit 122s, respectively. In this case, the thicknesses t of the first and second electrode elements 142a and 143a preferably gradually increase from the central portion in the sensor unit 122s toward the peripheral end thereof. In FIG. 17B, the sensor layer 122 having the configuration example 1 is illustrated.

(Configuration Example 2)

A thickness D of the sensor layer 122 on the peripheral end of the sensor unit 122s is larger than the thickness of the sensor layer 122 in the central portion of the sensor unit 122s. In this case, the thickness D of the sensor layer 122 preferably gradually increases from the central portion of the sensor unit 122s toward the peripheral end thereof. At least one of a surface and a rear surface of the sensor layer 122 has an inclined surface or a step which becomes higher from the central portion of the sensor unit 122s toward the peripheral end thereof, for example. Since a thickness of at least one of an insulating layer 44 and the base material 41 increases from the central portion of the sensor unit 122s toward the peripheral end thereof, the thickness D of the sensor layer 122 changes in the above-described manner.

(Configuration Example 3)

Permittivity of the sensor layer 122 on the peripheral end of the sensor unit 122s is larger than that of the sensor layer 122 in the central portion of the sensor unit 122s. In this case, the permittivity of the sensor layer 122 preferably gradually increases from the central portion of the sensor unit 122s toward the peripheral end thereof.

(Configuration Example 4)

An arrangement interval d between the capacitively coupled first and second electrode elements 142a and 143a on the peripheral end of the sensor unit 122s is narrower than the arrangement interval d between the capacitively coupled first and second electrode elements 142a and 143a in the central portion of the sensor unit 122s. In this case, the arrangement interval d between the first and second electrode elements 142a and 143a preferably gradually decreases from the central portion of the sensor unit 122s toward the peripheral end thereof.

[2.2 Effect]

In the sensor 120 according to the second embodiment, the sensitivity of the capacitor Cp on the peripheral end of the sensor unit 122s is higher than the sensitivity of the capacitor Cp in the central portion of the sensor unit 122s. Therefore, the sensitivity on the peripheral end of the sensor unit 122s is higher than the sensitivity in the central portion of the sensor unit 122s. Therefore, it is possible to decrease variation in operating load when the central portion and the peripheral end of the key 26a are pressed. Also, it is possible to decrease variation in operating load due to difference in object which presses the key 26a.

[2.3 Variation]

(Variation 1)

Figure 19A:
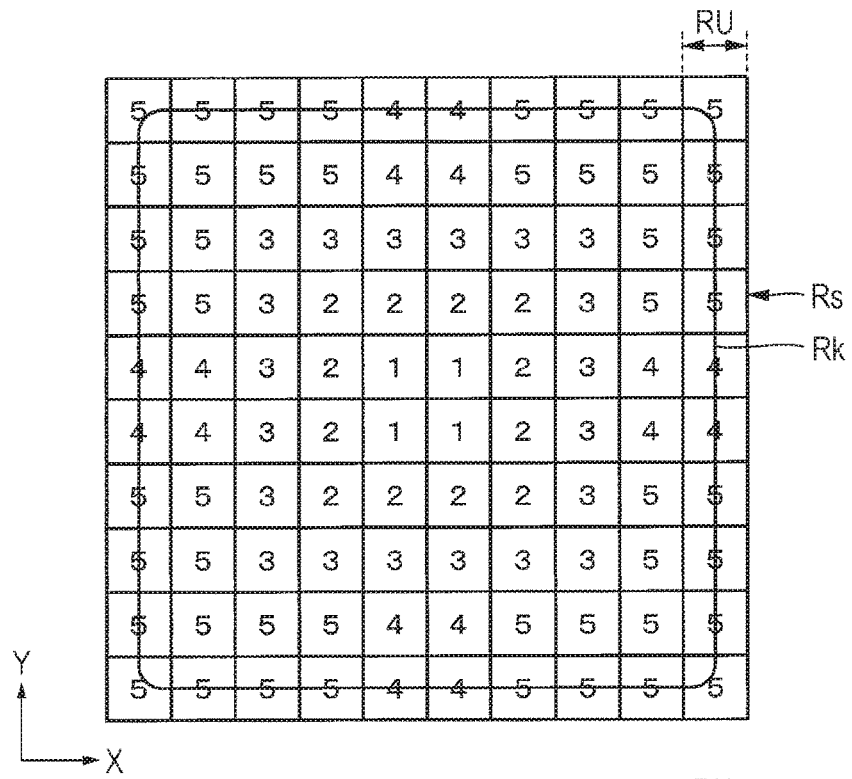
FIG. 19A is a schematic diagram illustrating an example of sensitivity distribution of a sensor region.

FIG. 19A illustrates an example in which a rectangular sensor region Rs is evenly divided in a lattice pattern by 50 rectangular unit regions RU and a capacitor Cp is arranged in each unit region. Numerical values 1 to 5 assigned to the unit regions RU indicate sensitivities of the capacitors Cp arranged in the unit regions RU; the larger the numerical value, the higher the sensitivity. Centers of a sensor unit 122s and a key region Rk are coincident as seen in a direction perpendicular to a surface of a sensor 120.

Figure 19B:
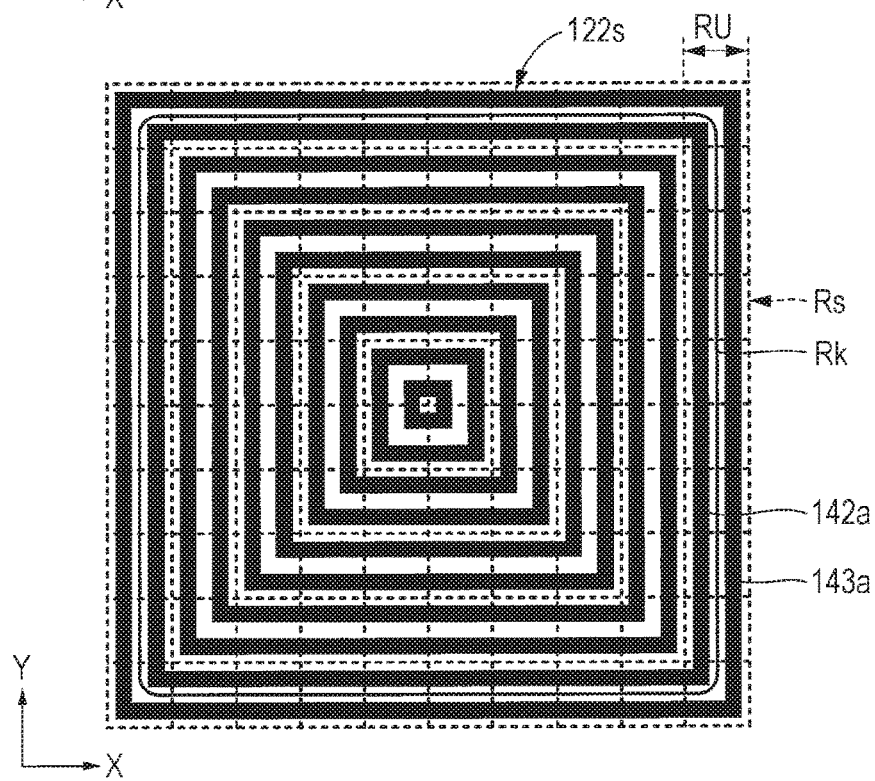
FIG. 19B is a schematic diagram illustrating an example of arrangement of first and second electrode elements in the sensor region illustrated in FIG. 19A.

As illustrated in FIG. 19A, the sensitivity of the capacitor Cp arranged on a corner of the rectangular sensor region Rs is the highest and a corner of the sensor unit 122s, that is to say, a corner of the key region Rk has the highest sensitivity in the sensor unit 122s. A part of a pair of capacitively coupled first and second electrode elements 142a and 143a is arranged in each divided unit region RU as illustrated in FIG. 19B. It is preferable that the sensor unit 122s is larger than a key 26a, and an outer periphery of the sensor unit 122s is arranged outside the key region Rk as seen in the direction perpendicular to the surface of the sensor 20. This is because the sensitivity of a peripheral end of the key 26a may be improved.

Configuration examples 1 to 5 of the sensor layer 122 for obtaining the above-described sensitivity distribution are sequentially described. Meanwhile, it is also possible to adopt combination of two or more configuration examples of the configuration examples 1 to 5 to be described hereinafter.

(Configuration Example 1)

Thicknesses t of the first and second electrode elements 142a and 143a on the corner of the sensor unit 122s are the largest in the sensor unit 122s.

(Configuration Example 2)

A thicknesses D of a sensor layer 122 on the corner of the sensor unit 122s is the largest in the sensor unit 122s. Specifically, a thickness of at least one of an insulating layer 44 and a base material 41 on the corner of the sensor unit 122s is the largest in the sensor unit 122s.

(Configuration Example 3)

Permittivity of the sensor layer 22 on the corner of the sensor unit 122s is the largest in the sensor unit 122s.

(Configuration Example 4)

A clearance width S between the capacitively coupled first and second electrode elements 142a and 143a on the corner of the sensor unit 122s is the smallest in the sensor unit 122s.

(Configuration Example 5)

Widths $W_1$ and $W_2$ of the first and second electrode elements 142a and 143a on the corner of the sensor unit 122s are the smallest in the sensor unit 122s.

(Variation 2)

Figure 20:
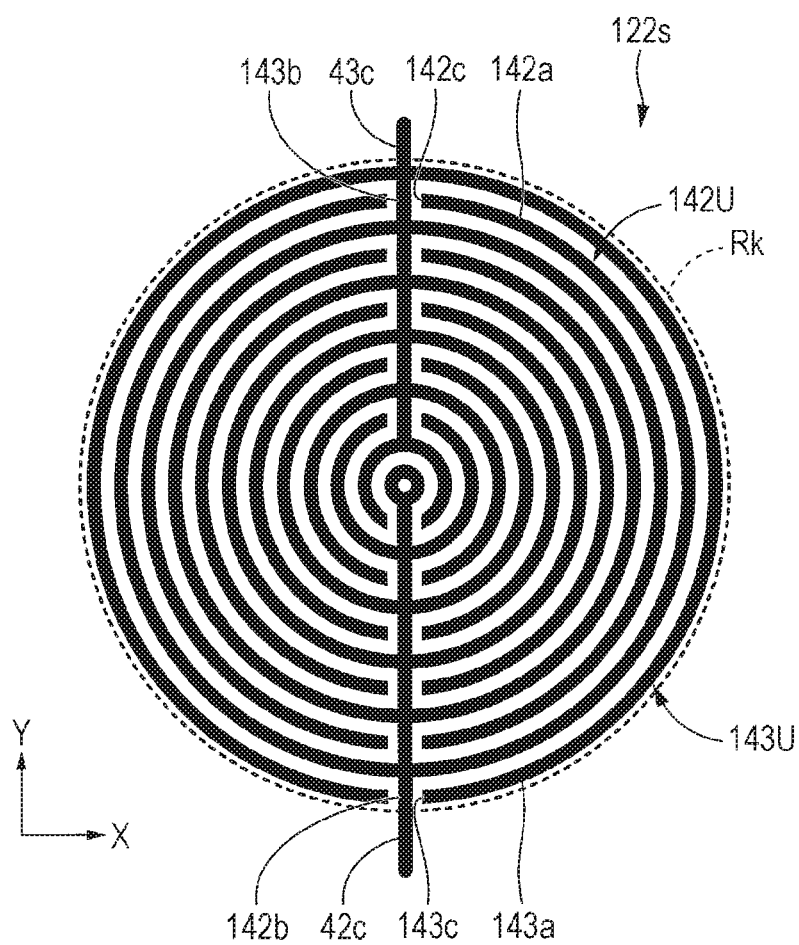
FIG. 20 is a planar view illustrating an example of a configuration of a sensor unit.
Figure 21A:
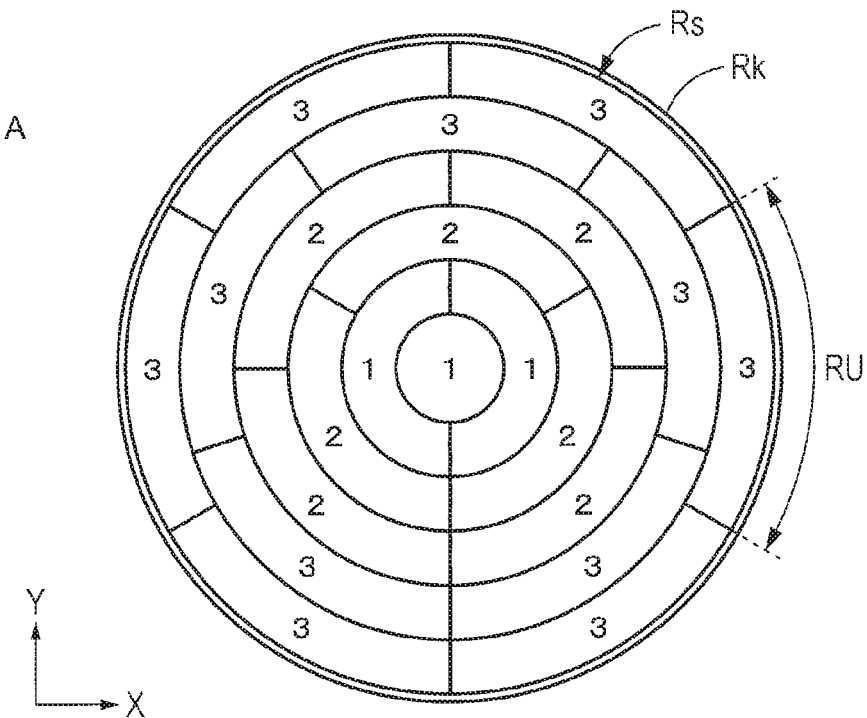
FIG. 21A is a schematic diagram illustrating an example of sensitivity distribution of a sensor region.
Figure 21B:
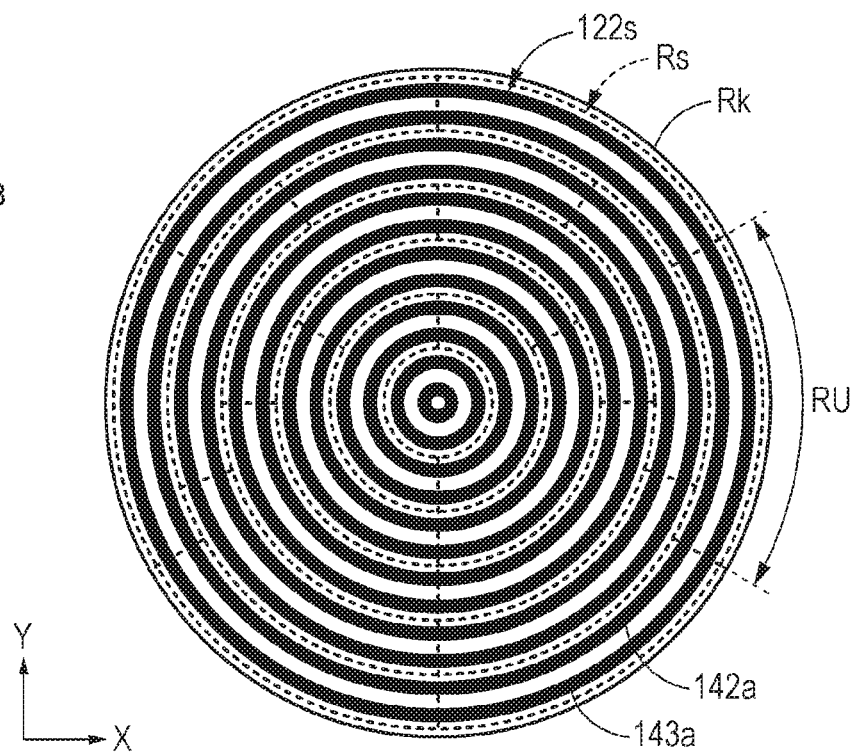
FIG. 21B is a schematic diagram illustrating an example of arrangement of first and second electrode elements in the sensor region illustrated in FIG. 21A.

As illustrated in FIG. 20, the first and second electrode elements 142a and 143a may have concentric circular shapes. The first and second electrode elements 142a and 143a having such shapes are preferably used in the sensor 120 including circular key region Rk and sensor region Rs as illustrated in FIGS. 21A and 21B.

<3 Third Embodiment>

The example in which the sensitivity on both the ends of the sensor unit is made higher than the sensitivity of the central portion by adjusting the sensitivity of the capacitor is described in the first embodiment. On the other hand, an example in which sensitivity on both ends of a sensor unit is made higher than the sensitivity of a central portion by adjusting arrangement of a capacitor is described in a third embodiment.

[3.1 Configuration of Sensor]

Figure 22A:
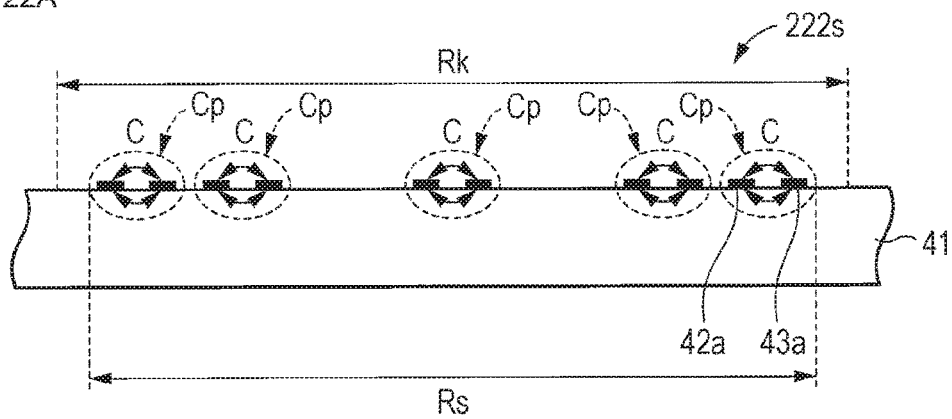
FIG. 22A is a schematic diagram illustrating an example of a configuration of a sensor layer.

As illustrated in FIG. 22A, density of capacitors Cp on both ends of a sensor region 22Rs is higher than the density of the capacitors Cp in a central portion of the sensor region 22Rs. In this case, the density of the capacitors Cp preferably gradually increases from the central portion of the sensor region 22Rs toward both the ends thereof. Capacitance C of each capacitor Cp included in the sensor region 22Rs is set to be identical. Meanwhile, although capacitive coupling is generated and the capacitor Cp is formed between all of first and second electrode elements 42a and 43a actually, an example in which it is considered that the capacitive coupling is generated and the capacitor Cp is formed only between a pair of two adjacent first and second electrode elements 42a and 43a is illustrated in FIGS. 22A and 22B for simplifying illustration and description.

Figure 22B:
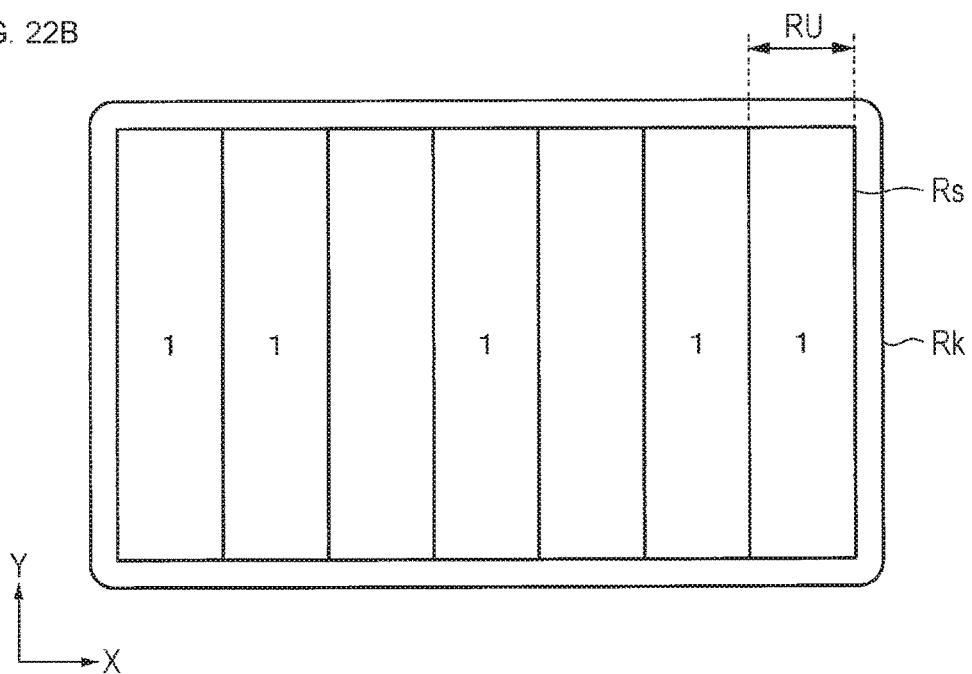
FIG. 22B is a schematic diagram illustrating an example of sensitivity distribution of a sensor region.

A rectangular sensor region Rs is evenly divided in a stripe pattern by a plurality of rectangular unit regions RU as illustrated in FIG. 22B and it may be considered that the capacitor Cp is arranged in the unit region RU with a numerical value assigned out of a plurality of divided unit regions RU. The numerical value assigned to the unit region RU indicates the sensitivity of each unit region RU; the larger the numerical value, the higher the sensitivity. In FIG. 22B, an example in which the sensitivity of all the unit regions RU in which the capacitor Cp is arranged is "1" is illustrated. Herein, the capacitor Cp is formed of a pair of capacitively coupled first and second electrode elements 42a and 43a as described above.

Figure 23A:
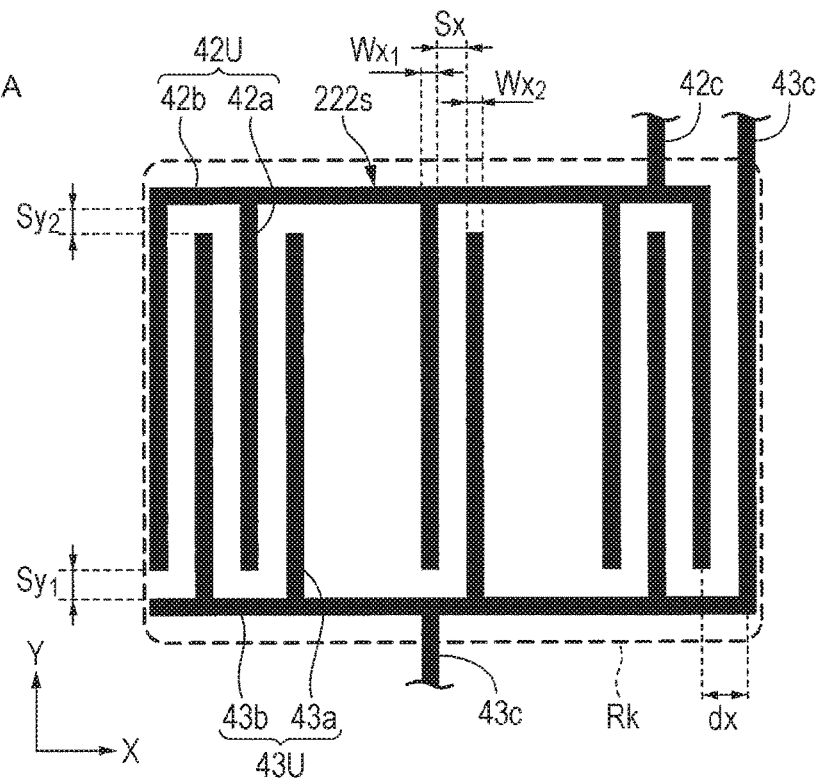
FIG. 23A is a planar view illustrating an example of a configuration of a sensor unit.
Figure 23B:
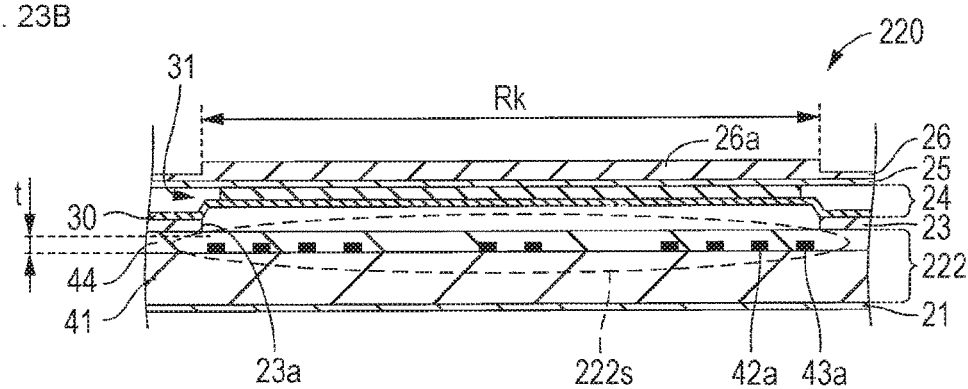
FIG. 23B is a cross-sectional view illustrating an example of the configuration of the sensor layer.

As illustrated in FIGS. 23A and 23B, in a sensor 220 according to the third embodiment, electrode density of the first and second electrode elements 42a and 43a on both ends (both ends in an X-axis direction) of a sensor unit 222s is higher than the electrode density of the first and second electrode elements 42a and 43a in a central portion of the sensor unit 222s. In this case, the electrode density of the first and second electrode elements 42a and 43a preferably gradually increases from the central portion of the sensor unit 222s toward both the ends (both the ends in the X-axis direction) thereof. An arrangement interval dx between the capacitively coupled first and second electrode elements 42a and 43a is set to be constant from the central portion of the sensor unit 222s to both the ends thereof. Herein, the arrangement interval d is intended to mean a distance between center lines of the first and second electrode elements 42a and 43a.

[3.2 Effect]

In the sensor 220 according to the third embodiment, density of the capacitors Cp on both the ends of the sensor unit 222s (that is to say, the electrode density of the capacitively coupled first and second electrode elements 42a and 43a) is higher than the density of the capacitors Cp in the central portion of the sensor unit 222s. Therefore, sensitivity on both the ends of the sensor unit 222s is higher than the sensitivity in the central portion of the sensor unit 222s. Therefore, it is possible to decrease variation in operating load when the central portion and both the ends of the key 26a are pressed. Also, it is possible to decrease variation in operating load due to difference in object which presses the key 26a.

Since the density of the capacitors Cp is changed as described above in the sensor 220 according to the third embodiment, it is possible to make absolute change in capacitance when a load is applied to the end of the key 26a with a nail and the like large (refer to range (1) in FIG. 11C).

<4 Fourth Embodiment>

The example in which the sensitivity on the peripheral end of the sensor unit is made higher than the sensitivity in the central portion by changing the sensitivity of the capacitor is described in the second embodiment. On the other hand, an example in which sensitivity on a peripheral end of a sensor unit is made higher than the sensitivity in a central portion by arrangement of a capacitor is described in a fourth embodiment.

[4.1 Configuration of Sensor]

Figure 24A:
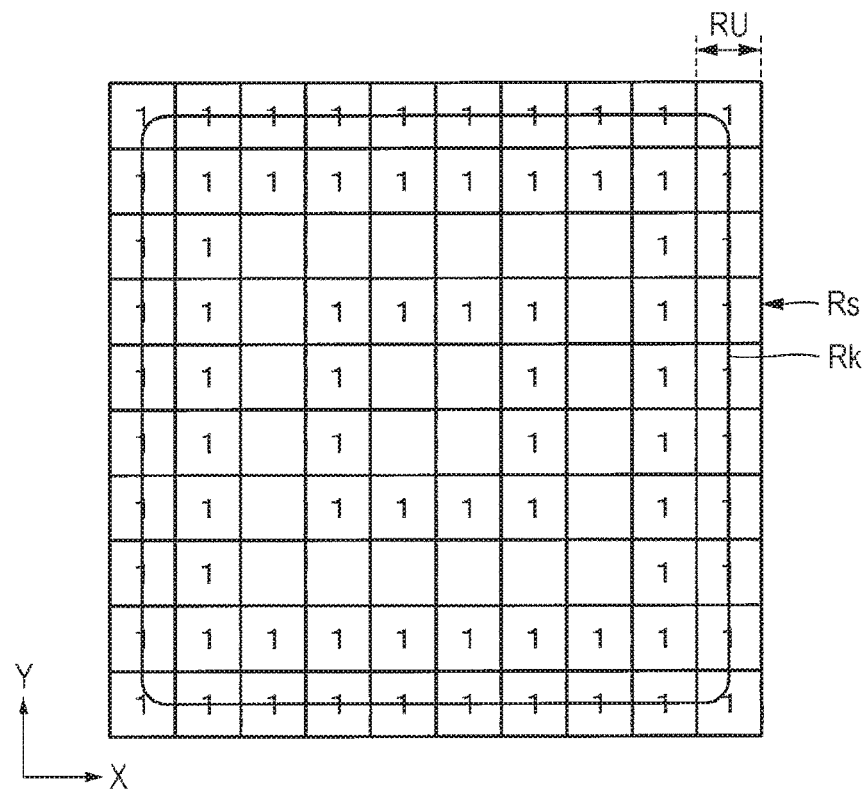
FIG. 24A is a schematic diagram illustrating an example of sensitivity distribution of a sensor region.
Figure 24B:
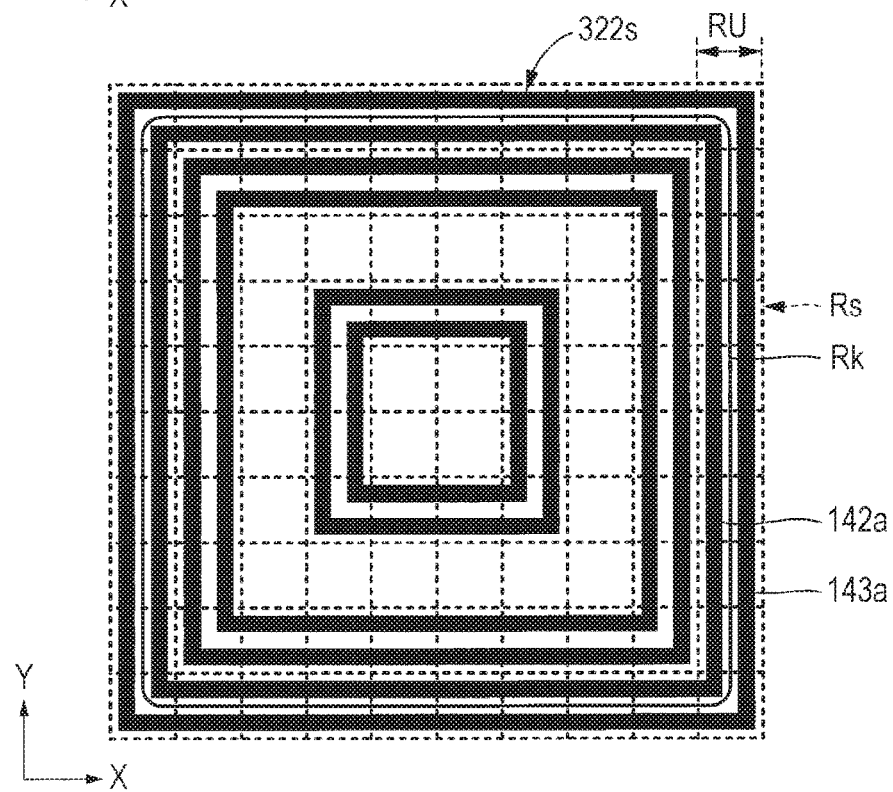
FIG. 24B is a schematic diagram illustrating an example of arrangement of first and second electrode elements in the sensor region illustrated in FIG. 24A.

A rectangular sensor region Rs is evenly divided in a lattice pattern by a plurality of rectangular unit regions RU as illustrated in FIG. 24A and it may be considered that a capacitor Cp is arranged in the unit region RU with a numerical value assigned out of a plurality of divided unit regions RU. The numerical value assigned to the unit region RU indicates the sensitivity of each unit region RU; the larger the numerical value, the higher the sensitivity. In FIG. 24A, an example in which the sensitivity of all the unit regions RU in which the capacitor Cp is arranged is "1" is illustrated. Herein, the capacitor Cp is formed of a part of a pair of capacitively coupled first and second electrode elements 142a and 143a as illustrated in FIG. 24B. Meanwhile, although capacitive coupling is generated and the capacitor Cp is formed between all the first and second electrode elements 142a and 143a actually, an example in which it is considered that the capacitive coupling is generated and the capacitor Cp is formed only between a pair of two adjacent first and second electrode elements 142a and 143a is illustrated in FIGS. 24A and 24B for simplifying illustration and description.

As illustrated in FIGS. 24A and 24B, density of the capacitors Cp on a peripheral end of a sensor region 22Rs is higher than the density of the capacitors Cp in a central portion of the sensor region 22Rs. In this case, the density of the capacitors Cp preferably gradually increases from the central portion of the sensor region 22Rs toward the peripheral end thereof. Capacitance C of each capacitor Cp included in the sensor region 22Rs is set to be identical.

Figure 25A:
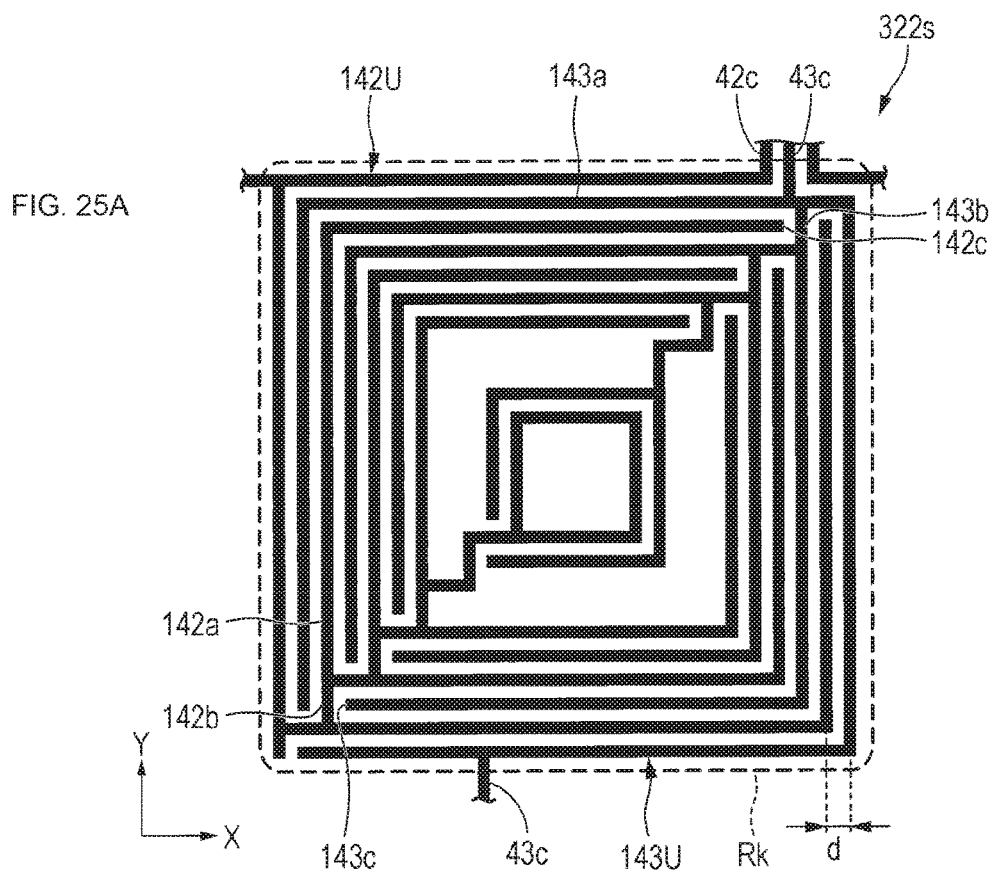
FIG. 25A is a planar view illustrating an example of a configuration of a sensor unit.
Figure 25B:
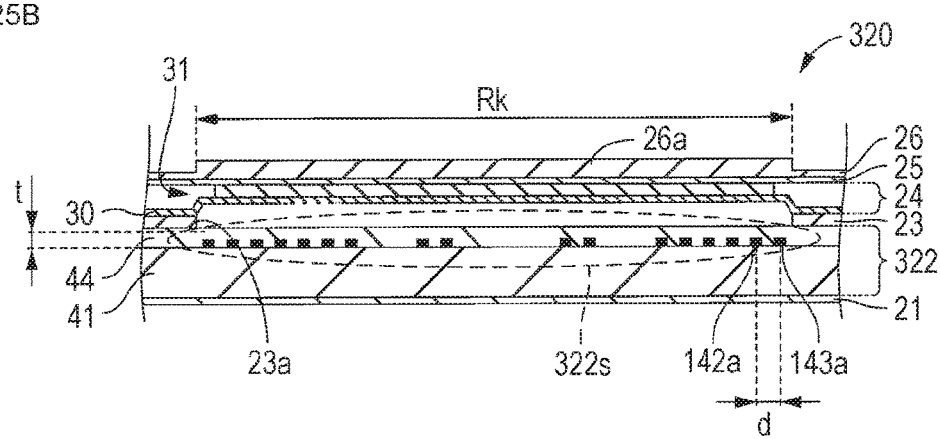
FIG. 25B is a cross-sectional view illustrating an example of a configuration of a sensor layer.

As illustrated in FIGS. 25A and 25B, electrode density of the first and second electrode elements 142a and 143a on a peripheral end of a sensor unit 322s is higher than the electrode density of the first and second electrode elements 142a and 143a in a central portion of the sensor unit 322s. In this case, the electrode density of the first and second electrode elements 142a and 143a preferably gradually increases from the central portion of the sensor unit 322s toward the peripheral end thereof. An arrangement interval d between the capacitively coupled first and second electrode elements 142a and 143a is set to be constant from the central portion of the sensor unit 322s to the peripheral end thereof.

[4.2 Effect]

In a sensor 320 according to the fourth embodiment, the density of the capacitors Cp on the peripheral end of the sensor unit 322s (that is to say, the electrode density of the capacitively coupled first and second electrode elements 142a and 143a) is higher than the density of the capacitors Cp in the central portion of the sensor unit 322s. Therefore, the sensitivity on the peripheral end of the sensor unit 322s is higher than the sensitivity in the central portion of the sensor unit 322s. Therefore, it is possible to decrease variation in operating load when the central portion and both the ends of the key 26a are pressed. Also, it is possible to decrease variation in operating load due to difference in object which presses the key 26a.

<5 Fifth Embodiment>

An example in which sensitivity on both ends of a sensor unit is made higher than the sensitivity of a central portion by adjusting both arrangement and sensitivity of a capacitor is described in a fifth embodiment.

[5.1 Configuration of Sensor]

Figure 26A:
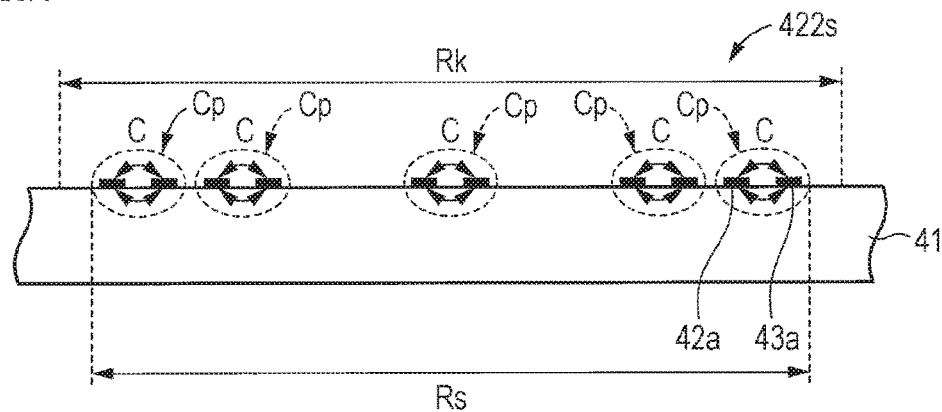
FIG. 26A is a schematic diagram illustrating an example of a configuration of a sensor layer.
Figure 26B:
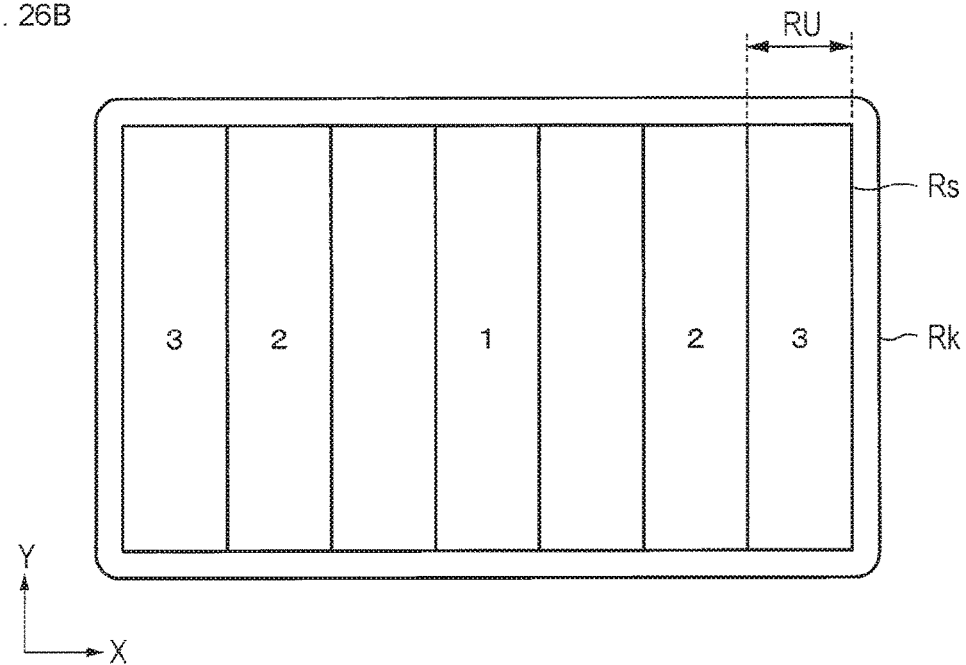
FIG. 26B is a schematic diagram illustrating an example of sensitivity distribution of a sensor region.

As illustrated in FIGS. 26A and 26B, sensitivity and density of capacitors Cp on both ends (both ends in an X-axis direction) of a sensor unit 422s are higher than those in a central portion of the sensor unit 422s. In this case, the sensitivity and density of the capacitors Cp preferably gradually increase from the central portion of the sensor unit 422s toward both the ends (both the ends in the X-axis direction) thereof. Meanwhile, although capacitive coupling is generated and the capacitor Cp is formed between all of first and second electrode elements 42a and 43a actually, an example in which it is considered that the capacitive coupling is generated and the capacitor Cp is formed only between a pair of two adjacent first and second electrode elements 42a and 43a is illustrated in FIGS. 26A and 26B for simplifying illustration and description. Also, as described above, numerical values 1 to 3 assigned to unit regions RU indicate sensitivities of the unit regions RU; the larger the numerical value, the higher the sensitivity.

A configuration example of a sensor layer 422 for obtaining the above-described sensitivity distribution is hereinafter described. Meanwhile, it is also possible to adopt combination of two or more configuration examples out of configuration examples to be described hereinafter.

(Configuration Example 1)

Figure 27A:
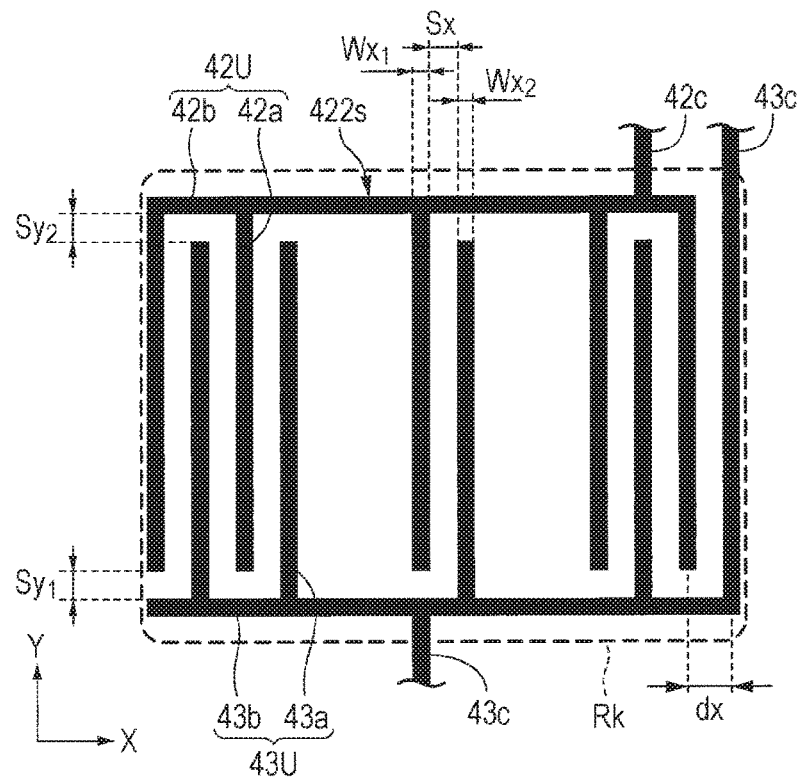
FIG. 27A is a planar view illustrating a configuration example 1 of a sensor unit.
Figure 27B:
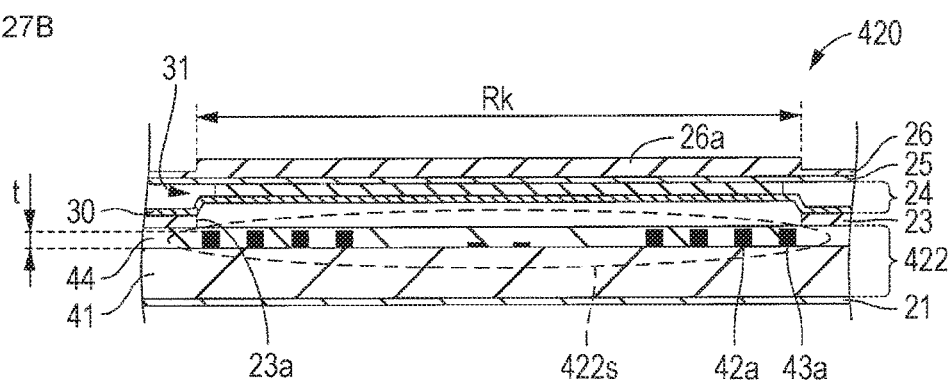
FIG. 27B is a cross-sectional view illustrating the configuration example 1 of the sensor layer.

As illustrated in FIGS. 27A and 27B, in a sensor 420 according to the fifth embodiment, thicknesses t of the first and second electrode elements 42a and 43a on both the ends (both the ends in the X-axis direction) of the sensor unit 422s are larger than the thicknesses t of the first and second electrode elements 42a and 43a in the central portion of the sensor unit 422s. Also, electrode density of the first and second electrode elements 42a and 43a on both the ends (both the ends in the X-axis direction) of the sensor unit 422s is higher than that in the central portion of the sensor unit 422s. In this case, the thicknesses t of the first and second electrode elements 42a and 43a preferably gradually increase from the central portion of the sensor unit 422s toward both the ends (both the ends in the X-axis direction) thereof. Also, the electrode density of the first and second electrode elements 42a and 43a preferably gradually increases from the central portion of the sensor unit 422s toward both the ends (both the ends in the X-axis direction) thereof.

Although an example of obtaining the above-described sensitivity distribution by change in the thicknesses t of the first and second electrode elements 42a and 43a and electrode density is described in the configuration example 1, combination of the configurations for obtaining the above-described sensitivity distribution is not limited thereto. For example, the above-described sensitivity distribution may also be obtained by combining change in at least one of (a) the thicknesses t of the first and second electrode elements 42a and 43a, (b) a thickness D of the sensor layer 422, (c) permittivity of the sensor layer 422, and (d) an arrangement interval dx between the capacitively coupled first and second electrode elements 42a and 43a and change in the electrode density, for example. Meanwhile, the above-described configurations (a) to (d) are described as the configuration examples 1 to 4 of the sensor layer 22 in the first embodiment, respectively.

(Configuration Example 2)

Figure 28A:
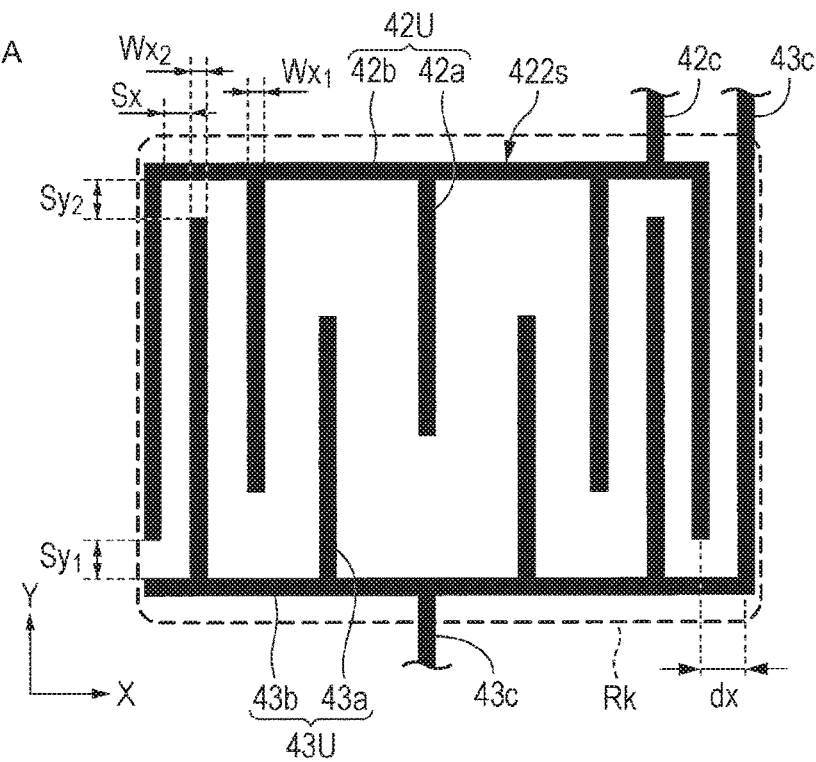
FIG. 28A is a planar view illustrating a configuration example 2 of the sensor unit.
Figure 28B:
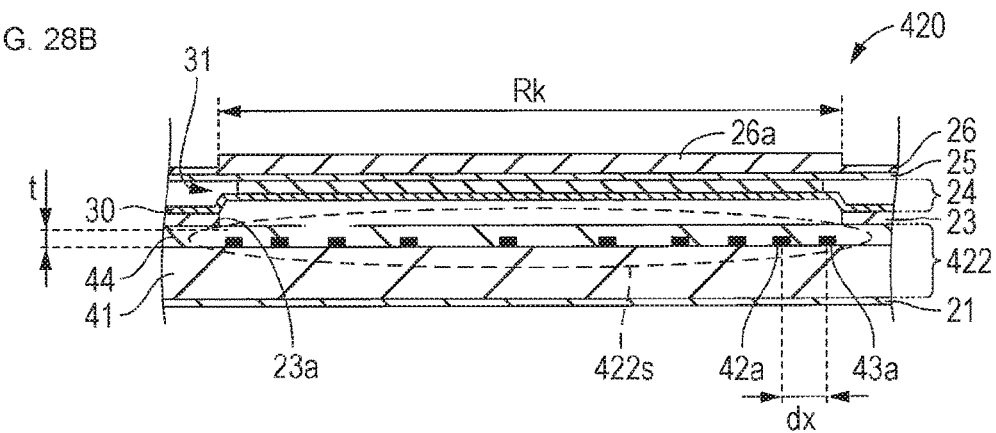
FIG. 28B is a cross-sectional view illustrating the configuration example 2 of the sensor layer.

As illustrated in FIGS. 28A and 28B, a clearance width Sx between the first and second electrode elements 42a and 43a on both the ends (both the ends in the X-axis direction) of the sensor unit 422s is smaller than the clearance width Sx between the first and second electrode elements 42a and 43a in the central portion (central portion in the X-axis direction) of the sensor unit 422s. In this case, the clearance width Sx between the first and second electrode elements 42a and 43a preferably gradually decreases from the central portion of the sensor unit 422s toward an outer periphery thereof. It is also possible that clearance widths $Sy_1$ and $Sy_2$ between the first and second electrode elements and a joint part on both the ends (both the ends in the X-axis direction) of the sensor unit 422s are smaller than the clearance widths $Sy_1$ and $Sy_2$ between the first and second electrode elements and the joint part in the central portion of the sensor unit 422s. In this case, the clearance widths $Sy_1$ and $Sy_2$ between the first and second electrode elements and the joint part preferably gradually decrease from the central portion of the sensor unit 422s toward both the ends thereof. That is to say, it is also possible that lengths of the first and second electrode elements 42a and 43a on both the ends (both the ends in the X-axis direction) of the sensor unit 422s are longer than the lengths of the first and second electrode elements 42a and 43a in the central portion (central portion in the X-axis direction) of the sensor unit 422s. In this case, the lengths of the first and second electrode elements 42a and 43a preferably gradually increase from the central portion of the sensor unit 422s toward both the ends thereof.

(Configuration Example 3)

Figure 10A:
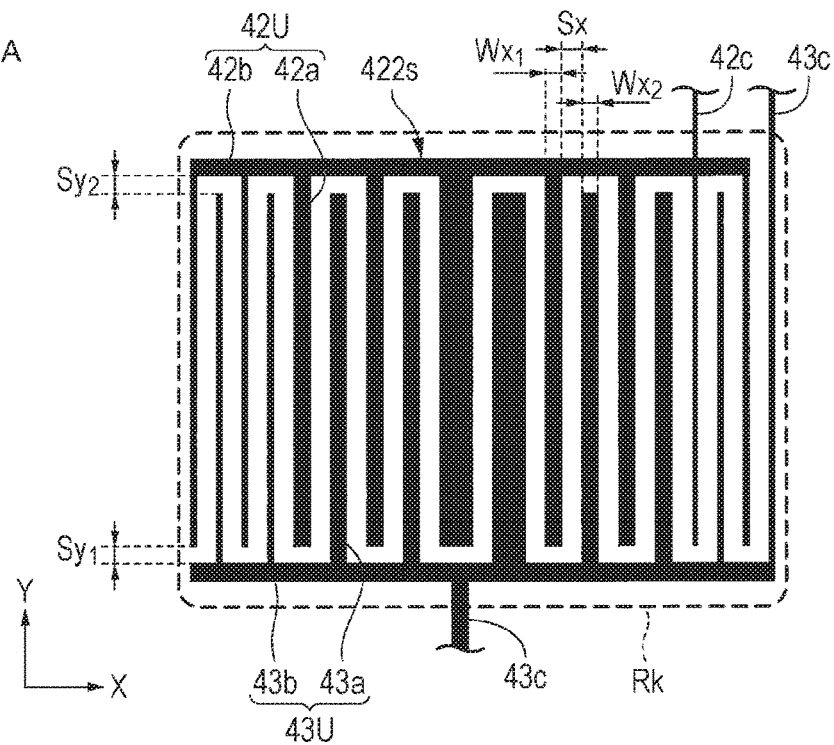
FIG. 10A is a planar view illustrating the configuration example 3 of the sensor unit.
Figure 10B:
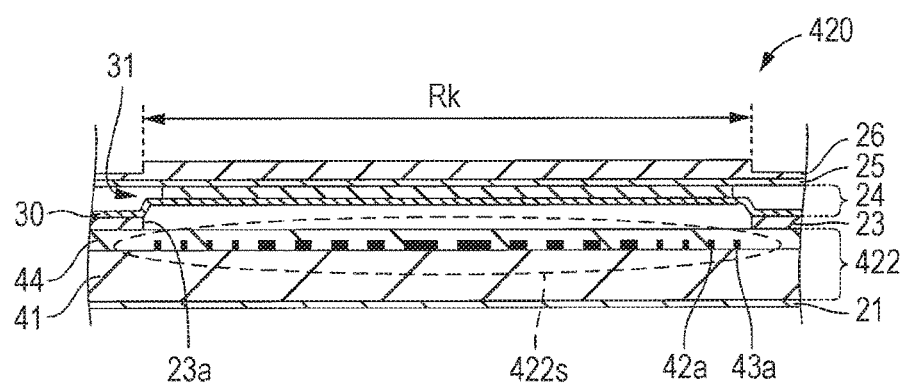
FIG. 10B is a cross-sectional view illustrating the configuration example 3 of the sensor layer.

As illustrated in FIGS. 10A and 10B, the clearance width Sx between the first and second electrode elements 42a and 43a is constant and widths $Wx_1$ and $Wx_2$ of the first and second electrode elements 42a and 43a on both the ends (both the ends in the X-axis direction) of the sensor unit 422s are smaller than the widths $Wx_1$ and $Wx_2$ of the first and second electrode elements 42a and 43a in the central portion (central portion in the X-axis direction) of the sensor unit 422s. In this case, it is preferable that the clearance width Sx between the first and second electrode elements 42a and 43a is constant and the widths $Wx_1$ and $Wx_2$ of the first and second electrode elements 42a and 43a gradually decrease from the central portion of the sensor unit 422s toward both the ends (both the ends in the X-axis direction) thereof.

[5.2 Effect]

In the sensor 420 according to the fifth embodiment, the sensitivity and density of the capacitors Cp on both the ends of the sensor unit 422s are higher than the sensitivity and density of the capacitors Cp in the central portion of the sensor unit 422s. Therefore, the sensitivity and density on both the ends of the sensor unit 422s are higher than the sensitivity and density in the central portion of the sensor unit 22s. Therefore, it is possible to decrease variation in operating load as compared to that in the sensor 20 according to the first embodiment.

Since the sensitivity and density of the capacitors Cp are changed as described above in the sensor 420 according to the fifth embodiment, it is possible to make absolute change in capacitance when a load is applied to an end of a key 26a with a nail and the like large (refer to range (1) in FIG. 11C). It is also possible to make change in the capacitance (inclination) with respect to the load when the load is applied to the end of the key 26a with the nail and the like large (refer to inclination (2) in FIG. 11C. Furthermore, it is possible to make the load with which the change in the capacitance is saturated when the load is applied to the end of the key 26a with the nail and the like large (refer to range (3) in FIG. 11C).

<6 Sixth Embodiment>

An example in which sensitivity on a peripheral end of a sensor unit is made higher than the sensitivity in a central portion by adjusting both arrangement and sensitivity of a capacitor is described in a sixth embodiment.

[6.1 Configuration of Sensor]

Figure 29A:
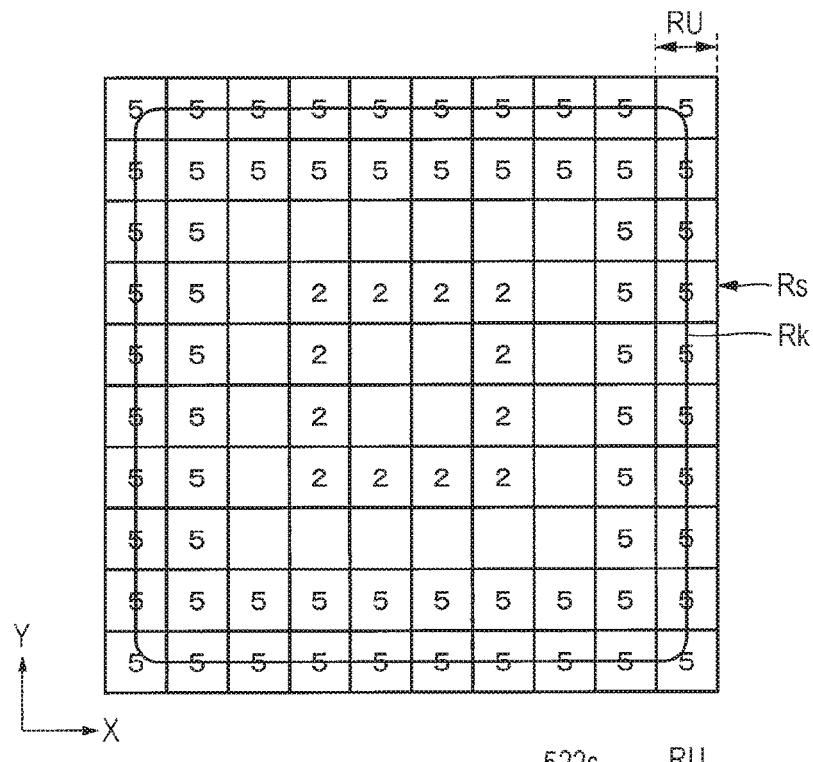
FIG. 29A is a schematic diagram illustrating an example of sensitivity distribution of a sensor region.
Figure 29B:
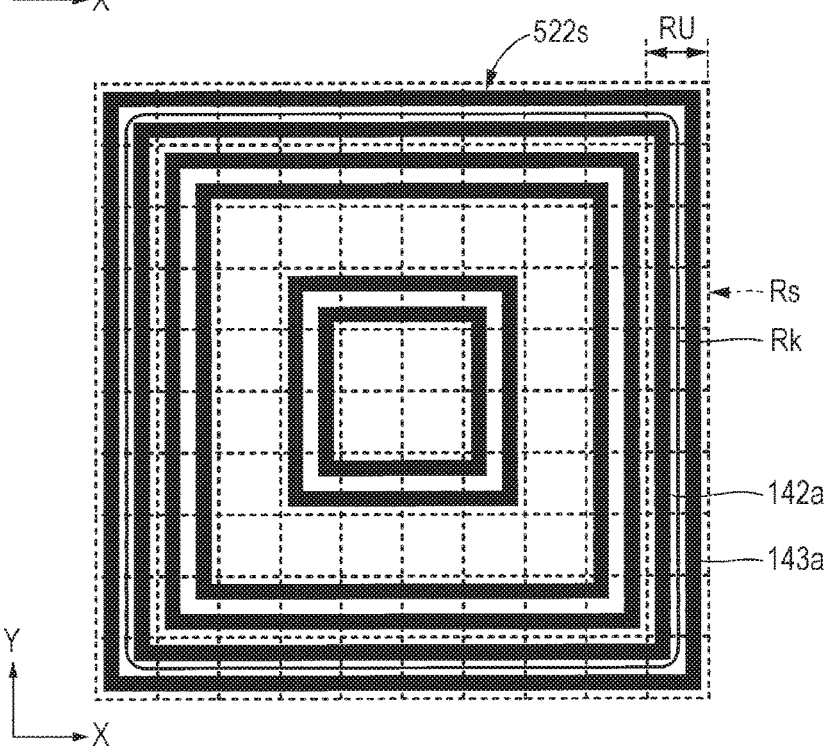
FIG. 29B is a schematic diagram illustrating an example of arrangement of first and second electrode elements in the sensor region illustrated in FIG. 29A.

As illustrated in FIGS. 29A and 29B, sensitivity and density of capacitors Cp on a peripheral end of a sensor unit 522s are higher than those in a central portion of the sensor unit 522s. In this case, the sensitivity and density of the capacitors Cp preferably gradually increase from the central portion of the sensor unit 522s toward the peripheral end thereof. Meanwhile, as described above, numerical values 1 to 5 assigned to unit regions RU indicate sensitivities of the unit regions RU; the larger the numerical value, the higher the sensitivity. Meanwhile, although capacitive coupling is generated and the capacitor Cp is formed between all of first and second electrode elements 142a and 143a actually, an example in which it is considered that the capacitive coupling is generated and the capacitor Cp is formed only between a pair of two adjacent first and second electrode elements 142a and 143a is illustrated in FIGS. 29A and 29B for simplifying illustration and description.

A configuration example of a sensor layer 522 for obtaining the above-described sensitivity distribution is hereinafter described. Meanwhile, it is also possible to adopt combination of two or more configuration examples out of configuration examples to be described hereinafter.

(Configuration Example 1)

Figure 30A:
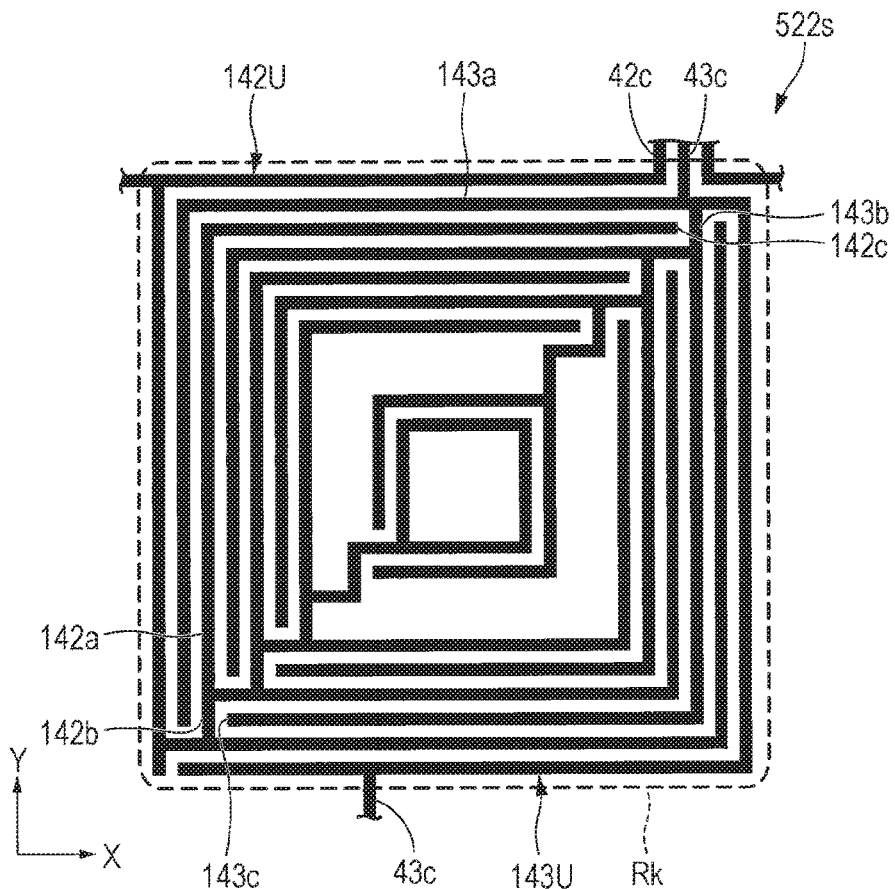
FIG. 30A is a planar view illustrating an example of a configuration of a sensor unit.
Figure 30B:
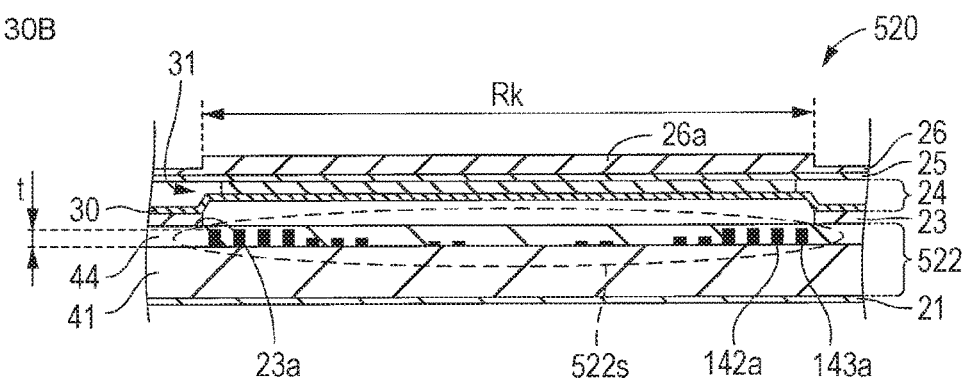
FIG. 30B is a cross-sectional view illustrating an example of a configuration of a sensor layer.

As illustrated in FIGS. 30A and 30B, in a sensor 520 according to the sixth embodiment, thicknesses t of the first and second electrode elements 142a and 143a on the peripheral end of the sensor unit 522s are larger than the thicknesses t of the first and second electrode elements 142a and 143a in the central portion of the sensor unit 522s. Also, electrode density of the first and second electrode elements 142a and 143a on the peripheral end of the sensor unit 522s is higher than that of the first and second electrode elements 142a and 143a in the central portion of the sensor unit 522s. In this case, the thicknesses t of the first and second electrode elements 142a and 143a preferably gradually increase from the central portion in the sensor unit 522s toward the peripheral end thereof. Also, the electrode density of the first and second electrode elements 142a and 143a preferably gradually increases from the central portion of the sensor unit 522s toward a terminal end thereof.

Although an example of obtaining the above-described sensitivity distribution by change in the thicknesses t of the first and second electrode elements 142a and 143a and the electrode density is described in the configuration example 1, combination of the configurations for obtaining the above-described sensitivity distribution is not limited thereto. For example, the above-described sensitivity distribution may be obtained by combining change in at least one of (a) the thicknesses t of the first and second electrode elements 142a and 143a, (b) a thickness D of the sensor layer 522, (c) permittivity of the sensor layer 522, and (d) an arrangement interval d between the capacitively coupled first and second electrode elements 142a and 143a, for example, and the change in electrode density. Meanwhile, the above-described configurations (a) to (d) are described in detail as the configurations 1 to 4 of the sensor layer 122 in the second embodiment.

(Configuration Example 2)

A clearance width S between the capacitively coupled first and second electrode elements 142a and 143a on the peripheral end of the sensor unit 522s is smaller than the clearance width S between the capacitively coupled first and second electrode elements 142a and 143a in the central portion of the sensor unit 522s. In this case, the clearance width S between the first and second electrode elements 142a and 143a preferably gradually decreases from the central portion of the sensor unit 522s toward the peripheral end thereof.

(Configuration Example 3)

The clearance width S between the first and second electrode elements 142a and 143a is constant and widths $W_1$ and $W_2$ of the first and second electrode elements 142a and 143a on the peripheral end of the sensor unit 522s are smaller than the widths $W_1$ and $W_2$ of the first and second electrode elements 142a and 143a in the central portion of the sensor unit 522s. In this case, it is preferable that the clearance width S between the first and second electrode elements 142a and 143a is constant and the widths $W_1$ and $W_2$ of the first and second electrode elements 142a and 143a gradually decrease from the central portion of the sensor unit 522s toward the peripheral end thereof.

[6.2 Effect]

In the sensor 520 according to the sixth embodiment, the sensitivity and density of the capacitors Cp on the peripheral end of the sensor unit 522s are higher than the sensitivity and density of the capacitors Cp in the central portion of the sensor unit 422s. Therefore, the sensitivity and density on the peripheral end of the sensor unit 522s are higher than the sensitivity and density in the central portion of the sensor unit 22s. Therefore, it is possible to decrease variation in operating load as compared to the sensor 20 according to the second embodiment.

<7 Seventh Embodiment>

[7.1 Configuration of Sensor]

Figure 31A:
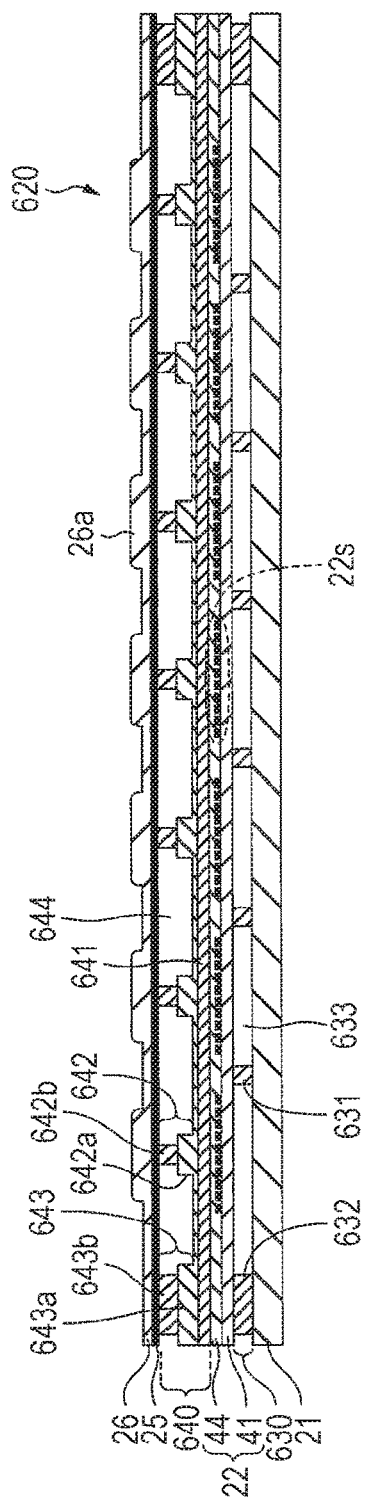
FIG. 31A is a cross-sectional view illustrating an example of a configuration of a sensor according to a seventh embodiment of the present technology.

A sensor 620 according to a seventh embodiment is provided with a REF electrode layer 21 as a first conductor layer, a structure layer 630 as a first structure layer, a sensor layer 22, a structure layer 640 as a second structure layer, a REF electrode layer 25 as a second conductor layer, and a key top layer 26 as illustrated in FIG. 31A. Meanwhile, in the seventh embodiment, a portion identical to that in the first embodiment is assigned with the same reference sign and the description thereof is omitted.

The sensor 620 detects input operation by statistically detecting change in distance between the REF electrode layer 25 and the sensor layer 22 by the input operation to a surface thereof and change in distance between the REF electrode layer 21 and the sensor layer 22. The input operation is not limited to conscious press (push) operation to the surface and may be contact (touch) operation. That is to say, the sensor 620 is capable of detecting minute pressing force (approximately several tens of grams, for example) added by general touch operation, so that this is configured such that the touch operation similar to that with a general touch sensor may be performed.

The REF electrode layer 25 is provided on a side of one principal surface of the sensor layer 22 and the REF electrode layer 21 is provided on a side of the other principal surface. The structure layer 640 is provided between the sensor layer 22 and the REF electrode layer 25. The structure layer 630 is provided between the sensor layer 22 and the REF electrode layer 21. An insulating layer 44 of the sensor layer 22 is formed of an adhesive and the structure layer 640 and the sensor layer 22 are adhered to each other through the insulating layer 44.

(Structure Layer)

The structure layer 640 is provided with a base material 641, a plurality of structure bodies 642, and a frame body (peripheral edge structure body) 643. The frame body 643 is provided on a peripheral edge of the base material 641. A plurality of structure bodies 642 is provided inside the frame body 643 in portions corresponding to keys 26a. A plurality of structure bodies 642 and the frame body 643 are provided between the REF electrode layer 25 and the sensor layer 22 to separate the REF electrode layer 25 from the sensor layer 22. A plurality of structure bodies 642 is arranged in a two-dimensional manner at a predetermined interval on one principal surface (XY surface) of the base material 641 and a space 644 is provided between the structure bodies 642. Meanwhile, it is also possible that the base material 641 is omitted and a plurality of structure bodies 642 and the frame body 643 are directly provided on the sensor layer 22.

The base material 641 is a flexible sheet, for example. An insulating and flexible material is preferably used as a material of the base material 641. Such material includes polyethylene terephthalate (PET), polyethylene naphthalate (PEN), polycarbonate (PC), acrylic resin (PMMA) polyimide (PI), triacetyl cellulose (TAC), polyester, polyamide (PA), aramid, polyethylene (PE), polyacrylate, polyether sulfone, polysulfone, polypropylene (PP), cellulose diacetate, polyvinyl chloride, epoxy resin, urea resin, urethane resin, melamine resin, cyclic olefin polymer (COP), thermoplastic norbornene resin and the like. Although a thickness of the base material 641 is from few μm to few hundred μm, for example, this is not limited to this range.

The structure body 642 is provided with a structure portion 642a and a joint part 642b. A shape of the structure portion 642a may be a cone shape, a columnar shape (for example, a cylinder shape and a polygonal columnar shape), a needle shape, a part of a spherical shape (for example, a hemispherical shape), a part of an ellipsoidal shape (for example, a semi-ellipsoidal shape), a polygonal shape and the like, for example; however, the shape is not limited thereto and another shape may also be adopted.

The joint part 642b is provided on the structure portion 642a and the structure portion 642a is bonded to the REF electrode layer 25 by means of the joint part 642b. Meanwhile, a configuration of the structure body 642 is not limited to a configuration in which the structure portion 521a and the joint part 642b are separated as described above and a configuration in which the structure portion 642a and the joint part 642b are integrally formed in advance may also be adopted. In this case, a material capable of realizing both functions of the structure portion 521a and the joint part 642b is selected, for example, as a material of the structure portion 642a.

The frame body 643 is provided with a structure portion 643a and a joint part 643b. The structure portion 643a is continuously formed so as to enclose a circumference of one principal surface of the base material 641. A width of the frame body 643 is not especially limited as long as strength of the structure layer 640 and an entire sensor 620 may be sufficiently secured. Thicknesses (heights) of the structure body 642 and the frame body 643 are substantially the same; for example, this is few μm to few hundred μm.

The joint part 643b is provided on the structure portion 643a and the structure portion 643a is bonded to the REF electrode layer 25 by means of the joint part 643b. Meanwhile, a configuration of the structure portion 643a is not limited to the configuration in which the structure portion 643a and the joint part 643b are separated as described above and a configuration in which the structure portion 643a and the joint part 643b are integrally formed in advance may also be adopted. In this case, a material capable of realizing both functions of the structure portion 643a and the joint part 643b is selected, for example, as a material of the frame body 643.

An insulating resin material is used, for example, as materials of the structure portions 642a and 643a. A photo curing resin such as an ultraviolet curing resin may be used as such resin material. An adhesive resin material and the like is used, for example, as materials of the joint parts 642b and 643b.

The structure layer 630 is provided with a plurality of structure bodies 631 and a frame body (peripheral edge structure body) 632. A plurality of structure bodies 631 and the frame body 632 are provided between the sensor layer 22 and the REF electrode layer 21 to separate the sensor layer 22 from the REF electrode layer 21. A plurality of structure bodies 631 is arranged in a two-dimensional manner at a predetermined interval on one principal surface of the sensor layer 22 or the REF electrode layer 21 and a space 633 is provided between the structure bodies 631. The space 633 is also provided between the structure body 631 and the frame body 632. The structure body 631 is arranged between adjacent structure bodies 642 if the sensor 620 is seen in a direction perpendicular to an operation surface (Z-axis direction).

The frame body 632 is continuously formed so as to enclose a circumference of one principal surface of the sensor layer 22 or the REF electrode layer 21. A width of the frame body 632 is not especially limited as long as strength of the structure layer 630 and the entire sensor 620 may be sufficiently secured and is the width substantially identical to that of the frame body 643, for example.

A shape of the structure body 631 may be a cone shape, a columnar shape (for example, a cylinder shape and a polygonal columnar shape), a needle shape, a part of a spherical shape (for example, a hemispherical shape), a part of an ellipsoidal shape (for example, a semi-ellipsoidal shape), a polygonal shape and the like, for example; however, the shape is not limited thereto and another shape may also be adopted.

An adhesive and insulating resin material is used, for example, as materials of the structure body 631 and the frame body 632. The structure body 631 and the frame body 632 have a function as a joint part to join the sensor layer 22 to the REF electrode layer 21 in addition to a function as a separating unit which separates the sensor layer 22 from the REF electrode layer 21.

Although thicknesses of the structure body 631 and the frame body 632 are from few μm to few hundred μm, for example, they are not limited to this range. Meanwhile, the thickness of the structure body 631 is preferably smaller than the thickness of the structure body 642. This is because the sensor layer 22 may be deformed until this is brought into contact with the REF electrode layer 21 to obtain a large capacitance change amount.

[7.2 Operation of Sensor]

Hereinafter, an example of operation of the sensor 620 at the time of gesture and key input operation is described with reference to FIG. 31A.

(Gesture Input Operation)

When the gesture input operation is performed on the surface (operation surface) of the sensor 620, the structure body 642 immediately below the key 26a is subjected to force the most and the structure body 642 itself is slightly elastically deformed to be slightly displaced downward. The sensor unit 22s immediately below the structure body 642 is slightly displaced downward by the displacement. With this arrangement, the sensor unit 22s slightly approaches the REF electrode layer 21 through the space 633. That is to say, a distance between the sensor unit 22s and the REF electrode layer 25 slightly changes and a distance between the sensor unit 22s and the REF electrode layer 21 slightly changes, so that capacitance changes.

(Key Input Operation)

When the key 26a of the sensor 620 is pressed to perform the key input operation, the structure body 642 immediately below the key 26a is subjected to the force the most and the structure body 642 is elastically deformed to be displaced downward. The sensor unit 22s immediately below the structure body 642 is displaced downward by the displacement. With this arrangement, the sensor unit 22s approaches or is brought into contact with the REF electrode layer 21 through the space 633. That is to say, the distance between the sensor unit 22s and the REF electrode layer 25 somewhat changes and the distance between the sensor unit 22s and the REF electrode layer 21 significantly changes, so that the capacitance changes.

[7.3 Effect]

In the sensor 620 according to the seventh embodiment, the distance between the sensor unit 22s and the REF electrode layer 21 and the distance between the sensor unit 22s and the REF electrode layer 25 change due to pressing of the sensor 620, so that the capacitance change amount in the sensor unit 22s may be made larger. With this arrangement, it becomes possible to increase detection sensitivity of the input operation.

[7.4 Variation]

Figure 31B:
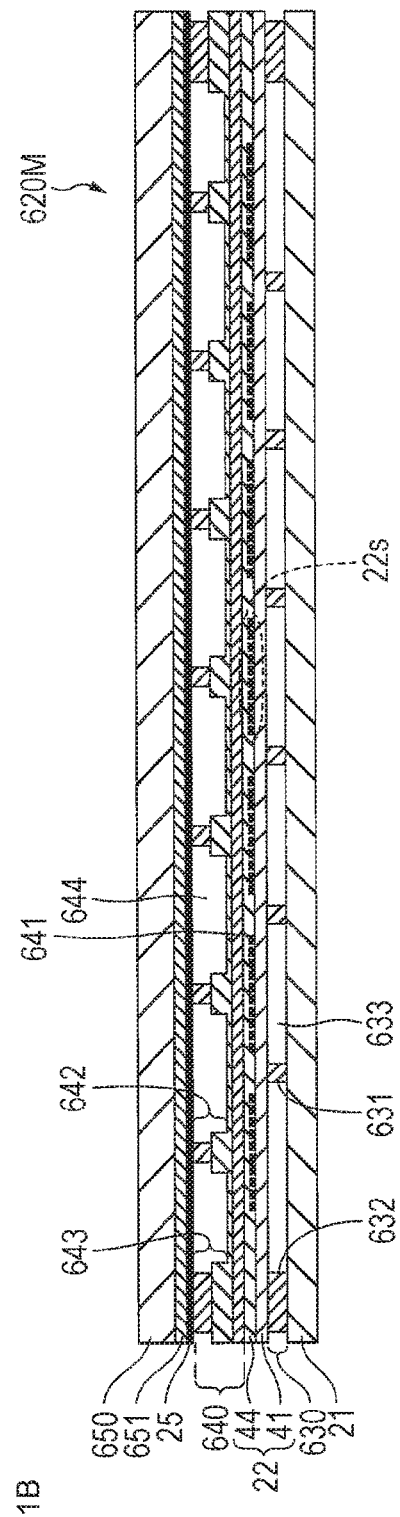
FIG. 31B is a cross-sectional view illustrating an example of a configuration of a sensor according to a variation of the seventh embodiment of the present technology.

As illustrated in FIG. 31B, a sensor 620M according to a variation of the seventh embodiment of the present technology is different from the sensor 620 according to the seventh embodiment in that a display 650 is provided on the REF electrode layer 25 in place of a key top layer 26. The display 650 is adhered to the REF electrode layer 25 through an adhesive layer 651. Meanwhile, in the variation of the seventh embodiment, a portion identical to that in the seventh embodiment is assigned with the same reference sign and the description thereof is omitted.

(Display)

The display 650 is a display including a glass substrate, a film display, and a flexible display, for example. Electronic paper, an organic electro luminescence (EL) display, an inorganic EL display, a liquid crystal display and the like may be used, for example, as the display 650; however, the display is not limited thereto.

(Adhesive Layer)

The adhesive layer 651 is formed of insulating adhesive or adhesive tape, for example. As the adhesive, one or more types selected from a group including an acrylic adhesive, a silicone adhesive, a urethane adhesive and the like may be used, for example.

[Reference Example, Test Example]

Although the present technology is hereinafter specifically described with reference to a reference example and a test example, the present technology is not limited only to the reference example and the text example.

The reference example and the test example are described in the following order.

i Evaluation of Actually Manufactured Sensor
ii Study of Sensor by Simulation (1)
iii Study of Sensor by Simulation (2)
<i Evaluation of Actually Manufactured Sensor>
(Reference Example 1)

A sensor having a configuration illustrated in FIG. 1A was manufactured. Meanwhile, comb-like shaped first and second electrode elements were used.

(Variation in Operating Load when Central Portion and Corner of Key are Pressed with Artificial Finger)

Figure 32A:
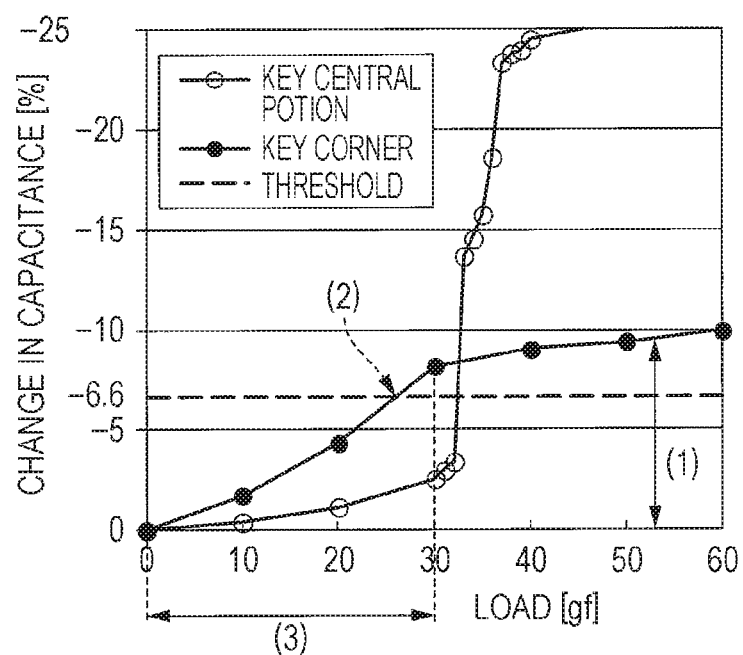
FIG. 32A is a graph illustrating change in capacitance when a key of a sensor in a reference example 1 is pressed with an artificial finger.

Variation in operating load when a central portion and a corner of a key of the manufactured sensor were pressed with an artificial finger was obtained as follows. First, a load was applied to the central portion and the corner (peripheral end) of the key with the artificial finger representing a pad of a finger to obtain change in capacitance with respect to the load. A result thereof is illustrated in FIG. 32A. A cylindrical bar-like body with a flat tip end was used as the artificial finger, and a diameter φ of the tip end of which was set to 6 mm. Next, −6.6% was supposed as a threshold (the change in the capacitance) for determining key input operation and the operating load required for the key input operation was obtained in the central portion and the corner of the key on the basis of the threshold. Next, the variation in the operating load when the load was applied to the central portion and the corner of the key with the artificial finger was obtained by using the obtained operating load. A result thereof is illustrated in Table 1.

(Variation in Operating Load when Central Portion and Corner of Key are Pressed with Artificial Nail)

Figure 32B:
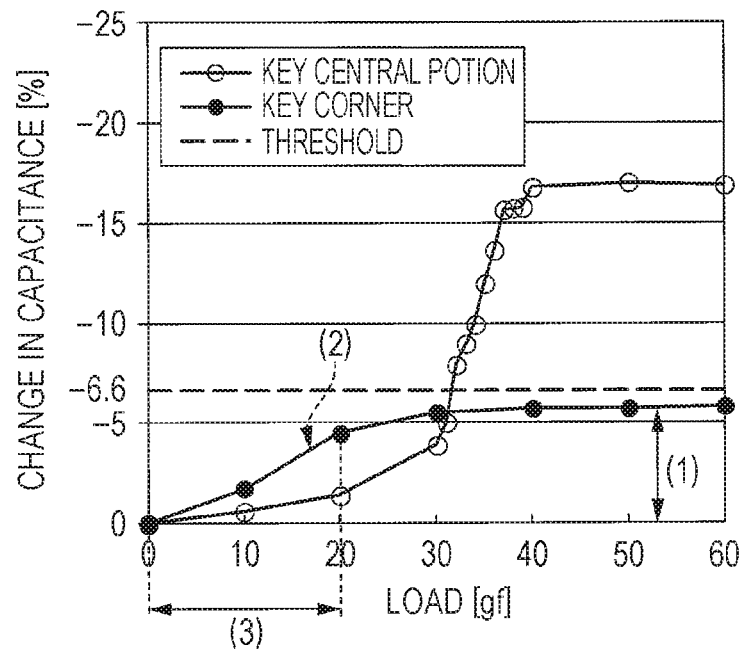
FIG. 32B is a graph illustrating the change in the capacitance when the key of the sensor in the reference example 1 is pressed with an artificial nail.

The variation in the operating load when the central portion and the corner of the key of the manufactured sensor were pressed with an artificial nail was obtained as follows. First, the load was applied to the central portion and the corner (peripheral end) of the key with the artificial nail representing a tip of a nail to obtain the change in the capacitance with respect to the load. A result thereof is illustrated in FIG. 32B. An elongated bar-like body with an acute tip end was used as the artificial nail and a curvature radius R of the tip end thereof was set to 1.5 mm. Next, the variation in the operating load when the load was applied to the central portion and the corner of the key with the artificial nail was obtained as in the case where the variation in the operating load by the artificial finger was obtained. A result thereof is illustrated in Table 1.

Table 1 illustrates an evaluation result of the variation in the operating load of the sensor in the reference example 1.

TABLE 1

|  | Operating load [gf] | | Variation in operating load [gf] |
| --- | --- | --- | --- |
|  | Key central portion | Key outer periphery |  |
| Artificial finger | 32 | 26 | 6 |
| Artificial nail | 32 | — | — |

The following are understood from the above-described evaluation result.

In a case where the load is applied to the peripheral end of the key with the artificial nail, absolute change in the capacitance is smaller than that in a case where the load is applied to the peripheral end of the key with the artificial finger (refer to range (1) in FIGS. 32A and 32B).

In a case where the load is applied to the peripheral end of the key with the artificial nail, the change in the capacitance (inclination) with respect to the load is smaller than that in a case where the load is applied to the peripheral end of the key with the artificial finger (refer to inclination (2) in FIGS. 32A and 32B).

In a case where the load is applied to the peripheral end of the key with the artificial nail, the load with which the change in capacitance is saturated is smaller than that in a case where the load is applied to the peripheral end of the key with the artificial finger (refer to range (3) in FIGS. 32A and 32B).

<ii Study of Sensor by Simulation (1)>

(Test Example 1-1)

First, displacement distribution of a REF electrode layer when the load is applied to the key central portion with the artificial finger as an operator was obtained by stress simulation (finite element method).

Figure 33A:
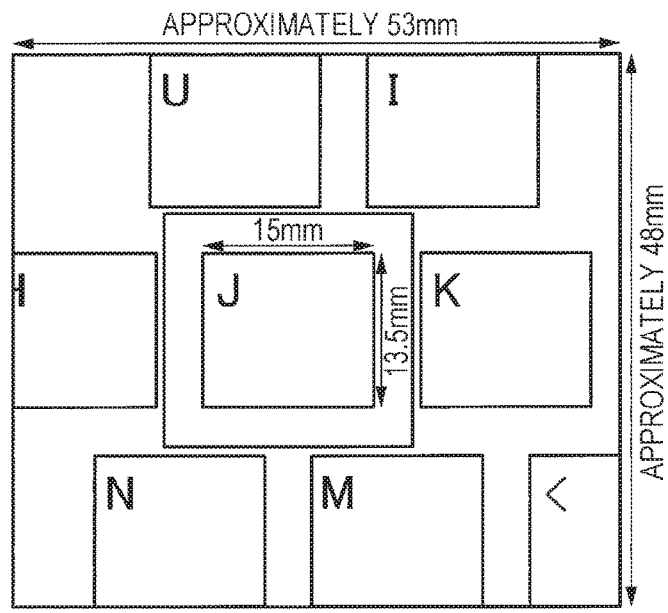
FIG. 33A is a planar view illustrating an external view of an operation surface of a sensor used as a model of stress simulation in test examples 1-1 to 1-4, 2-1 to 2-4, and 3-1 to 3-4.
Figure 33B:
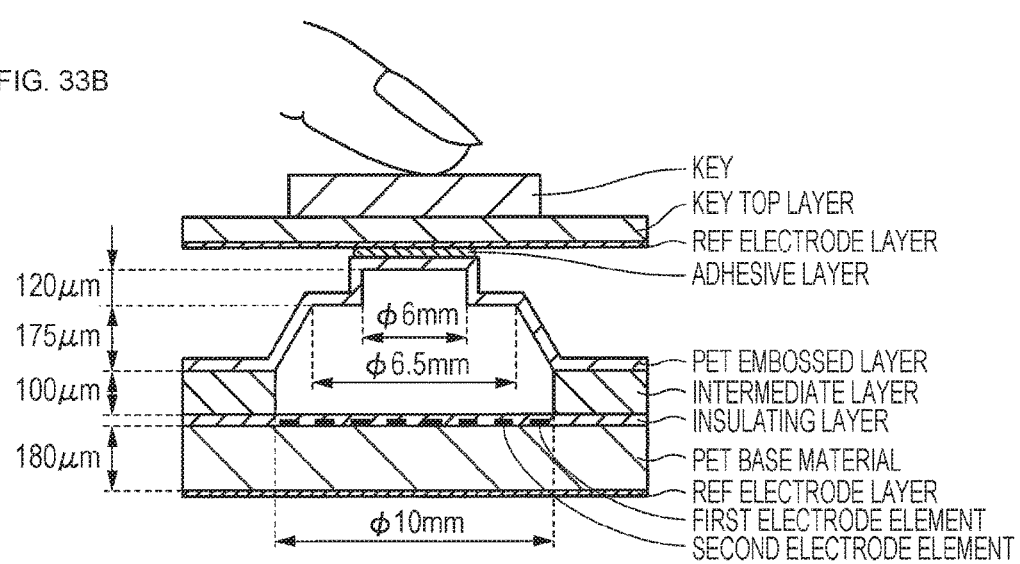
FIG. 33B is a cross-sectional view illustrating a configuration of the sensor used as the model of the stress simulation in the test examples 1-1 to 1-4, 2-1 to 2-4, and 3-1 to 3-4.

FIG. 33A illustrates an external view of an operation surface of the sensor used as a model of the stress simulation. FIG. 33B illustrates a configuration of the sensor used as the model of the stress simulation. Table 2 illustrates a setting condition of the stress simulation.

TABLE 2

| | |
|---|---|
| Pad thickness [mm] | 0.2 |
| Pad Young's ratio [GPa] | 1 |
| Key top thickness [mm] | 0.05 |
| Key top Young's ratio [GPa] | 7 |
| Adhesive material thickness [mm] | 0.025 |
| Adhesive material Young' ratio [GPa] | 0.4 |
| Thickness of PET embossed layer [mm] | 0.05 |
| Young's ratio of PET embossed layer [Gpa] | 4.45 |
| Configuration of sensor | Refer to FIGS. 33A and 33B |
| Young's ratio of PET base material [Gpa] | 4.45 |
| Artificial finger shape | Cylinder φ6 × h4 mm (tip end R90) |
| Artificial finger material and hardness | Silicon rubber hardness 60 |
| Artificial nail | Hemisphere R1.5 mm |
| Artificial nail Young's ratio [Gpa] | 70 |
| Calculation area | 70 |

Figure 34A:
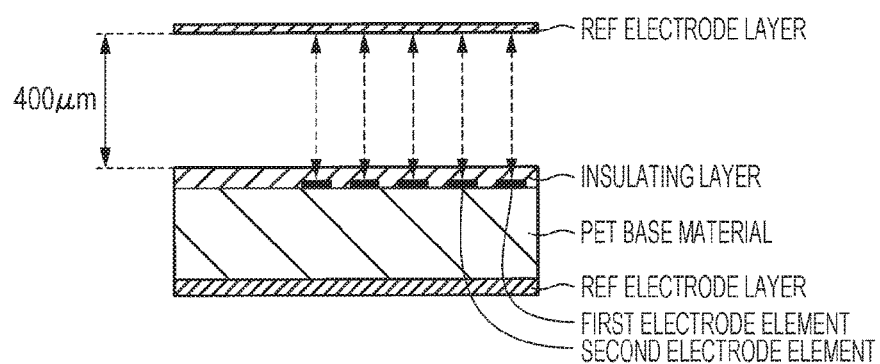
FIG. 34A is a cross-sectional view illustrating a configuration of a sensor used as a model of electric field simulation in the test examples 1-1 to 1-4, 2-1 to 2-4, and 3-1 to 3-4.
Figure 34B:
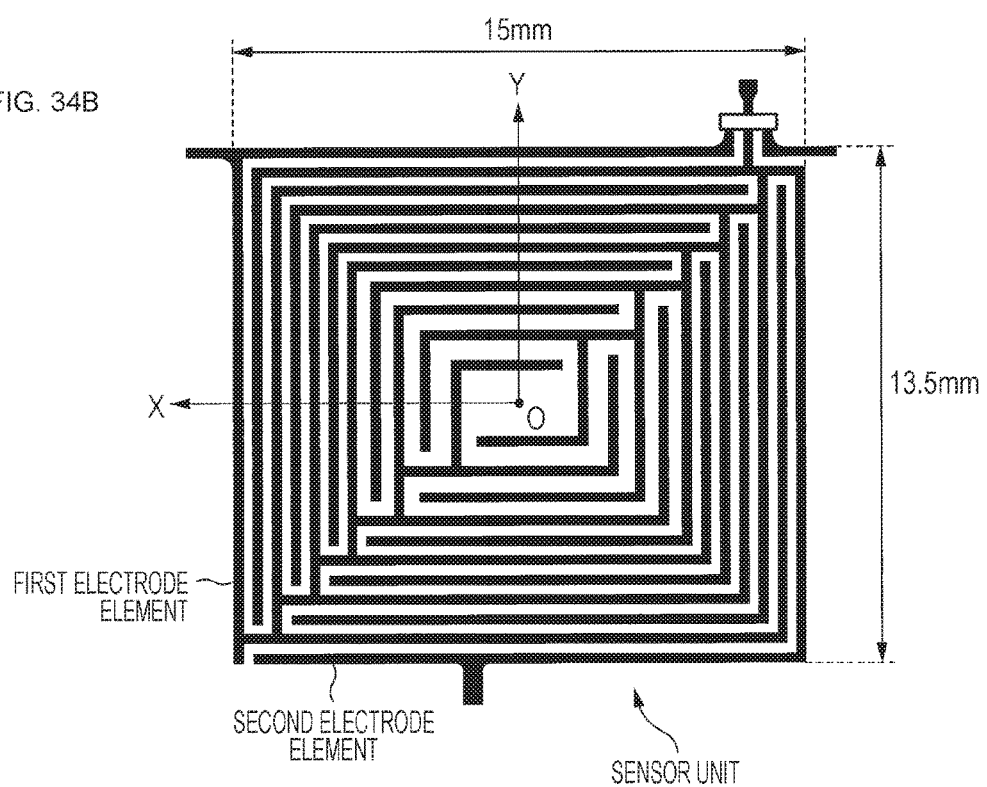
FIG. 34B is a planar view illustrating a configuration of a sensor unit used as a model of the electric field simulation in the test examples 1-1 to 1-4, 2-1 to 2-4, and 3-1 to 3-4.

Next, the change in the capacitance with respect to displacement of the REF electrode layer when the REF electrode layer approaches the sensor layer in parallel was obtained by electric field simulation (finite element method). FIG. 34A illustrates a configuration of the sensor used as a model of the electric field simulation in a test example 1-1. FIG. 34B illustrates a configuration of a sensor unit of the sensor used as the model of the electric field simulation in the test example 1-1.

Table 3 illustrates a setting condition of the electric field simulation.

TABLE 3

| | |
|---|---|
| Relative permittivity of insulating layer | 3.7 |
| Insulating layer thickness [mm] | 0.02 |
| Relative permittivity of PET base material | 3.2 |
| Thickness of PET base material [mm] | 0.188 |
| Thicknesses of first and second electrode elements [mm] | 0.01 |
| Widths of first and second electrode elements [mm] | 0.275 |
| Gap of REF electrode layer [mm] | 0 to 0.42 |

The first and second electrode elements were arranged in the following manner. A clearance width between the capacitively coupled first and second electrode elements was made constant (0.225 mm) from a central portion of the sensor unit to a peripheral end thereof. That is to say, the first and second electrode elements were arranged such that density of capacitors was constant from the central portion of the sensor unit toward the peripheral end thereof.

Figure 35A:
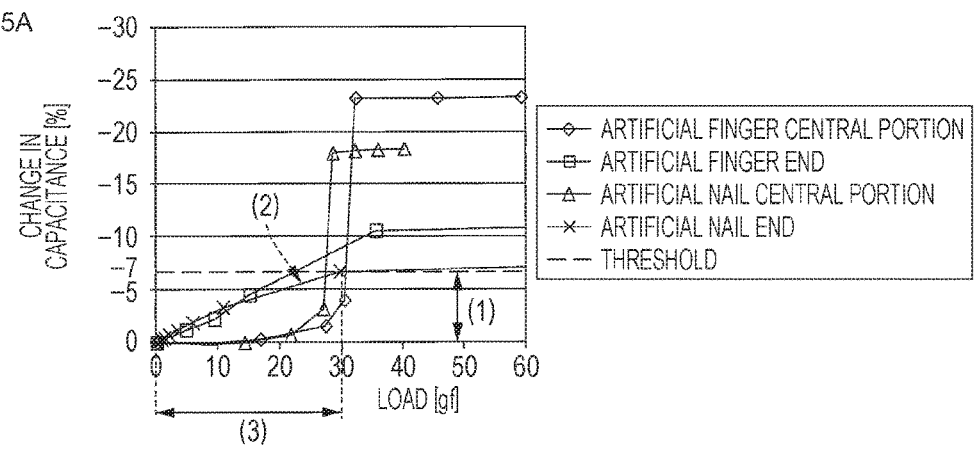
FIG. 35A is a graph illustrating simulation results of the test examples 1-1 to 1-4.

Next, the change in the capacitance when an operation load was applied to the key central portion with the artificial finger was obtained by synthesizing the results of the above-described stress simulation and electric field simulation. A result thereof is illustrated in FIG. 35A.

(Test Example 1-2)

The change in the capacitance when the operation load was applied to the key peripheral end with the artificial finger was obtained as in the test example 1-1 except that a position to which the load was applied with the artificial finger was changed to the key peripheral end. A result thereof is illustrated in FIG. 35A.

(Test Example 1-3)

The change in the capacitance when the operation load was applied to the key central portion with the artificial nail was obtained as in the test example 1-1 except that the operator was changed to the artificial nail. A result thereof is illustrated in FIG. 35A. Meanwhile, as the artificial nail, the operator having a hemispherical shape the curvature radius R at the tip end of which was 1.5 mm with a Young's modulus of 70 GPa was supposed.

(Test Example 1-4)

The change in the capacitance when the operation load was applied to the key peripheral end with the artificial nail was obtained as in the test example 1-2 except that the operator was changed to the artificial nail. A result thereof is illustrated in FIG. 35A.

(Test Examples 2-1 to 2-4)

The change in the capacitance when the operation load was applied to the key central portion or the key peripheral end with the artificial finger or the artificial nail was obtained as in the test examples 1-1 to 1-4 except that the first and second electrode elements were arranged in the following manner. Apart of the first and second electrode elements in the test examples 1-1 to 1-4 was omitted such that density of the capacitively coupled first and second electrode elements increased from the central portion of the sensor unit toward the peripheral end thereof. That is to say, the first and second electrode elements were arranged such that the density of the capacitors increased from the central portion of the sensor unit toward the peripheral end thereof.

(Test Examples 3-1 to 3-4)

The change in the capacitance when the operation load was applied to the key central portion or the key peripheral end with the artificial finger or the artificial nail was obtained as in the test examples 1-1 to 1-4 except that the first and second electrode elements were arranged in the following manner. The first and second electrode elements were arranged such that the clearance width between the first and second electrode elements was smaller in the peripheral end of the sensor unit than that in the central portion of the sensor unit. That is to say, the first and second electrode elements were arranged such that the density and sensitivity of the capacitors on the peripheral end of the sensor unit were higher than those in the central portion of the sensor unit. Meanwhile, the clearance width between the first and second electrode elements was changed so as to be smaller in three steps of 0.575 mm, 0.375 mm, and 0.275 mm from the central portion of the sensor unit toward the peripheral end thereof.

Table 4 illustrates simulation results of the test examples 1-1 to 1-4.

TABLE 4

| Artificial finger | | | | Artificial nail | | | |
|---|---|---|---|---|---|---|---|
| Test example 1-1 Key center: | | Test example 1-2 Key end | | Test example 1-3 Key center | | Test example 1-4 Key end | |
| Load [gf] | Change in capacitance | Load [gf] | Change in capacitance | Load [gf] | Change in capacitance | Load [gf] | Change in capacitance |
| 0 | 0% | 0 | 0% | 0 | 0% | 0 | 0% |
| 4 | 0% | 5 | −1% | 9 | 0% | 1 | 0% |
| 8 | 0% | 9 | −2% | 14 | 0% | 1 | 0% |
| 17 | 0% | 15 | −4% | 22 | −1% | 2 | −1% |
| 27 | −2% | 36 | −11% | 27 | −3% | 3 | −1% |
| 30 | −4% | 76 | −11% | 29 | −18% | 6 | −2% |
| 32 | −23% | — | — | 32 | −18% | 11 | −3% |
| 46 | −23% | — | — | 36 | −18% | 30 | −7% |
| 59 | −23% | — | — | 40 | −18% | 93 | −8% |
| Operating load | 31 | Operating load | 23 | Operating load | 27 | Operating load | 30 |

Table 5 illustrates simulation results of the test examples 2-1 to 2-4.

TABLE 5

| Artificial finger | | | | Artificial nail | | | |
|---|---|---|---|---|---|---|---|
| Test example 2-1 Key center | | Test example 2-2 Key end | | Test example 2-3 Key center | | Test example 2-4 Key end | |
| Load [gf] | Change in capacitance | Load [gf] | Change in capacitance | Load [gf] | Change in capacitance | Load [gf] | Change in capacitance |
| 0 | 0% | 0 | 0% | 0 | 0% | 0 | 0% |
| 4 | 0% | 5 | −1% | 9 | 0% | 1 | 0% |
| 8 | 0% | 9 | −2% | 14 | 0% | 1 | 0% |
| 17 | 0% | 15 | −4% | 22 | 0% | 2 | −1% |
| 27 | −1% | 36 | −10% | 27 | −3% | 3 | −1% |
| 30 | −3% | 76 | −11% | 29 | −15% | 6 | −2% |
| 32 | −20% | 1000 | — | 32 | −15% | 11 | −3% |
| 46 | −20% | 1000 | — | 36 | −16% | 30 | −7% |
| 59 | −20% | 1000 | — | 40 | −16% | 93 | −7% |
| Operating load | 31 | Operating load | 24 | Operating load | 28 | Operating load | 30 |

Table 6 illustrates simulation results of the test examples 3-1 to 3-4.

TABLE 6

| Artificial finger | | | | Artificial nail | | | |
|---|---|---|---|---|---|---|---|
| Test example 3-1 Key center | | Test example 3-2 Key end | | Test example 3-3 Key center | | Test example 3-4 Key end | |
| Load [gf] | Change in capacitance | Load [gf] | Change in capacitance | Load [gf] | Change in capacitance | Load [gf] | Change in capacitance |
| 0 | 0% | 0 | 0% | 0 | 0% | 0 | 0% |
| 17 | 0% | 5 | −1% | 9 | 0% | 1 | 0% |
| 27 | −1% | 9 | −2% | 14 | 0% | 1 | −1% |
| 31 | −4% | 15 | −5% | 22 | 0% | 2 | −1% |
| 32 | −19% | 36 | −11% | 27 | −2% | 3 | −1% |
| 41 | −19% | 76 | −12% | 29 | −15% | 6 | −2% |
| 53 | −19% | — | — | 32 | −15% | 11 | −4% |
| 68 | −19% | — | — | 36 | −15% | 30 | −8% |
| 1000 | 0% | — | — | 40 | −15% | 93 | −9% |
| Operating load | 31 | Operating load | 25 | Operating load | 28 | Operating load | 30 |

Table 7 illustrates variation in the operating load of the test examples 1-1 to 1-4, 2-1 to 2-4, and 3-1 to 3-4.

TABLE 7

| | Variation in operating load [gf] | Remarks |
|---|---|---|
| Test examples 1-1 to 1-4 | 8.0 | Arrange same capacitors at regular intervals |
| Test examples 2-1 to 2-4 | 7.2 | Change arrangement interval of capacitors |
| Test examples 3-1 to 3-4 | 6.0 | Change sensitivity and arrangement interval of capacitors |

The following is understood from the result of the simulation described above.

In a case where an arrangement interval of the capacitors is made narrower from the central portion of the sensor unit toward the peripheral end thereof, the variation in the operating load may be decreased as compared to a case where the arrangement interval of the capacitors is made constant from the central portion of the sensor unit toward the peripheral end thereof.

In a case where the arrangement interval of the capacitors is made narrower and the sensitivity of the capacitor is increased from the central portion of the sensor unit toward the peripheral end thereof, the variation in the operating load may be decreased as compared to a case where the arrangement interval of the capacitors is made narrower from the central portion of the sensor unit toward the peripheral end thereof.

Figure 35B:
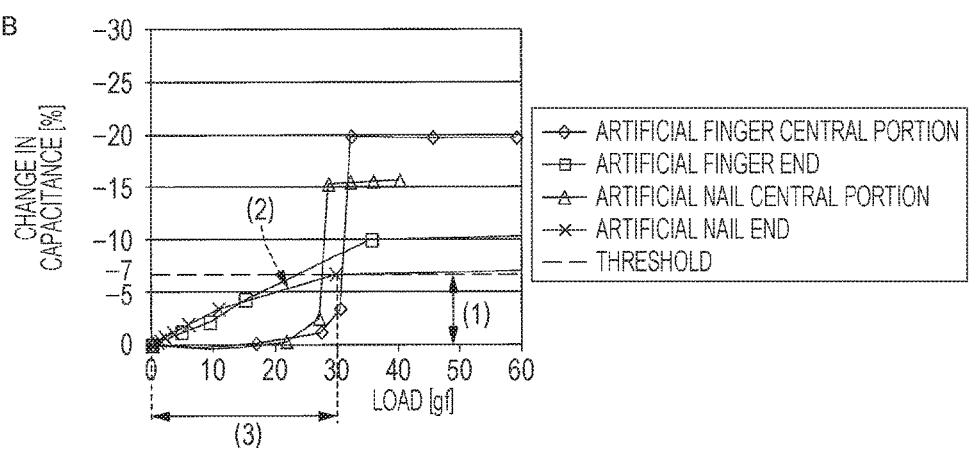
FIG. 35B is a graph illustrating simulation results of the test examples 2-1 to 2-4.

In a case where the arrangement interval of the capacitors is made narrower from the central portion of the sensor unit toward the peripheral end thereof, following advantages may be obtained as compared to a case where the arrangement interval of the capacitors is made constant from the central portion of the sensor unit toward the peripheral end thereof. That is to say, (a) absolute change in capacitance when the operation load is applied to the peripheral end of the key with the artificial nail may be made larger (refer to range (1) in FIGS. 35A and 35B.

Figure 35C:
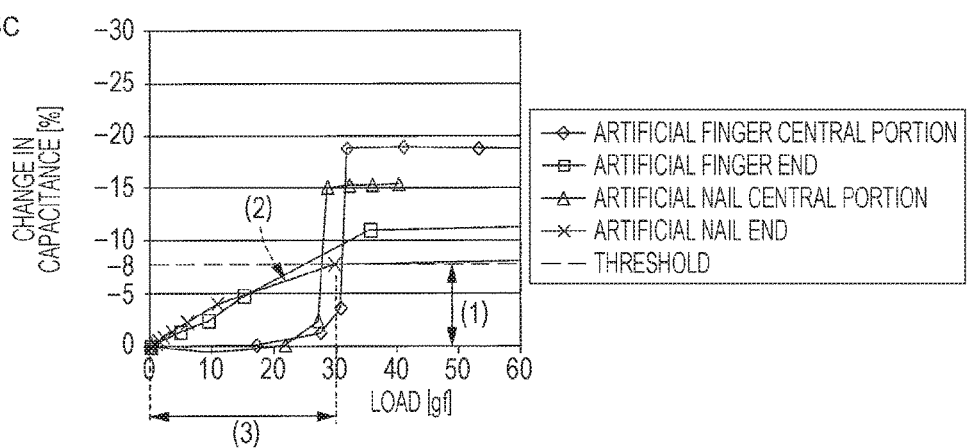
FIG. 35C is a graph illustrating simulation results of the test examples 3-1 to 3-4.

In a case where the arrangement interval of the capacitors is made narrower and the sensitivity of the capacitor is increased from the central portion of the sensor unit toward the peripheral end thereof, following advantages may be obtained as compared to a case where the arrangement interval of the capacitors is made constant from the central portion of the sensor unit toward the peripheral end thereof. That is to say, (a) absolute change in capacitance in a case where the operation load is applied to the peripheral end of the key with the artificial nail may be made large (refer to range (1) in FIGS. 35A and 35C). (b) It is possible to make the change in the capacitance (inclination) with respect to the load in a case where the operation load is applied to the peripheral end of the key with the artificial nail large (refer to range (2) in FIGS. 35A and 35C). (c) It is possible to make the load with which the change in the capacitance is saturated in a case where the operation load is applied to the peripheral end of the key with the artificial nail large (refer to range (3) in FIGS. 35A and 35C).

<iii Study of Sensor by Simulation (2)>
(Test Examples 4-1 to 4-4)

The change in the capacitance with respect to the displacement of the REF electrode layer when the REF electrode layer approaches the sensor layer in parallel was obtained as in the electric field simulation in the test example 1-1 except that relative permittivity of an insulating layer was changed to 2 and 5 or a thickness of the insulating layer was changed to 0.02 mm and 0.08 mm. Next, the change in the capacitance when the REF electrode layer is completely pressed was obtained by using a result thereof. A result thereof is illustrated in FIG. 36A. Also, a ratio of the change in the capacitance when finishing pressing the REF electrode layer to the change in the capacitance when starting pressing the REF electrode layer was obtained. A result thereof is illustrated in FIG. 36B.

Meanwhile, "the change in the capacitance when the REF electrode layer is completely pressed" is intended to mean a value obtained by subtracting "capacitance in a position in which the REF electrode layer hits a bottom" from "capacitance in an initial position of the REF electrode layer". Also, "the change in the capacitance when starting pressing the REF electrode layer" is intended to mean a value obtained by subtracting "capacitance in a position when the REF electrode layer is pressed by 100 μm from the initial position" from "the capacitance in the initial position of the REF electrode layer" and "the change in the capacitance when finishing pressing the REF electrode layer" is intended to mean a value obtained by subtracting "capacitance in a position in which the REF electrode layer is pressed by another 100 μm from a position in which the REF electrode layer is pressed by a predetermined amount in which the REF electrode layer hits the bottom" from "capacitance in the position in which the REF electrode layer is pressed by a predetermined amount".

(Test Examples 5-1 to 5-4)

The change in the capacitance with respect to the displacement of the REF electrode layer when the REF electrode layer approaches the sensor layer in parallel was obtained as in the electric field simulation in the test example 1-1 except that relative permittivity of a base material was changed to 2 and 5 or a thickness of the base material was changed to 0.1 mm and 0.188 mm. Next, the change in the capacitance when the REF electrode layer is completely pressed was obtained by using a result thereof. A result thereof is illustrated in FIG. 36A. Also, a ratio of the change in the capacitance when finishing pressing the REF electrode layer to the change in the capacitance when starting pressing the REF electrode layer was obtained. A result thereof is illustrated in FIG. 36B.

(Test Examples 6-1 to 6-6)

The change in the capacitance with respect to the displacement of the REF electrode layer when the REF electrode layer approaches the sensor layer in parallel was obtained as in the electric field simulation in the test example 1-1 except that thicknesses of the first and second electrode elements were changed to 0.05 mm and 0.02 mm, widths of the first and second electrode elements were changed to 0.25 mm and 0.5 mm, or the clearance width between the first and second electrode elements were changed to 0.25 mm and 0.5 mm. Next, the change in the capacitance when the REF electrode layer is completely pressed was obtained by using a result thereof. A result thereof is illustrated in FIG. 36A. Also, a ratio of the change in the capacitance when finishing pressing the REF electrode layer to the change in the capacitance when starting pressing the REF electrode layer was obtained. A result thereof is illustrated in FIG. 36B.

The following is understood from the result of the simulation described above.

The change in the capacitance may be changed by changing the permittivity of the insulating layer, the thickness of the insulating layer, the permittivity of the base material, the thickness of the base material, the thicknesses of the first and second electrode elements, the widths of the first and second electrode elements, or the clearance width between the first and second electrode elements. Especially, the change in the widths of the first and second electrode elements or the clearance width between the first and second electrode elements especially affects the change in the capacitance.

Therefore, it is possible to give sensitive distribution to the sensor unit by changing at least one of the permittivity of the insulating layer, the thickness of the insulating layer, the permittivity of the base material, the thickness of the base material, the thicknesses of the first and second electrode elements, the widths of the first and second electrode elements, and the clearance width between the first and second electrode elements in the sensor unit.

Although the first to seventh embodiments of the present technology are specifically described above, the present technology is not limited to the above-described first to seventh embodiments, and various modifications based on the technical idea of the present technology may be made.

For example, the configuration, the method, the process, the shape, the material, the numerical value and the like described in the above-described first to seventh embodiments are merely examples, and the configuration, the method, the process, the shape, the material, the numerical value and the like different from those described above may also be used as necessary.

Also, the configuration, the method, the process, the shape, the material, the numerical value and the like of the above-described first to seventh embodiments may be combined with one another within the gist of the present technology.

Although a case where the sensor is provided with a single-layer structure layer is described as an example in the first to seventh embodiments, it is also possible that the sensor is provided with the structure layer of a multi-layer structure of two or more layers.

Although a case where one structure body is provided immediately below one key is described as an example in the first to seventh embodiments, it is also possible that two or more structure bodies are provided immediately below one key.

Although the sensor in which a plurality of first electrodes and a plurality of second electrodes are provided on the same surface of the base material is described as an example in the first to seventh embodiments, the configuration of the sensor is not limited to this example. It is sufficient that a plurality of first electrodes and a plurality of second electrodes are alternately provided in a direction perpendicular to the surface of the sensor; they are not necessarily provided on the same surface as described above. Therefore, it is also possible to adopt a configuration in which a plurality of first electrodes and a plurality of second electrodes are provided on the different surfaces to be shifted in a thickness direction of the sensor layer.

Although an example in which the REF electrode layers are provided on both sides of the sensor layer is described in the first to seventh embodiments, it is also possible to omit the REF electrode layer provided on a rear surface side of the sensor layer. In this case, it is preferable to provide the REF electrode layer on an input device on which the sensor is provided or an electronic device and arrange the sensor on the REF electrode layer.

Although an example in which the present technology is applied to the keyboard is described in the first to seventh embodiments, the present technology is also applicable to a pressure-sensitive touch panel. In this case, coordinate accuracy of the touch panel may be improved.

Although an example in which the present technology is applied to the sensor including a plurality of keys is described in the first to seventh embodiments, the present technology is also applicable to the sensor including a single key.

Although an example in which the sensitivity distribution is adjusted by a physical configuration of the sensor layer is described in the first to seventh embodiments, it is also possible to adjust the sensitivity distribution by the process of the controller IC. It is also possible to adjust the sensitivity distribution by both the physical configuration of the sensor layer and the process of the controller IC.

The present technology may also adopt the following configurations.

(1)
A sensor comprising:
a conductor layer;
a sensor layer including a sensor unit; and
a separating layer which separates the conductor layer from the sensor layer, wherein
the sensor unit is formed of alternately arranged first and second electrode elements, and
sensitivity on an end of the sensor unit is higher than the sensitivity in a central portion of the sensor unit.

(2)
The sensor according to (1), wherein
a clearance width between the first and second electrode elements on the end of the sensor unit is smaller than the clearance width between the first and second electrode elements in the central portion of the sensor unit.

(3)
The sensor according to (1) or (2), wherein
widths of the first and second electrode elements on the end of the sensor unit are smaller than the widths of the first and second electrode elements in the central portion of the sensor unit.

(4)
The sensor according to any one of (1) to (3), wherein
a thickness of the end of the sensor unit is larger than the thickness of the central portion of the sensor unit.

(5)
The sensor according to any one of (1) to (4), wherein
thicknesses of the first and second electrode elements on the end of the sensor unit are larger than the thicknesses of the first and second electrode elements in the central portion of the sensor unit.

(6)
The sensor according to any one of (1) to (5), wherein
permittivity on the end of the sensor unit is larger than the permittivity in the central portion of the sensor unit.

(7)
The sensor according to any one of (1) to (6), wherein
a peripheral edge of the sensor unit is located outside a peripheral edge of a pressing unit.

(8)
The sensor according to any one of (1) to (7), wherein
density of the first and second electrode elements on the end of the sensor unit is higher than the density of the first and second electrode elements in the central portion of the sensor unit.

(9)
The sensor according to any one of (1) to (8), wherein
the first and second electrode elements have concentric shapes or spiral shapes.

(10)
The sensor according to any one of (1) to (8), wherein
the first and second electrode elements have comb-like shapes.

(11)

The sensor according to (10), wherein
lengths of the first and second electrode elements on the end of the sensor unit are longer than the lengths of the first and second electrode elements in the central portion of the sensor unit.

(12)

The sensor according to any one of (1) to (11), wherein
the sensitivity of the sensor unit gradually increases from the central portion of the sensor unit toward the end of the sensor unit.

(13)

The sensor according to any one of (1) to (12), wherein
a corner of the sensor unit has the highest sensitivity in the sensor unit.

(14)

The sensor according to any one of (1) to (13), wherein
the separating layer includes a structure body provided so as to correspond to the sensor unit.

(15)

The sensor according to (14), wherein
the separating layer is provided with a concavo-convex layer including a convex portion, and
the structure body is formed of the convex portion.

(16)

The sensor according to (14), wherein
the separating layer is provided with a concavo-convex layer including a convex portion and a pressing body provided on an apex of the convex portion, and
the structure body is formed of the convex portion and the pressing body.

(17)

The sensor according to (15) or (16), wherein
the concavo-convex layer is an embossed film.

(18)

An input device comprising:
a conductor layer;
a sensor layer including a sensor unit; and
a separating layer which separates the conductor layer from the sensor layer, wherein
the sensor unit is formed of alternately arranged first and second electrode elements, and
sensitivity on an end of the sensor unit is higher than the sensitivity in a central portion of the sensor unit.

(19)

A keyboard comprising:
a conductor layer;
a sensor layer including a sensor unit;
a separating layer which separates the conductor layer from the sensor layer; and
a key provided so as to correspond to the sensor unit, wherein
the sensor unit is formed of alternately arranged first and second electrode elements, and
sensitivity on an end of the sensor unit is higher than the sensitivity in a central portion of the sensor unit.

(20)

An electronic device comprising:
a sensor; and an electronic device main body, wherein
the sensor is provided with:
a conductor layer;
a sensor layer including a sensor unit; and
a separating layer which separates the conductor layer from the sensor layer,
the sensor unit is formed of alternately arranged first and second electrode elements, and
sensitivity on an end of the sensor unit is higher than the sensitivity in a central portion of the sensor unit.

REFERENCE SIGNS LIST

10 Electronic device
11 Input device
12 Host
13 Display device
14 Controller IC
20 Sensor
21, 25 Reference electrode layer
22 Sensor layer
22s Sensor unit
23 Intermediate layer
24 Structure layer
26 Key top layer
30 Embossed layer
31 Structure body
32 Convex portion
33 Pressing body
41 Base material
42 First electrode
42a First electrode element
43 Second electrode
43a Second electrode element
44 Insulating layer

The invention claimed is:

1. A sensor, comprising:
a conductor layer;
a sensor layer including a sensor unit, wherein the sensor unit includes a plurality of first electrode elements and a plurality of second electrode elements; and
a separating layer that separates the conductor layer from the sensor layer, wherein
the plurality of first electrode elements is alternately arranged with the plurality of second electrode elements,
the plurality of first electrode elements includes a first electrode element adjacent to a second electrode element of the plurality of second electrode elements,
the first electrode element and the second electrode element are on an end of the sensor unit,
the plurality of first electrode elements includes a third electrode element adjacent to a fourth electrode element of the plurality of second electrode elements,
the third electrode element and the fourth electrode element are in a central portion of the sensor unit,
a first clearance width between the first electrode element and the second electrode element on the end of the sensor unit is smaller than a second clearance width between the third electrode element and the fourth electrode element in the central portion of the sensor unit, and
sensitivity on the end of the sensor unit is higher than the sensitivity in the central portion of the sensor unit.

2. The sensor according to claim 1, wherein each of a width of the first electrode element and a width of the second electrode element on the end of the sensor unit is smaller than each of a width of the third electrode element and a width of the fourth electrode element in the central portion of the sensor unit.

3. The sensor according to claim 1, wherein a thickness of the end of the sensor unit is larger than a thickness of the central portion of the sensor unit.

4. The sensor according to claim 1, wherein each of a thickness of the first electrode element and a thickness of the second electrode element on the end of the sensor unit is larger than each of a thickness of the third electrode element and a thickness of the fourth electrode element in the central portion of the sensor unit.

5. The sensor according to claim 1, wherein permittivity on the end of the sensor unit is larger than the permittivity in the central portion of the sensor unit.

6. The sensor according to claim 1, further comprising a pressing unit, wherein a peripheral edge of the sensor unit is outside a peripheral edge of the pressing unit.

7. The sensor according to claim 1, wherein each of density of the first electrode element and density of the second electrode element on the end of the sensor unit is higher than each of density of the third electrode element and density of the fourth electrode element in the central portion of the sensor unit.

8. The sensor according to claim 1, wherein the plurality of first electrode elements and the plurality of second electrode elements have one of concentric shapes or spiral shapes.

9. The sensor according to claim 1, wherein the plurality of first electrode elements and the plurality of second electrode elements have comb-like shapes.

10. The sensor according to claim 9, wherein each of a length of the first electrode element and a length of the second electrode element on the end of the sensor unit is longer than each of a length of the third electrode element and a length of the fourth electrode element in the central portion of the sensor unit.

11. The sensor according to claim 1, wherein the sensitivity of the sensor unit increases from the central portion of the sensor unit toward the end of the sensor unit.

12. The sensor according to claim 1, wherein the sensitivity of a corner of the sensor unit is highest than the sensitivity of a plurality of portions of the sensor unit other than the corner.

13. The sensor according to claim 1, wherein the separating layer includes a structure body that corresponds to the sensor unit.

14. The sensor according to claim 13, wherein
the separating layer further includes a concavo-convex layer,
the concavo-convex layer includes a convex portion, and
the structure body comprises the convex portion.

15. The sensor according to claim 13, wherein
the separating layer further includes a concavo-convex layer,
the concavo-convex layer includes a convex portion and a pressing body,
the pressing body is on an apex of the convex portion, and
the structure body comprises the convex portion and the pressing body.

16. The sensor according to claim 14, wherein the concavo-convex layer is an embossed film.

17. An input device, comprising:
a conductor layer;
a sensor layer including a sensor unit, wherein the sensor unit includes a plurality of first electrode elements and a plurality of second electrode elements; and
a separating layer that separates the conductor layer from the sensor layer, wherein
the plurality of first electrode elements is alternately arranged with the plurality of second electrode elements,
the plurality of first electrode elements includes a first electrode element adjacent to a second electrode element of the plurality of second electrode elements,
the first electrode element and the second electrode element are on an end of the sensor unit,
the plurality of first electrode elements includes a third electrode element adjacent to a fourth electrode element of the plurality of second electrode elements,
the third electrode element and the fourth electrode element are in a central portion of the sensor unit,
a first clearance width between the first electrode element and the second electrode element on the end of the sensor unit is smaller than a second clearance width between the third electrode element and the fourth electrode element in the central portion of the sensor unit, and
sensitivity on the end of the sensor unit is higher than the sensitivity in the central portion of the sensor unit.

18. A keyboard, comprising:
a conductor layer;
a sensor layer including a sensor unit, wherein the sensor unit includes a plurality of first electrode elements and a plurality of second electrode elements;
a separating layer that separates the conductor layer from the sensor layer; and
a key that corresponds to the sensor unit, wherein
the plurality of first electrode elements is alternately arranged with the plurality of second electrode elements,
the plurality of first electrode elements includes a first electrode element adjacent to a second electrode element of the plurality of second electrode elements
the first electrode element and the second electrode element are on an end of the sensor unit,
the plurality of first electrode elements includes a third electrode element adjacent to a fourth electrode element of the plurality of second electrode elements,
the third electrode element and the fourth electrode element are in a central portion of the sensor unit,
a first clearance width between the first electrode element and the second electrode element on the end of the sensor unit is smaller than a second clearance width between the third electrode element and the fourth electrode element in the central portion of the sensor unit, and
sensitivity on the end of the sensor unit is higher than the sensitivity in the central portion of the sensor unit.

19. An electronic device, comprising:
a sensor; and
an electronic device main body, wherein the sensor includes:
a conductor layer;
a sensor layer including a sensor unit, wherein the sensor unit includes a plurality of first electrode elements and a plurality of second electrode elements; and
a separating layer that separates the conductor layer from the sensor layer, wherein
the plurality of first electrode elements is alternately arranged with the plurality of second electrode elements,
the plurality of first electrode elements includes a first electrode element adjacent to a second electrode element of the plurality of second electrode elements,
the first electrode element and the second electrode element are on an end of the sensor unit, the plurality of first electrode elements includes a third electrode element adjacent to a fourth electrode element of the plurality of second electrode elements, the third electrode element and the fourth electrode element are in a central portion of the sensor unit, a first clearance width between the first electrode element and the second electrode element on the end of the sensor unit is smaller than a second clearance width between the third electrode element and the fourth electrode element in the central portion of the sensor unit, and sensitivity on the end of the sensor unit is higher than the sensitivity in the central portion of the sensor unit.

* * * * *